(12) United States Patent
Bok et al.

(10) Patent No.: US 11,755,134 B2
(45) Date of Patent: Sep. 12, 2023

(54) DISPLAY DEVICE

(71) Applicant: SAMSUNG DISPLAY CO., LTD., Yongin-si (KR)

(72) Inventors: Seung Lyong Bok, Hwaseong-si (KR); Ki Cheol Kim, Yongin-si (KR); Ok Kyung Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/466,470

(22) Filed: Sep. 3, 2021

(65) Prior Publication Data

US 2022/0221953 A1    Jul. 14, 2022

(30) Foreign Application Priority Data

Jan. 12, 2021 (KR) .................. 10-2021-0003666

(51) Int. Cl.
| | |
|---|---|
| *G06F 3/041* | (2006.01) |
| *G06F 3/044* | (2006.01) |
| *H01L 27/32* | (2006.01) |
| *H01L 51/52* | (2006.01) |
| *H10K 50/86* | (2023.01) |
| *H10K 59/12* | (2023.01) |
| *H10K 59/40* | (2023.01) |
| *H10K 59/65* | (2023.01) |

(52) U.S. Cl.
CPC .......... *G06F 3/0412* (2013.01); *G06F 3/0443* (2019.05); *G06F 3/0445* (2019.05); *G06F 3/0446* (2019.05); *G06F 3/04166* (2019.05); *H10K 50/86* (2023.02); *H10K 59/12* (2023.02); *H10K 59/40* (2023.02); *H10K 59/65* (2023.02)

(58) Field of Classification Search
CPC .... G06F 3/0446; G06F 3/0412; G06F 3/0443; G06F 3/041; G06F 3/044; G06F 2203/04112; G06F 2203/04103; G06F 2203/04107; G09G 2300/0426; G09G 3/3233

See application file for complete search history.

(56) References Cited

U.S. PATENT DOCUMENTS

| | | | |
|---|---|---|---|
| 2012/0105400 A1* | 5/2012 | Mathew ................ | G06F 1/1626 345/207 |
| 2013/0127775 A1* | 5/2013 | Yilmaz ................ | G06F 3/0446 200/600 |
| 2017/0147128 A1* | 5/2017 | Ishizaki ................ | G06F 3/0445 |
| 2019/0034010 A1* | 1/2019 | Lee ........................ | G06F 3/0446 |

(Continued)

FOREIGN PATENT DOCUMENTS

| | | |
|---|---|---|
| CN | 110047852 | 7/2019 |
| CN | 209356818 | 9/2019 |

(Continued)

*Primary Examiner* — Dong Hui Liang
(74) *Attorney, Agent, or Firm* — F. Chau & Associates, LLC

(57) ABSTRACT

A display device includes a first display area including first pixels, driving electrodes, and sensing electrodes. A second display area includes second pixels, sub-driving electrodes, and sub-sensing electrodes. Auxiliary electrodes are between the first and second display areas. A number of first pixels per unit area of the first display area is greater than a number of second pixels per unit area of the second display area.

21 Claims, 35 Drawing Sheets

(56) References Cited

U.S. PATENT DOCUMENTS

| | | | |
|---|---|---|---|
| 2021/0064187 A1* | 3/2021 | Lee | G06F 3/0446 |
| 2021/0066409 A1* | 3/2021 | Fan | G06F 1/1686 |
| 2021/0191548 A1* | 6/2021 | Huang | G06F 3/0445 |
| 2021/0357079 A1* | 11/2021 | Song | G06F 3/0412 |
| 2022/0165814 A1* | 5/2022 | Rieutort-Louis | H01L 27/3223 |
| 2022/0317794 A1* | 10/2022 | Tong | G06F 3/0445 |

FOREIGN PATENT DOCUMENTS

| | | |
|---|---|---|
| CN | 110379356 | 10/2019 |
| KR | 10-2018-0026597 | 3/2018 |

\* cited by examiner

TAE: TAE1, TAE2, TAE3, TAE4

DISPLAY DEVICE

CROSS-REFERENCE TO RELATED APPLICATION

This application claims priority under 35 U.S.C. § 119 to Korean Patent Application No. 10-2021-0003666, filed on Jan. 12, 2021 in the Korean Intellectual Property Office, the disclosure of which is incorporated by reference in its entirety herein.

TECHNICAL FIELD

Embodiments of the present inventive concepts relate to a display device.

DISCUSSION OF RELATED ART

The demand for display devices for displaying images has diversified with the development of the information society. For example, display devices have been applied to various electronic devices such as smart phones, digital cameras, notebook computers, navigation systems, and smart televisions (TVs).

A display device may include an input interface, such as a touch sensing unit for sensing a touch from a user. The touch sensing unit includes a plurality of touch electrodes that are driven in a capacitive manner, and can thus detect the touch from the user.

The display device may further include various optical devices at the front of the display device, such as an image sensor for capturing an image, a proximity sensor for detecting whether the user is in proximity to the display device, and an illumination sensor for detecting the intensity of illumination of the display device.

Since display devices have been applied to various types of electronic devices, display devices with various design features have been implemented. For example, display devices having holes removed from their front and thereby having a widened display area have been developed. When the holes at the front of a display device are removed, optical devices may be disposed to overlap with a display panel.

SUMMARY

Aspects of the present inventive concepts provide a display device capable of increasing touch sensitivity in a region Where optical sensors are disposed.

According to an embodiment of the present inventive concepts, a display device includes a first display area including first pixels, driving electrodes, and sensing electrodes. A second display area includes second pixels, sub-driving electrodes, and sub-sensing electrodes. Auxiliary electrodes are between the first and second display areas. A number of first pixels per unit area of the first display area is greater than a number of second pixels per unit area of the second display area.

In an embodiment, the auxiliary electrodes may include a first auxiliary electrode, which is between one of the driving electrodes and one of the sub-driving electrodes, and a second auxiliary electrode, which is between one of the sensing electrodes and one of the sub-sensing electrodes.

In an embodiment, the driving electrodes, the first auxiliary electrode, and the sub-driving electrodes may be electrically connected, and the sensing electrodes, the second auxiliary electrode, and the sub-sensing electrodes may be electrically connected.

In an embodiment, a maximum width of the first auxiliary electrode may be greater than maximum widths of the driving electrodes and the sub-driving electrodes.

In an embodiment, a maximum width of the second auxiliary electrode may be greater than maximum widths of the sensing electrodes and the sub-sensing electrodes.

In an embodiment, the auxiliary electrodes may further include a third auxiliary electrode, which is spaced apart from the first and second auxiliary electrodes and may be between another one of the driving electrodes and another one of the sub-driving electrodes, and a fourth auxiliary electrode, which is spaced apart from the first, second, and third auxiliary electrodes and may be between another one of the sensing electrodes and another one of the sub-sensing electrodes.

In an embodiment, the display device may further comprise connection electrodes between, and electrically connected to, the sub-driving electrodes. The connection electrodes may overlap with the sub-sensing electrodes.

In an embodiment, the sub-driving electrodes and the connection electrodes may be disposed in the same layer.

In an embodiment, the connection electrodes may be disposed in a different layer from the sub-driving electrodes.

In an embodiment, the first auxiliary electrode may be spaced apart from the driving electrodes and the sub-driving electrodes, and the second auxiliary electrode may be spaced apart from the sensing electrodes and the sub-sensing electrodes.

In an embodiment, the first and second auxiliary electrodes may be disposed in a different layer from the driving electrodes, the sub-driving electrodes, the sensing electrodes, and the sub-sensing electrodes.

In an embodiment, the first and second auxiliary electrodes may be disposed in the same layer as the driving electrodes, the sub-driving electrodes, the sensing electrodes, and the sub-sensing electrodes.

In an embodiment, the display device may further comprise auxiliary touch electrodes between the first auxiliary electrode and the driving electrodes.

In an embodiment, the auxiliary touch electrodes may include auxiliary driving electrodes and auxiliary sensing electrodes, and In an embodiment, the auxiliary driving electrodes and the auxiliary sensing electrodes may be spaced apart from the first auxiliary electrode and the driving electrodes.

In an embodiment, the auxiliary driving electrodes may completely overlap with the auxiliary sensing electrodes.

In an embodiment, the auxiliary touch electrodes may include auxiliary driving electrodes and auxiliary sensing electrodes. The auxiliary driving electrodes may extend in one direction. The auxiliary sensing electrodes may extend in another direction to intersect the auxiliary driving electrodes.

In an embodiment, the display device may further comprise an optical device overlapping with the second display area.

In an embodiment, the display device may further comprise a polarizing film overlapping with the first display area, but not with the auxiliary electrodes.

According to an embodiment of the present inventive concepts, a display device includes a first display area including first pixels, driving electrodes, and sensing electrodes. A second display area includes second pixels, sub-driving electrodes, and sub-sensing electrodes. A polarizing plate overlaps with the first display area. Auxiliary electrodes are between the first and second display areas. The auxiliary electrodes do not overlap with the polarizing plate.

In an embodiment, the display device may further comprise an optical device overlapping with the second display area.

In an embodiment, the number of first pixels per unit area of the first display area may be greater than the number of second pixels per unit area of the second display area.

BRIEF DESCRIPTION OF THE DRAWINGS

The above and other features of the present inventive concepts will become more apparent by describing in detail embodiments thereof, with reference to the accompanying drawings, in which.

DETAILED DESCRIPTION OF EMBODIMENTS

Figure 1:
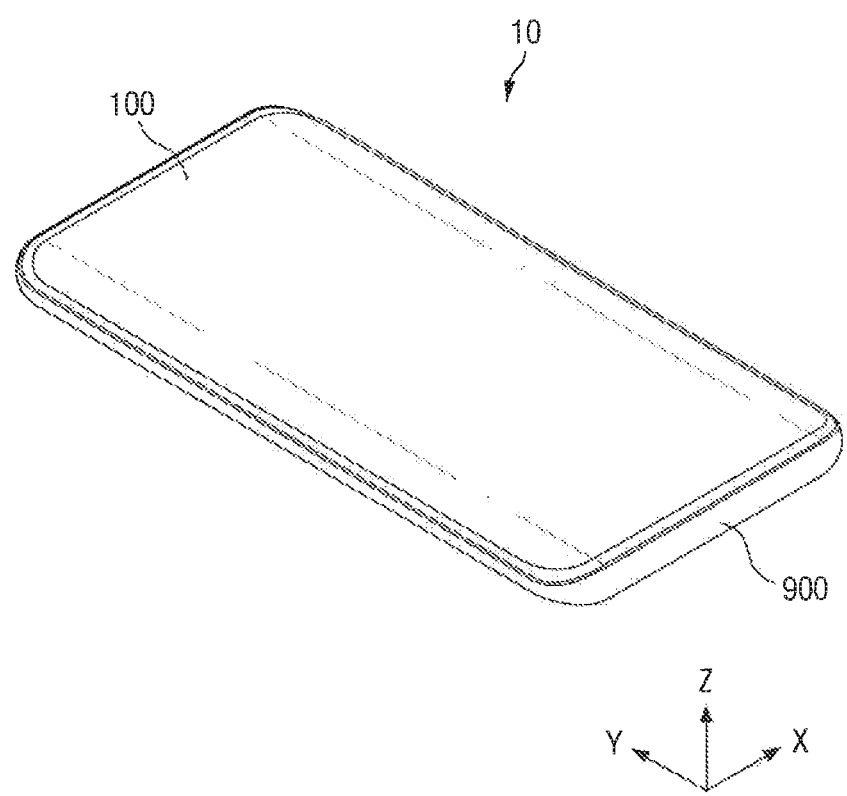
FIG. 1 is a perspective view of a display device according to an embodiment of the present inventive concepts.

Embodiments of the present inventive concepts will be described more fully hereinafter with reference to the accompanying drawings. Like reference numerals may refer to like elements throughout the specification and the accompanying drawings.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationship between components should be interpreted in a like fashion.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. When a component, such as a film, a region, a layer, or an element, is referred to as being "directly on", "directly connected to", "directly coupled to", or "directly adjacent to" another component, no intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each embodiment are available for other similar features or aspects in other embodiments, unless the context clearly indicates otherwise. Accordingly, all features and structures described herein may be mixed and matched in any desirable manner.

As used herein, the singular forms "a", "an" and "the" are intended to include the plural forms as well, unless the context clearly indicates otherwise.

Spatially relative terms, such as "below", "lower", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" may encompass both an orientation of above and below.

When a feature is said to extend, protrude, or otherwise follow a certain direction, it will be understood that the feature may follow said direction in the negative, such as the opposite direction. Accordingly, the feature is not limited to follow exactly one direction, and may follow along an axis formed by the direction, unless the context clearly indicates otherwise.

Figure 2:
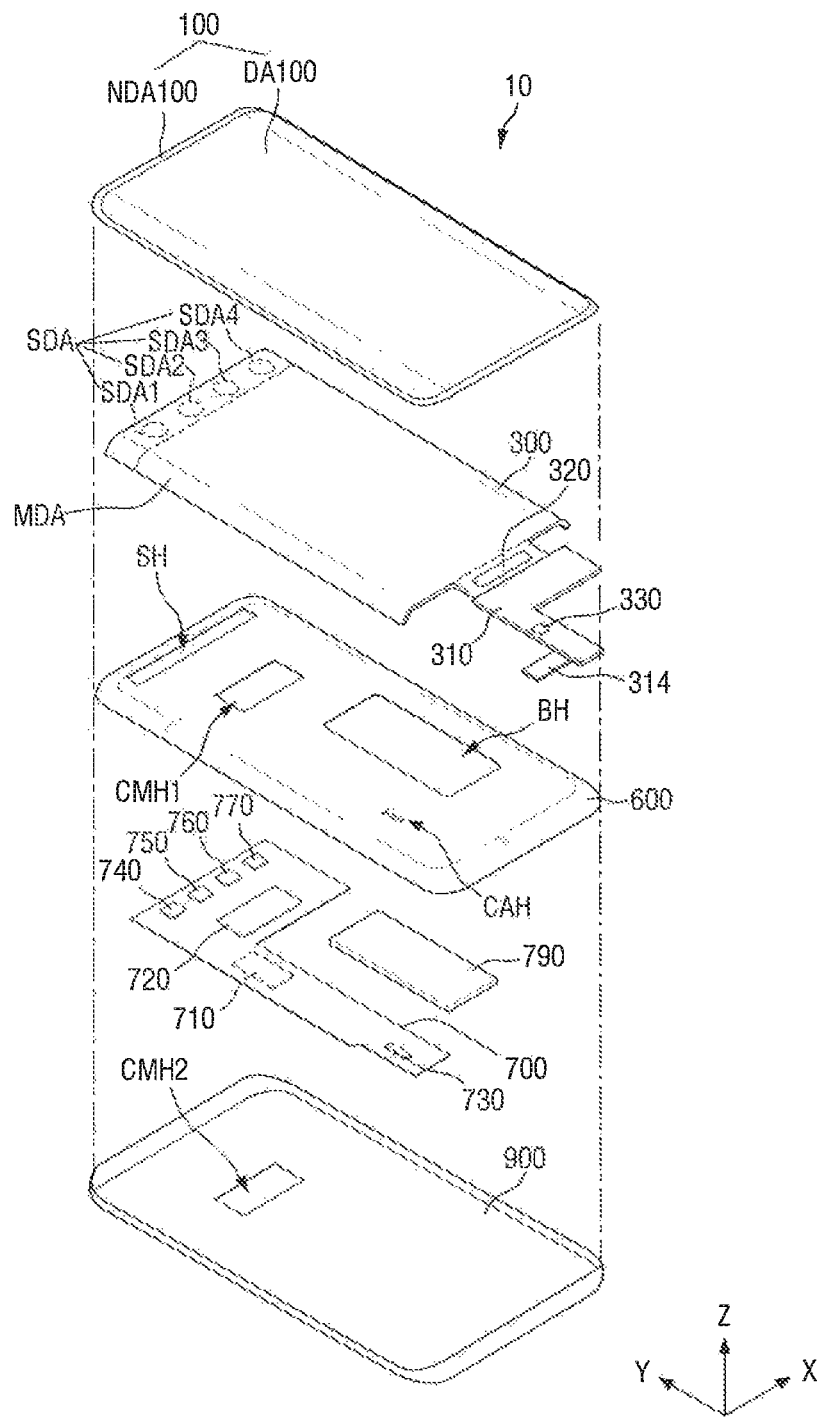
FIG. 2 is an exploded perspective view of the display device of FIG. 1 according to an embodiment of the present inventive concepts.
Figure 3:
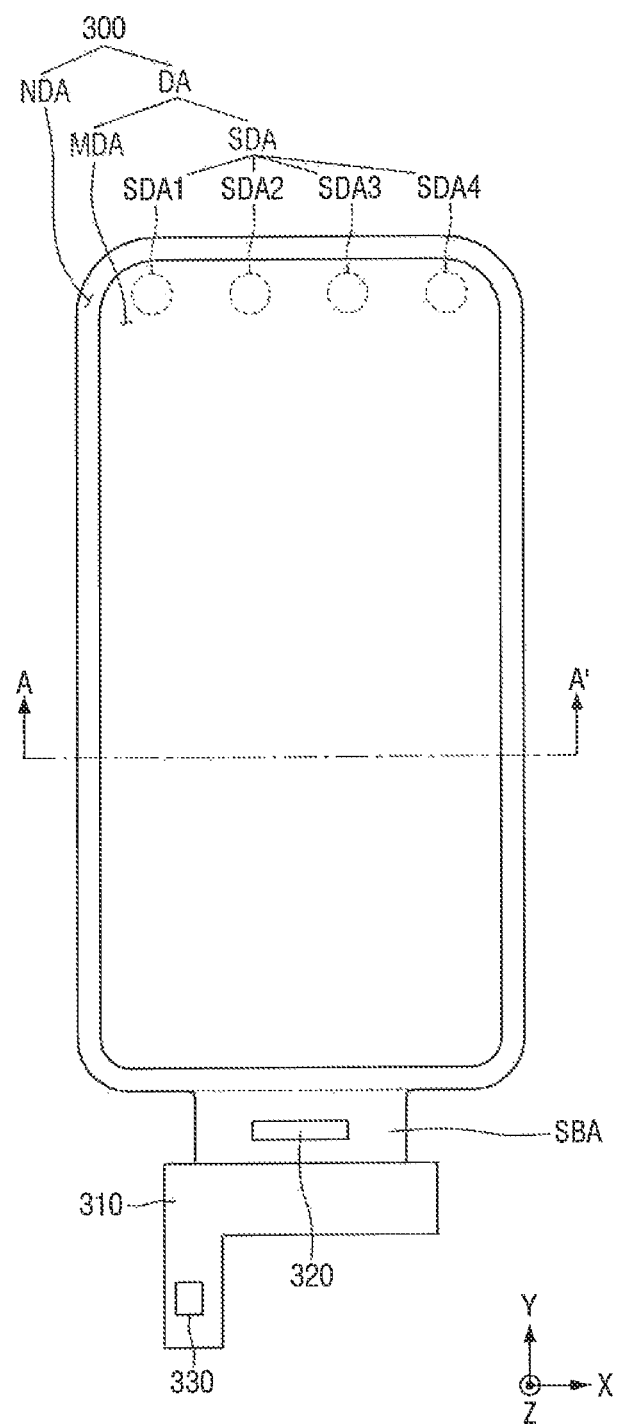
FIG. 3 is a plan view of a display panel of FIG. 1 according to an embodiment of the present inventive concepts.

FIG. 1 is a perspective view of a display device according to an embodiment of the present inventive concepts. FIG. 2 is an exploded perspective view of the display device of FIG. 1. FIG. 3 is a plan view of a display panel of FIG. 1.

Referring to FIGS. 1 through 3, a display device 10 may be applied to a portable electronic device such as a mobile phone, a smartphone, a tablet personal computer (PC), a mobile communication terminal, an electronic notepad, an electronic book, a portable multimedia player (PMP), a navigation device, or an ultramobile PC (UMPC). The display device 10 may also be applied to a television (TV), a notebook computer, a monitor, a billboard, or an Internet-of-Things (IoT) device as a display unit. The display device 10 may also be applied to a wearable device such as a smartwatch, a watchphone, a glasses-type display, or a head-mounted display (HMD). Also, the display device 10 may also be applied to the dashboard of a vehicle, the center fascia of a vehicle, a center information display (CID) in the dashboard of a vehicle, a room mirror display that can replace the rear-view mirror of a vehicle, or an entertainment display at the back of a front seat of a vehicle. However, embodiments of the present inventive concepts are not limited thereto and the display device 10 may be applied to various other small, medium or large sized electronic devices A first direction parallel to the X-axis (hereinafter, the "X direction") may refer to the direction of the relatively short sides of the display device 10, for example, the horizontal direction of the display device 10. A second direction parallel to the Y axis (hereinafter, the "Y direction") may refer to the direction of the relatively long sides of the display device 10, for example, the vertical direction of the display device 10. A third direction parallel to the Z-axis (hereinafter, the "Z direction") may refer to the thickness direction of the display device 10.

In an embodiment, the display device 10 may have a rectangle-like shape in a plan view. In one example, as illustrated in FIG. 1, the display device 10 may have a rectangle-like shape having relatively short sides in the X direction and relatively long sides in the Y direction in a plan view. In an embodiment, the corners where the relatively short sides and the relatively long sides of the display device 10 meet may be rounded to have a predetermined curvature or may be right-angled. However, the planar shape of the display device 10 is not particularly limited, and the display device 10 may be formed in various other shapes such as a nontetragonal polygonal shape, a circular shape, or an elliptical shape in a plan view.

The display device 10 may be formed to be flat. Alternatively, one or more pairs of opposing sides of the display device 10 may be curved. In one example, the left and right sides of the display device 10 may be curved. In an example, the upper, lower, left, and right sides of the display device 10 may all be curved. However, embodiments of the present inventive concepts are not limited thereto.

The display device 10 may include a cover window 100, a display panel 300, a display circuit board 310, a display driving circuit 320, a bracket 600, a main circuit board 700, optical devices (740, 750, 760, and 770), and a lower cover 900.

The cover window 100 may be disposed above the display panel 300 (e.g., in the Z direction) to cover the front surface of the display panel 300. Accordingly, the cover window 100 may protect the front surface of the display panel 300.

In an embodiment, the cover window 100 may include a light-transmitting area DA100, which corresponds to the display panel 300, and a light-blocking area NDA100, which corresponds to the rest of the display device 10. The light-blocking area NDA100 may be formed to be opaque. In an embodiment, the light-blocking area NDA100 may be formed as a decorative layer formed of patterns that are visible to a user when no image is displayed.

The display panel 300 may be disposed below the cover window 100 (e.g., in the Z direction). In an embodiment, the display panel 300 may be a light-emitting display panel including light-emitting elements. In one example, the display panel 300 may be an organic light-emitting display panel using organic light-emitting diodes (OLEDs) that include organic light-emitting layers, a micro-light-emitting diode (mLED) display panel using mLEDs, a quantum-dot light-emitting display panel using quantum-dot light-emitting diodes, or an inorganic light-emitting display panel using inorganic light-emitting elements that include an inorganic semiconductor. The display panel 300 will hereinafter be described as being an organic light-emitting display panel for convenience of explanation and not limitation.

The display panel 300 may include a display area DA, and the display area DA may include a main display area MDA and a sub-display area SDA. In an embodiment, the size of the main display area MDA may occupy the majority of the display area DA. The sub-display area SDA may be disposed on one side of the main display area MDA, for example, on the upper side of the main display area MDA (e.g., in the Y direction), as illustrated in FIG. 2. However, embodiments of the present inventive concepts are not limited thereto and the arrangement of the sub-display area SDA may vary. The main display area MDA may be a first display area, and the sub-display area SDA may be a second display area. As shown in the embodiment of FIG. 3, the display panel 300 may further include a non-display area NDA. In an embodiment, the non-display area NDA may fully surround the display area DA (e.g., in the X and Y directions). However, embodiments of the present inventive concepts are not limited thereto.

In an embodiment, the main display area MDA may not include a light-transmitting area capable of transmitting light therethrough, but may include only a pixel area having pixels for displaying an image. In an embodiment, the sub-display area SDA may include both a light-transmitting area capable of transmitting light therethrough and a pixel area having pixels for displaying an image. Thus, the sub-display area SDA may have a higher light transmittance than the main display area MDA.

Referring to the embodiments of FIGS. 2 and 3, the sub-display area SDA may include a plurality of sub-display areas, such as first to fourth sub-display areas SDA1, SDA2, SDA3, and SDA4. The first to fourth sub-display areas SDA1, SDA2, SDA3, and SDA4 may be disposed to be spaced apart from one another. Each of the first to fourth sub-display areas SDA1, SDA2, SDA3, and SDA4 may be surrounded by the main display area MDA.

In an embodiment, a first sub-display area SDA1 may overlap with the proximity sensor 740 in the Z direction. Thus, even though the proximity sensor 740 is disposed to overlap with the display panel 300, the proximity sensor 740 can detect light incident thereupon from the front surface of the display device 10 through the first sub-display area SDA1.

In an embodiment, a second sub-display area SDA2 may overlap with the illumination sensor 750 in the Z direction. Thus, even though the illumination sensor 750 is disposed to overlap with the display panel 300, the illumination sensor 750 can detect light incident thereupon from the front surface of the display device 10 through the second sub-display area SDA2.

In an embodiment, a third sub-display area SDA3 may overlap with the iris sensor 760 in the Z direction. Thus, even though the iris sensor 760 is disposed to overlap with the display panel 300, the iris sensor 760 can detect light incident thereupon from the front surface of the display device 10 through the third sub-display area SDA3.

In an embodiment, a fourth sub-display area SDA4 may overlap with the second camera sensor 770 in the Z direction. Thus, even though the second camera sensor 770 is disposed to overlap with the display panel 300, the second camera sensor 770 can detect light incident thereupon from the front surface of the display device 10 through the fourth sub-display area SDA4.

FIGS. 2 and 3 illustrate that the sub-display area SDA includes four sub-display areas, such as the first, second, third, and fourth sub-display areas SDA1, SDA2, SDA3, and SDA4. However, embodiments of the present inventive concepts are not limited thereto. For example, in an embodiment, the number of sub-display areas may be dependent on the number of optical devices. For example, the sub-display areas may be disposed to correspond one-to-one to the optical devices.

Also, the embodiments of FIGS. 2 and 3 illustrate that each of the first to fourth sub-display areas SDA1, SDA2, SDA3, and SDA4 has a circular shape. However, embodiments of the present inventive concepts are not limited thereto. For example, each of the first to fourth sub-display areas SDA1, SDA2, SDA3, and SDA4 may have a polygonal or elliptical shape.

Also, the embodiments of FIGS. 2 and 3 illustrate that the first to fourth sub-display areas SDA1, SDA2, SDA3, and SDA4 have the same size. However, embodiments of the present inventive concepts are not limited thereto. For example, the first to fourth sub-display areas SDA1, SDA2, SDA3, and SDA4 may have different sizes.

The display circuit board 310 and the display driving circuit 320 may be attached to one side of the display panel 300, such as the lower side in the Y direction. However, embodiments of the present inventive concepts are not limited thereto. In an embodiment, the display circuit board 310 may be a flexible printed circuit board (FPCB) that is bendable, a rigid printed circuit board (PCB) that is too rigid to be bendable, or a hybrid PCB that has the characteristics of both a rigid PCB and an FPCB.

The display driving circuit 320 may receive control signals and power supply voltages via the display circuit board 310 and may generate and output signals and voltages for driving the display panel 300. In an embodiment, the display driving circuit 320 may be formed as an integrated circuit (IC) and may be attached on the display panel 300 in a chip-on-glass (COG), chip-on-plastic (COP), or ultrasonic manner. However, embodiments of the present inventive concepts are not limited thereto. For example, in an embodiment, the display driving circuit 320 may be attached on the display circuit board 310.

A touch driving circuit 330 may be disposed on the display circuit board 310. In an embodiment, the touch driving circuit 330 may be formed as an IC and may be attached on the top surface of the display circuit board 310. The touch driving circuit 330 may be electrically connected to the touch electrodes of the touch sensor layer of the display panel 300 via the display circuit board 310. The touch driving circuit 330 may output touch driving signals to the touch electrodes and may detect voltages that the capacitors of the touch electrodes are charged with.

The touch driving circuit 330 may generate touch data based on variations in electrical signals detected by the touch electrodes, may transmit the touch data to the main processor 710, and the main processor 710 may calculate the coordinates of a touch by analyzing the touch data. In an embodiment, a touch may includes a real touch or a proximity touch. A real touch refers to an input occurring when a finger of the user or an object such as a pen is physically touched (e.g., makes direct contact) on a cover window disposed on a sensor electrode layer. A proximity touch refers to an input occurring when a finger of the user or an object such as a pen is close to, but not physically touched on, the cover window.

A power supply unit for supplying display driving voltages for driving the display driving circuit 320 may be additionally disposed on the display circuit board 310.

The bracket 600 may be disposed below the display panel 300 (e.g., in the Z direction). In an embodiment, the bracket 600 may be formed of plastic, a metal, or both. In an embodiment, a first camera hole CMH1, in which a first camera sensor 720 is inserted, a battery hole BH, ire which a battery 790 is disposed, a cable hole CAH, through which a cable 314 connected to the display circuit board 310 passes, and a light-transmitting hole SH, in which the optical devices (740, 750, 760, and 770) are disposed, may be formed in the bracket 600. However, embodiments of the present inventive concepts are not limited thereto. For example, the bracket 600 may not include the light-transmitting hole SH and may be formed not to overlap with the sub-display area SDA of the display panel 300.

The main circuit board 700 and the battery 790 may be disposed below the bracket 600 (e.g., in the Z direction). The main circuit board 700 may be a PCB or an FPCB.

In an embodiment, the main circuit board 700 may include a main processor 710, the first camera sensor 720, a main connector 730, and the optical devices (740, 750, 760, and 770). The optical devices (740, 750, 760, and 770) may include a proximity sensor 740, an illumination sensor 750, an iris sensor 760, and a second camera sensor 770.

In an embodiment, the first camera sensor 720 may be disposed on both the top and bottom surfaces of the main circuit board 700 (e.g., in the Z direction), the main processor 710 may be disposed on the top surface of the main circuit board 700 (e.g., in the Z direction), and the main connector 730 may be disposed on the bottom surface of the main circuit board 700 (e.g., in the Z direction). The proximity sensor 740, the illumination sensor 750, the iris sensor 760, and the second camera sensor 770 may be disposed on the top surface of the main circuit board 700 (e.g., in the Z direction).

In an embodiment, the main processor 710 may control all the functions of the display device 10. For example, the main processor 710 may provide digital video data to the display driving circuit 320 through the display circuit board 310 so that the display panel 300 may display an image. Also, the main processor 710 may receive touch data from the touch driving circuit 330, may determine the coordinates of a touch from the user, and may execute an application corresponding to an icon displayed at the coordinates of the touch. Also, the main processor 710 may display an image captured by the first camera sensor 720 by converting first image data received from the first camera sensor 720 into digital video data and outputting the digital video data to the display driving circuit 320 via the display circuit board 310. Also, the main processor 710 may control the display device 10 in accordance with sensor signals from the proximity sensor 740, the illumination sensor 750, the iris sensor 760, and the second camera sensor 770.

The main processor 710 may determine whether there exists an object in the proximity of the front surface of the display device 10 in accordance with a proximity sensor signal input thereto from a proximity sensor 740. In an embodiment, if there exists an object in the proximity of the front surface of the display device 10 during a call mode where the user talks to another person with the use of the display device 10, the main processor 710 may not execute an application corresponding to an icon at the touch coordinates of a touch from the user.

The main processor 710 may determine the brightness of the front surface of the display device 10 based on an illumination sensor signal input thereto from an illumination sensor 750. In an embodiment, the main processor 710 may adjust the luminance of an image displayed by the display panel 300, in accordance with the brightness of the front surface of the display device 10.

The main processor 710 may determine whether an iris image of the user is identical to a previously-stored iris image based on an iris sensor signal input thereto from an iris sensor 760. In an embodiment, if the iris image of the user is identical to the previously-stored iris image, the main processor 710 may unlock the display device 10 and may display a home screen on the display panel 300.

The main processor 710 may generate digital video data based on second image data received from the second camera sensor 770. In an embodiment, the main processor 710 may display an image (e.g., a still or moving image) captured by the second camera sensor 770 by outputting the digital video data to the display driving circuit 320 via the display circuit board 310.

The first camera sensor 720 may process a still or moving image obtained by an image sensor and may output the processed image to the main processor 710. The first camera sensor 720 may be a complementary metal-oxide-semiconductor (CMOS) image sensor or a charge-coupled device (CCD) image sensor. The first camera sensor 720 may be exposed at the bottom of the lower cover 900 by a second camera hole CMH2 and may thus be able to capture an image of an object or the background below the display device 10.

The cable 314, which passes through the cable hole CAH of the bracket 600, may be connected to the main connector 730. Accordingly, the main circuit board 700 may be electrically connected to the display circuit board 310.

The proximity sensor 740 may be a sensor for detecting whether there exists an object in the proximity of the front surface of the display device 10. For example, in an embodiment, the proximity sensor 740 may include a light source that outputs light and a light receiver that receives light reflected from an object. The proximity sensor 740 may determine the presence of an object in the proximity of the front surface of the display device 10 based on the amount of light reflected from the object. As the proximity sensor 740 is disposed to overlap (e.g., in the Z direction) with the light-transmitting hole SH, the sub-display area SDA of the display panel 300, and the light-transmitting area DA100 of the cover window 100, the proximity sensor 740 may generate a proximity sensor signal based on whether there exists an object in the proximity of the front surface of the display device 10 and may output the generated proximity sensor signal to the main processor 710.

The illumination sensor 750 may be a sensor for detecting the brightness at the front surface of the display device 10. The illumination sensor 750 may include a resistor whose resistance varies depending on the brightness of light incident thereupon. In an embodiment, the illumination sensor 750 may determine the brightness at the front surface of the display device 10 based on the resistance of the resistor. Since the illumination sensor 750 is disposed to overlap (e.g., in the Z direction) with the light-transmitting hole SH, the sub-display area SDA of the display panel 300, and the light-transmitting area DA100 of the cover window 100, the illumination sensor 750 may generate an illumination sensor signal based on the brightness at the front surface of the display device 10 and may output the generated illumination sensor signal to the main processor 710.

The iris sensor 760 may be a sensor for determining whether a captured iris image of the user is identical to an iris image stored in advance in a memory. As the iris sensor 760 is disposed to overlap (e.g., in the Z direction) with the light-transmitting hole SH, the sub-display area SDA of the display panel 300, and the light-transmitting area DA100 of the cover window 100, the iris sensor 760 may capture an image of the iris of the user above the display device 10. The iris sensor 760 may generate an iris sensor signal based on whether the captured iris image of the user is identical to the iris image stored in advance in the memory and may output the generated iris sensor signal to the main processor 710.

The second camera sensor 770 may process image frames obtained by an image sensor, such as a still or moving image, and may output the processed image frames to the main processor 710. In an embodiment, the second camera sensor 770 may be a CMOS or CCD image sensor. In an embodiment, the pixel quantity of the second camera sensor 770 may be smaller than the pixel quantity of the first camera sensor 720, and the size of the second camera sensor 770 may also be smaller than the size of the first camera sensor 720. As the second camera sensor 770 is disposed to overlap (e.g., in the Z direction) with the light-transmitting hole SH of the bracket 600, the sub-display area SDA of the display panel 300, and the light-transmitting area DA100 of the cover window 100, the second camera sensor 770 may capture an image of an object or the background above the display device 10.

The battery 790 may be disposed not to overlap with the main circuit board 700 in the Z direction. The battery 790 may overlap with the battery hole BR of the bracket 600 (e.g., in the Z direction).

A mobile communication module, which can transmit wireless signals to, or receive wireless signals from, at least one of a base station, an external terminal, and a server via a mobile communication network may be further provided in the main circuit board 700. The wireless signals may include audio signals, video call signals, and various types of data that can be transmitted with text/multimedia messages.

The lower cover 900 may be disposed below the main circuit board 700 and the battery 790 (e.g., in the Z direction). The lower cover 900 may be coupled and fixed to the bracket 600. The lower cover 900 may form the bottom exterior of the display device 10. In an embodiment, the lower cover 900 may be formed of plastic, a metal, or both.

As shown in the embodiment of FIG. 2, the second camera hole CMH2, which exposes the bottom of the first camera sensor 720, may be formed in the lower cover 900. However, embodiments of the present inventive concepts are not limited thereto and the location of the first camera sensor 720 and the locations of the first and second camera holes CMH1 and CMH2, which correspond to the first camera sensor 720 may vary from the locations illustrated in FIG. 2.

Figure 4:
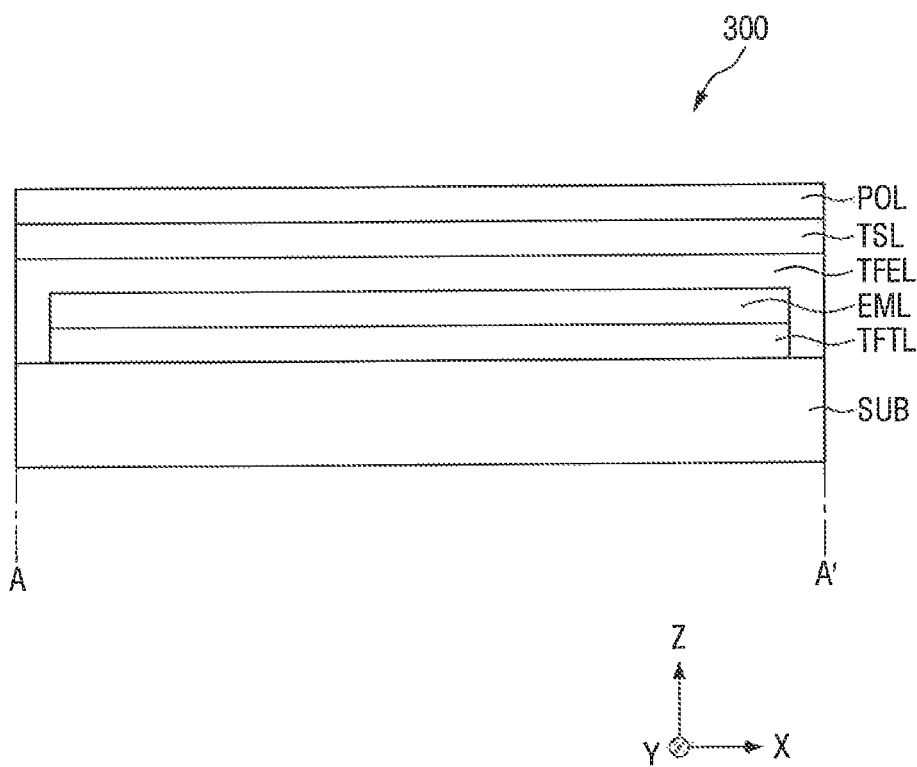
FIG. 4 is a cross-sectional view taken along line A-A' of FIG. 3 according to an embodiment of the present inventive concepts.

FIG. 4 is a cross-sectional view taken along line A-A' of FIG. 3.

Referring to the embodiment of FIG. 4, the display panel 300 may include a substrate SUB, a thin-film transistor layer TFTL, a light-emitting element layer EML, air encapsulation layer TFEL, a touch sensing layer TSL, and a polarizing film POL.

In an embodiment, the substrate SUB may be formed of an insulating material such as glass, quartz, or a polymer resin. The polymer material may be, for example, polyether-sulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), a combination thereof. Alternatively, the substrate SUB may include a metallic material. However, embodiments of the present inventive concepts are not limited thereto.

The substrate SUB may be a rigid substrate or a flexible substrate that is bendable, foldable, or rollable. In an embodiment in which the substrate SUB is a flexible substrate, the substrate SUB may be formed of polyimide. However, embodiments of the present inventive concepts are not limited thereto.

The thin-film transistor layer TFTL may be disposed on the substrate SUB (e.g., in the Z direction). In an embodiment, not only thin-film transistors of each pixel, but also scan lines and data lines may be formed in the thin-film transistor layer TFTL. Each of the thin-film transistors may include a gate electrode, a semiconductor layer, a source electrode, and a drain electrode.

The light-emitting element layer EML may be disposed on the thin-film transistor layer TFTL (e.g., in the Z direction). The light-emitting element layer EML may include pixels, which include pixel electrodes, light-emitting layers, and a common electrode, and a pixel-defining film, which defines the pixels. In an embodiment, the light-emitting layers may be organic light-emitting layers including an organic material. In this embodiment, the light-emitting layers may include hole transport layers, organic emission layers, and electron transport layers. As a predetermined voltage is applied to the pixel electrodes and a common voltage is applied to the common electrode via the thin-film transistors in the thin-film transistor layer TFTL, holes from the hole transport layers and electrons from the electron transport layers may move to the organic light-emitting layers. The holes and the electrons may then combine together in the organic light-emitting layers and may thereby emit light.

The encapsulation layer TFEL may be disposed on the light-emitting element layer EML (e.g., in the Z direction). The encapsulation layer TFEL may be disposed to cover the thin-film transistor layer TFTL and the light-emitting element layer EML.

In an embodiment, the encapsulation layer TFEL may include at least one inorganic film to prevent the penetration of oxygen or moisture into the light-emitting element layer EML. The inorganic film may be a silicon nitride layer, a silicon oxynitride layer, a silicon oxide layer, a titanium oxide layer, or an aluminum oxide layer. However, embodiments of the present inventive concepts are not limited thereto. Also, the encapsulation layer TFEL may include at least one organic film to protect the light-emitting element layer EML from a foreign material such as dust. In an embodiment, the organic film may include an acrylic resin, an epoxy resin, a phenolic resin, a polyamide resin, or a polyimide resin. However, embodiments of the present inventive concepts are not limited thereto.

The touch sensing layer TSL may be disposed on the encapsulation layer TFEL (e.g., in the Z direction). For example, in an embodiment, the touch sensing layer TSL may be disposed directly on the encapsulation layer TFEL. In an embodiment in which the touch sensing layer TSL is disposed directly on the encapsulation layer TFEL, the thickness of the display device 10 can be reduced as compared to an embodiment in which a separate touch panel including the touch sensing layer TSL is attached on the encapsulation layer TFEL.

The touch sensing layer TSL may include touch electrodes for detecting a touch from the user in a capacitive manner. For example in an embodiment, the touch sensing layer TSL may detect a touch from the user in at least one of a self-capacitance manner and a mutual-capacitance manner by using the touch electrodes.

The polarizing film POL, may be disposed on the touch sensing layer TSL (e.g., in the Z direction) to prevent the degradation of visibility by the reflection of external light. The polarizing film POL may include a linear polarizing plate and a phase delay film such as a quarter-wave ($\lambda$/4) plate.

The cover window 100 may be disposed on the polarizing film POL (e.g., in the Z direction). In this embodiment, the polarizing film POl: and the cover window 100 may be attached together via an adhesive member such as an optically clear adhesive (OCA) or an optically clear resin (OCR). However, embodiments of the present inventive concepts are not limited thereto.

Figure 5:
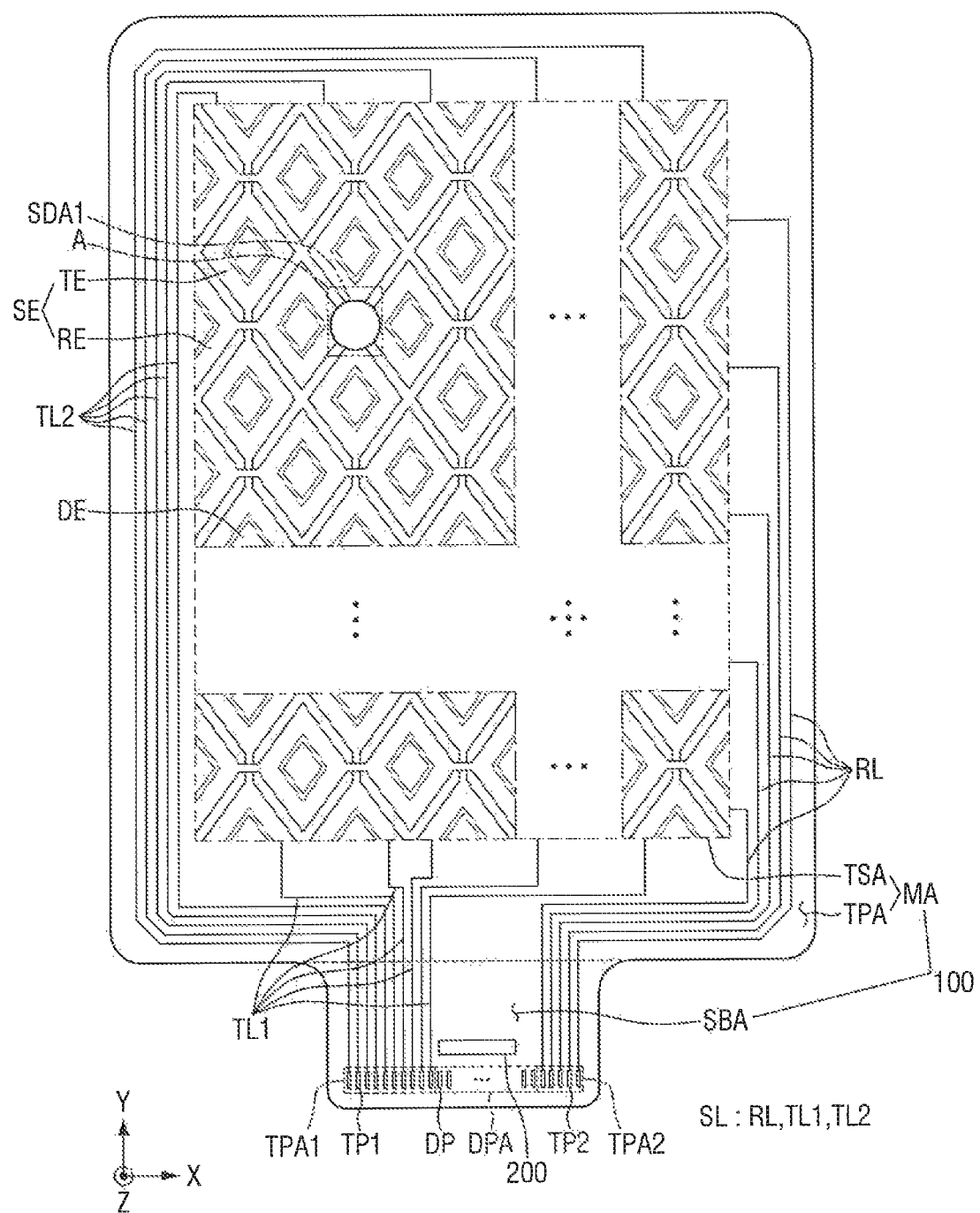
FIG. 5 is a layout view of a touch sensing unit according to an embodiment of the present inventive concepts.

FIG. 5 is a layout view of a touch sensing unit according to an embodiment of the present inventive concepts.

FIG. 5 illustrates that the touch sensing layer TSL includes two types of electrodes, for example, driving electrodes TE and sensing electrodes RE, and is driven in a mutual-capacitance manner that applies touch driving signals to the driving electrodes TE and detects mutual capacitance variations in a plurality of touch nodes TN via the sensing electrodes RE.

For convenience, FIG. 5 illustrates only the driving electrodes TE, the sensing electrodes RE, dummy patterns DE, touch lines (TL1, TL2, and RL), and touch pads (TP1 and TP2).

Referring to the embodiment of FIG. 5, the touch sensing layer TSL may include a touch sensing area TSA for detecting a touch from the user and a touch peripheral area TPA around the touch sensing area TSA. For example, as shown in the embodiment of FIG. 5, the touch peripheral area TPA may completely surround the touch sensing area TSA (e.g., in the X and Y directions). However, embodiments of the present inventive concepts are not limited thereto. The touch sensing area TSA may overlap with the display area DA (of FIG. 3), and the touch peripheral area TPA may overlap with the non-display area NDA (of FIG. 3).

The touch sensing area TSA includes the driving electrodes TE, the sensing electrodes RE, and the dummy patterns DE. The driving electrodes TE and the sensing electrodes RE may be electrodes for forming mutual capacitances to detect a touch from an object or from the user.

The sensing electrodes RE may be arranged in parallel in the X direction and the Y direction. For example, in an embodiment, the sensing electrodes RE may be electrically connected in the X direction. The sensing electrodes RE may be connected to one another in the X direction. The sensing electrodes RE may be electrically isolated from one another in the Y direction. Accordingly, a plurality of touch nodes TN (FIG. 6) where mutual capacitances are formed may be disposed at the intersections between the driving electrodes TE and the sensing electrodes RE. The touch nodes TN may correspond to the intersections between the driving electrodes TE and the sensing electrodes RE.

The driving electrodes TE may be arranged in parallel in the X direction and the Y direction. In an embodiment, the driving electrodes TE may be electrically isolated from one another in the X direction. The driving electrodes TE may be electrically connected to one another in the Y direction. In one example, referring to FIGS. 5-6, the driving electrodes TE may be connected to one another in the Y direction via first connection electrodes BE1.

The dummy patterns DE may be surrounded (e.g., in the X and Y directions) by the driving electrodes TE or the sensing electrodes RE. The dummy patterns DE may be electrically isolated from the driving electrodes TE or the sensing electrodes RE. The dummy patterns DE may be spaced apart from the driving electrodes TE or the sensing electrodes RE. The dummy patterns DE may be electrically floated.

FIG. 5 illustrates that the driving electrodes TE, the sensing electrodes RE, and the dummy patterns DE have a rhombus shape in a plan view. However, embodiments of the present inventive concepts are not limited thereto. For example, in an embodiment, the driving electrodes TE, the sensing electrodes RE, and the dummy patterns DE may have a non-rhombus tetragonal shape, a nontetragonal polygonal shape, a circular shapes, or an elliptical shape in a plan view.

The touch lines (TL1, TL2, and RL) may be disposed in the sensor peripheral area TPA. The touch lines (TL1, TL2, and RL) may include touch sensing lines RL, which are connected to the sensing electrodes RE, and first touch driving lines TL1 and second touch driving lines TL2, which are connected to the driving electrodes TE.

Sensing electrodes RE disposed on one side of the touch sensing area TSA may be connected one-to-one to the touch sensing lines RL. In one example, as illustrated in FIG. 5, sensing electrodes RE electrically connected to one another in the X direction and disposed at the right end of the touch sensing area TSA may be connected to the touch sensing lines RL. In an embodiment, the touch sensing lines RL may be connected one-to-one to second touch pads TP2. Thus, a touch driving circuit 400 may be electrically connected to the sensing electrodes RE.

Driving electrodes TE disposed on one side of the touch sensing area TSA may be connected one-to-one to the first touch driving lines TL1, and driving electrodes YE disposed on another side of the touch sensing area TSA may be connected one-to-one to the second touch driving lines TL2. In one example, as illustrated in FIG. 5, driving electrode YE electrically connected to one another in the Y direction and disposed at the lower end of the touch sensing area TSA may be connected one-to-one to the first touch driving lines TL1, and driving electrode TE electrically connected to one another in the Y direction and disposed at the upper end of the touch sensing area TSA may be connected cine-to-one to the second touch driving lines TL2. The second touch driving lines TL2 may be connected to the driving electrodes TE, above the touch sensing area TSA (e.g., in the Y direction) and may pass through the left portion of the touch peripheral area TPA outside the touch sensing area TSA (e.g., in the X direction).

The first touch driving lines TL1 and the second touch driving lines TL2 may be connected one-to-one to first touch pads TP1. Thus, the touch driving circuit 400 may be electrically connected to the driving electrodes TE. As the driving electrodes TE are connected to the first touch driving lines TL1 and the second touch driving lines TL2, on both sides of the touch sensing area TSA, and are thus able to receive touch driving signals, discrepancies that may be caused between touch driving signals applied to the driving electrodes TE on the lower side of the touch sensing area TSA and touch driving signals applied to the driving electrodes TE on the upper side of the touch sensing area TSA, due to RC delays in the touch driving signals, can be prevented.

A first touch pad area TPA1, in which the first touch pads TP1 are disposed, may be disposed on one side of a display pad area DPA, in which display pads DP are disposed. A second touch pad area TPA2, in which second touch pads TP2 are disposed, may be disposed on another side of the display pad area DPA. For example, as shown in the embodiment of FIG. 5, the first touch pad area TPA1 may be disposed on a left side of the display pad area DPA (e.g., in the X direction) and the second touch pad area TPA2 may be disposed on a right side of the display pad area DPA (e.g., in the X direction). However, embodiments of the present inventive concepts are not limited thereto. The display pads DP may be electrically connected to the data lines of the display panel 300.

The display pad area DPA, the first touch pad area TPA1, and the second touch pad area TPA2 may correspond to the pads of the display panel 300, which are connected to the display circuit board 310 of FIG. 2. The display circuit board 310 may be disposed on the display pads DP, the first touch pads TP1, and the second touch pads TP2. The display pads DP, the first touch pads TP1, and the second touch pads TP2 may be electrically connected to the display circuit board 310 via an anisotropic conductive film and a conductive adhesive member. Thus, the display pads DP, the first touch pads TP1, and the second touch pads TP2 may be electrically connected to the touch driving circuit 400, which is disposed on the display circuit board 310.

For convenience, FIG. 5 illustrates that the first subdisplay area SDA1 does not overlap with the driving electrodes TE and the sensing electrodes RE. However, embodiments of the present inventive concepts are not limited thereto. For example, in an embodiment, the second, third, and fourth sub-display areas SDA2, SDA3, and SDA4 may not overlap with the driving electrodes TE and the sensing electrodes RE.

As the driving electrodes TE and the sensing electrodes RE do not overlap with the first sub-display area SDA1, driving electrodes TE adjacent to the first sub-display area SDA1 may have a different planar shape from driving electrodes that are not adjacent to the first sub-display area SDA1. Also, the driving electrodes TE adjacent to the first sub-display area SDA1 may have a smaller size than the driving electrodes TE that are not adjacent to the first sub-display area SDA1.

Also, as the sensing electrodes RE do not overlap with the first sub-display area SDA1, sensing electrodes RE adjacent to the first sub-display area SDA1 may have a different planar shape from sensing electrodes RE that are not adjacent to the first sub-display area SDA1. Also, the sensing electrodes RE adjacent to the first sub-display area SDA1 may have a smaller size than the sensing electrodes RE that are not adjacent to the first sub-display area SDA1.

Figure 6:
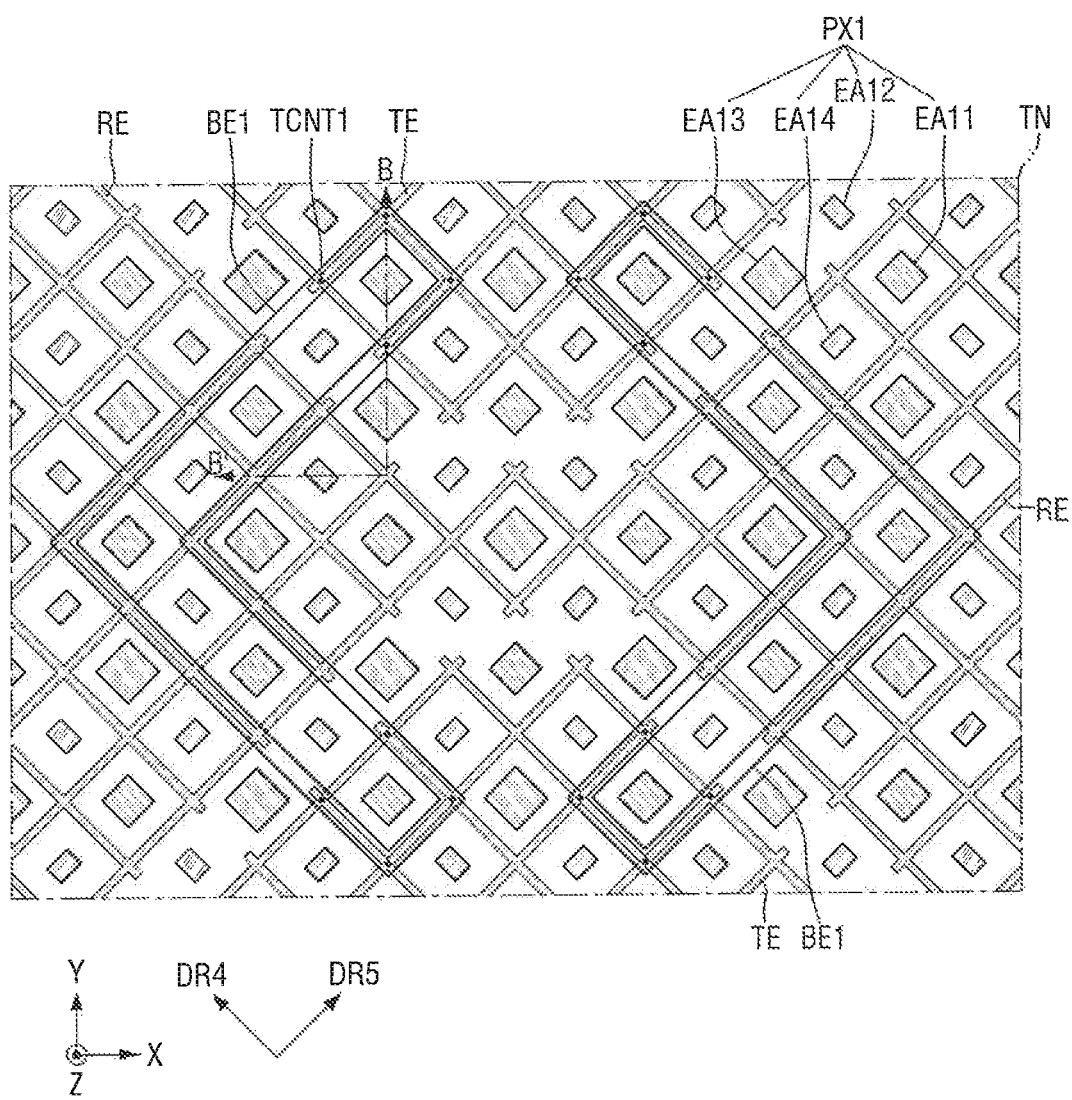
FIG. 6 is a layout view of touch nodes of FIG. 5 according to an embodiment of the present inventive concepts.

FIG. 6 is a layout view illustrating touch nodes of FIG. 5.

Referring to the embodiment of FIG. 6, the touch nodes TN may be defined as the intersections between the driving electrodes TE and the sensing electrodes RE.

As the driving electrodes TE and the sensing electrodes RE are disposed in the same layer, the driving electrodes TE may be spaced apart from the sensing electrodes RE. That is, gaps may be formed between the driving electrodes TE and the sensing electrodes RE.

Also, the dummy patterns DE may be disposed in the same layer as the driving electrodes TE and the sensing electrodes RE. That is, gaps may also be formed between the driving electrodes TE and the dummy patterns DE and between the sensing electrodes RE and the dummy patterns DE.

In an embodiment, the first connection electrodes BE1 may be disposed in a different layer from the driving electrodes TE and the sensing electrodes RE. In an embodiment, the first connection electrodes BE1 may be formed to be bent at least once. In the embodiment of FIG. 6, each of the first connection electrodes BE1 is formed in the shape of an angle bracket (such as "<" or ">"). However, embodiments of the present inventive concepts are not limited thereto and the planar shape of the first connection electrodes BE1 may vary. Since each pair of adjacent driving electrodes TE in the Y direction are connected by multiple first connection electrodes BE1, the driving electrodes TE can be stably connected in the Y direction, even if one of the first connecting portions CE1 is disconnected. FIG. 6 illustrates that every two adjacent driving electrodes TE are connected by one connection electrode BE1. However, the number of first connection electrodes BE1 used to connect every two adjacent driving electrodes TE is not particularly limited.

The first connection electrodes BE1 may overlap with the driving electrodes TE, which are adjacent to one another in the Y direction, in the thickness direction of the substrate SUB (e.g., in the Z direction). The first connection electrodes BE1 may overlap with the sensing electrodes RE (e.g., in the Z direction). First and second sides of each of the first connection electrodes BE1 may be connected to a pair of adjacent driving electrodes TE in the Y direction via first touch contact holes TCNT1.

Due to the presence of the first connection electrodes BE1, the driving electrodes TE may be electrically isolated from the sensing electrodes RE at the intersections between the driving electrodes TE and the sensing electrodes RE. Accordingly, mutual capacitances may be formed between the driving electrodes TE and the sensing electrodes RE.

The driving electrodes TE, the sensing electrodes RE, and the first connection electrodes BE1 may have a mesh or fishnet shape in a plan view. Also, the dummy patterns DE may have a mesh or fishnet shape in a plan view. Thus, the driving electrodes TE, the sensing electrodes RE, the first connection electrodes BE1, and the dummy patterns DE may not overlap with emission units (EA11, EA12, EA13, and EA14) of each first pixel PX1. Accordingly, the brightness of light emitted from the emission units (EA11, EA12, EA13, and EA14) can be prevented from decreasing due to being blocked by the driving electrodes TE, the sensing electrodes RE, the first connection electrodes BE1, and the dummy patterns DE.

As shown in the embodiment of FIG. 6, a first pixel PX1 may include a first emission unit EA11, which emits light of a first color, a second emission unit EA12, which emits light of a second color, a third emission unit EA13, which emits light of a third color, and a fourth emission unit EA14, which emits light of the second color. In one example, the first, second, and third colors may be red, green, and blue, respectively. FIG. 6 illustrates that the second and fourth emission units EA12 and EA14 emit light of the same color. However, embodiments of the present inventive concepts are not limited thereto and the first to fourth emission units EA11 to EA14 may emit various different colors. For example, the second and fourth emission units EA12 and EA14 may emit light of different colors.

The first and second emission units EA11 and EA12 may be adjacent to each other in a fourth direction DR4 that extends between the X and Y directions and is perpendicular to the Z direction. For example, the fourth direction DR4 may be inclined at an angle of 45 degrees with respect to the X direction. The third and fourth emission units EA13 and EA14 may be adjacent to each other in the fourth direction DR4. The first and fourth emission units EA11 and EA14 may be adjacent to each other in a fifth direction DR5 that extends between the X and Y directions and is perpendicular to the fourth direction DR4 and the Z direction. The second and third emission units EA12 and EA13 may be adjacent to each other in the fifth direction DR5.

In an embodiment, the first, second, third, and fourth emission units EA11, EA12, EA13, and EA14 may have a rhombus or rectangular shape in a plan view. However, embodiments of the present inventive concepts are limited thereto. For example, in an embodiment, the first, second, third, and fourth emission units EA11, EA12, EA13, and EA14 may have a nontetragonal polygonal shape, a circular shape, or an elliptical shape in a plan view. FIG. 6 illustrates that the third emission unit EA13 has a largest size and the second and fourth emission units EA12 and EA14 have a smallest size. However, embodiments of the present inventive concepts are not limited thereto and the respective sizes of the first to fourth emission units EA11 to EA14 may vary.

In an embodiment, second emission units EA12 and fourth emission units EA14 may be arranged in odd-numbered rows. The second emission units EA12 and the fourth emission units EA14 may be arranged parallel to one another in the X direction, in each of the odd-numbered rows. The second emission units EA12 and the fourth emission units EA14 may be alternately arranged in each of the odd-numbered rows. Each of the second emission units EA12 may have relatively long sides in the fourth direction DR4 and relatively short sides in the fifth direction DR5, and each of the fourth emission units EA14 may have relatively short sides in the fourth direction DR4 and relatively long sides in the fifth direction DR5. The fourth direction DR4 may be a diagonal direction between the X direction and the Y direction and may be inclined at an angle of 45 degrees with respect to the X direction. The fifth direction DR5 may be a direction orthogonal to the fourth direction DR4.

First emission units EA11 and third emission units EA13 may be arranged in even-numbered rows. The first emission units EA11 and the third emission units EA13 may be arranged parallel to one another in the X direction, in each of the even-numbered rows. The first emission units EA11 and the third emission units EA13 may be alternately arranged in each of the even-numbered rows.

The second emission units EA12 and the fourth emission units EA14 may be arranged in odd-numbered columns. The second emission units EA12 and the fourth emission units EA14 may be arranged parallel to one another in the Y direction, in each of the odd-numbered columns. The second emission units EA12 and the fourth emission units EA14 may be alternately arranged in each of the odd-numbered columns.

The first emission units EA11 and the third emission units EA13 may be arranged in even-numbered columns. The first emission units EA11 and the third emission units EA13 may be arranged parallel to one another in the Y direction, in each of the even-numbered columns. The first emission units EA11 and the third emission units EA13 may be alternately arranged in each of the even-numbered columns.

Figure 7:
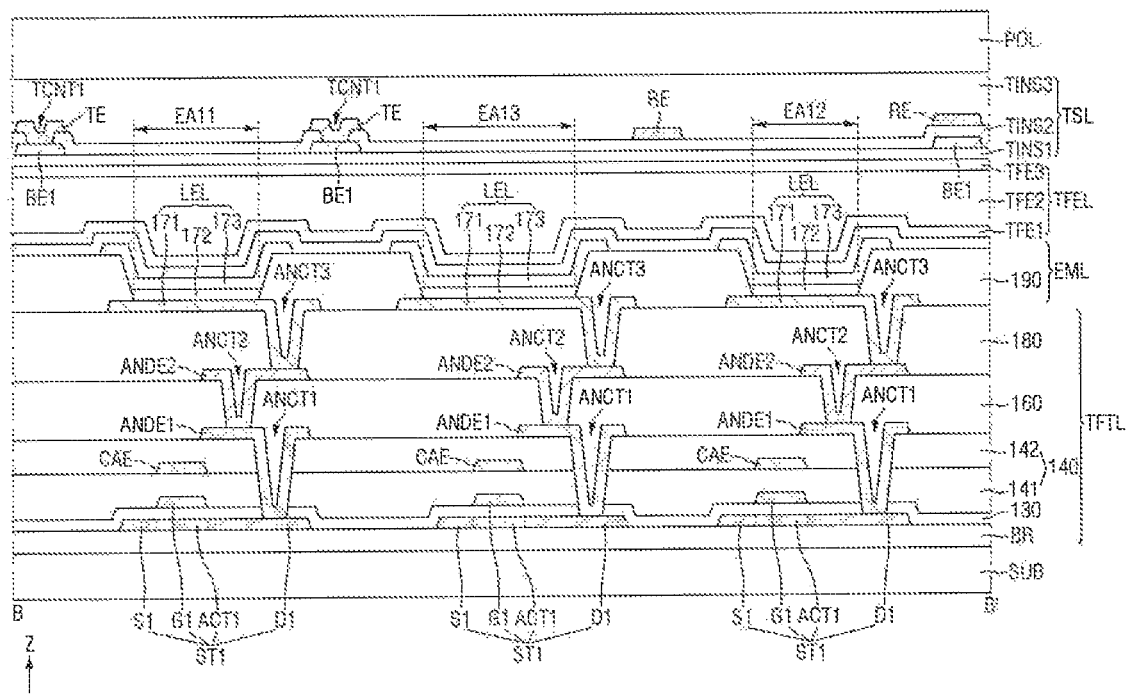
FIG. 7 is a cross-sectional view taken along line B-B' of FIG. 6 according to an embodiment of the present inventive concepts.

FIG. 7 is a cross-sectional view taken along line B-B' of FIG. 6.

Referring to FIG. 7, a barrier film BR may be disposed on the substrate SUB (e.g., directly thereon in the Z direction). The substrate SUB may be formed of an insulating material such as a polymer resin. In one example, the substrate SUB may be formed of polyimide. The substrate SUB may be a flexible substrate that is bendable, foldable, or rollable.

The barrier film BR is a film for protecting the transistors of the thin-film transistor layer TFTL and light-emitting layers 172 of the light-emitting element layer EML from moisture that may infiltrate into the substrate SUB, which is susceptible to moisture. In an embodiment, the barrier film BR may include a plurality of inorganic films that are alternately stacked. In one example, the barrier film BR may be formed as a multilayer in which one or more inorganic films such as a silicon nitride layer, a silicon oxynitride layer, a silicon oxide layer, a titanium oxide layer, and/or an aluminum oxide layer are alternately stacked.

Thin-film transistors ST1 may be disposed on the barrier film BR. The thin-film transistors ST1 may include active layers ACT1, gate electrodes G1, source electrodes S1, and drain electrodes D1.

The active layers ACT1, the source electrodes S1, and the drain electrodes D1 of the thin-film transistors ST1 are disposed on the barrier film BR (e.g., directly thereon in the Z direction). In an embodiment, the active layers ACT1 of the thin-film transistors ST1 may include polycrystalline silicon, monocrystalline silicon, low-temperature polycrystalline silicon, amorphous silicon, or an oxide semiconductor. However, embodiments of the present inventive concepts are not limited thereto. The active layers ACT1, which overlap with the gate electrodes G1 in the thickness direction of the substrate SUB (e.g., the Z direction) may be defined as channel regions. The source electrodes S1 and the drain electrodes D1 may be regions that do not overlap with the gate electrodes G1 in the Z direction. In an embodiment, the source electrodes S1 and the drain electrodes D1 may include a silicon or oxide semiconductor doped with ions or impurities and may thus have conductivity.

A gate insulating film 130 may be disposed on the active layers ACT1, the source electrodes S1, and the drain electrodes D1 of the thin-film transistors ST1 (e.g., directly thereon in the Z direction). In an embodiment, the gate insulating film 130 may be formed as an inorganic film such as, for example, a silicon nitride layer, a silicon oxynitride layer, a silicon oxide layer, a titanium oxide layer, or an aluminum oxide layer. However, embodiments of the present inventive concepts are not limited thereto.

The gate electrodes G1 of the thin-film transistors ST1 may be disposed on the gate insulating film 130 (e.g., directly thereon in the Z direction). The gate electrodes G1 may overlap with the active layers ACT1 in the Z direction. In an embodiment, the gate electrodes G1 may be formed as single layers or multilayers including molybdenum (Mo), aluminum (Al), chromium (Cr), gold (Au), titanium (Ti), nickel (Ni), neodymium (Nd), copper (Cu), or an alloy thereof.

A first interlayer insulating film 141 may be disposed on the gate electrodes G1 of the thin-film transistors ST1 (e.g., directly thereon in the Z direction). In an embodiment, the first interlayer insulating film 141 may be formed as an inorganic film such as, for example, a silicon nitride layer, a silicon oxynitride layer, a silicon oxide layer, a titanium oxide layer, or an aluminum oxide layer. The first interlayer insulating film 141 may be formed as a multilayer inorganic film.

Capacitor electrodes CAB may be disposed on the first interlayer insulating film 141 (e.g., directly thereon in the Z direction). As shown in the embodiment of FIG. 7, the capacitor electrodes CAE may overlap with the gate electrodes G1 of the first thin-film transistors ST1 in the Z direction. As the first interlayer insulating film 141 has a predetermined dielectric constant, capacitors may be formed by the capacitor electrodes CAE, the gate electrodes G1, and the first interlayer insulating film 141. In an embodiment, the capacitor electrodes CAE may be formed as single layers or multilayers including Mo, Al, Cr, Au, Ti, Ni, Nd, Cu, or an alloy thereof. However, embodiments of the present inventive concepts are not limited thereto.

A second interlayer insulating film 142 may be disposed on the capacitor electrodes CAE (e.g., directly thereon in the Z direction). In an embodiment, the second interlayer insulating film 142 may be formed as an inorganic film such as, for example, a silicon nitride layer, a silicon oxynitride layer, a silicon oxide layer, a titanium oxide layer, or an aluminum oxide layer. However, embodiments of the present inventive concepts are not limited thereto. The second interlayer insulating film 142 may be formed as a multilayer inorganic film.

First anode connection electrodes ANDE1 may be disposed on the second interlayer insulating film 142 (e.g., directly thereon in the Z direction). The first anode connection electrodes ANDE1 may be connected to the drain electrodes D1 of the thin-film transistors ST1 through first connecting contact holes ANCT1, which penetrate the gate insulating film 130, the first interlayer insulating film 141, and the second interlayer insulating film 142. In an embodiment, the first anode connection electrodes ANDE1 may be formed as single layers or multilayers including Mo, Al, Cr, Au, Ti, Ni, Nd, Cu, or an alloy thereof. However, embodiments of the present inventive concepts are not limited thereto.

A first planarization film 160 for planarizing any height differences formed by the thin-film transistors ST1 may be disposed on the first anode connection electrodes ANDE1 (e.g., directly thereon in the Z direction). In an embodiment, the first planarization film 160 may be formed as an organic film including an acrylic resin, an epoxy resin, a phenolic resin, a polyamide resin, or a polyimide resin.

Second anode connection electrodes ANDE2 may be disposed on the first planarization film 160 (e.g., directly thereon in the Z direction). The second anode connection electrodes ANDE2 may be connected to the first anode connection electrodes ANDE1 through second connecting contact holes ANCT2, which penetrate the first planarization film 160. In an embodiment, the second anode connection electrodes ANDE2 may be formed as single layers or multilayers including Mo, Al, Cr, Au, Ti, Ni, Nd, Cu, or an alloy thereof. However, embodiments of the present inventive concepts are not limited thereto.

A second planarization film 180 may be disposed on the second anode connection electrodes ANDE2 and the first planarization film 160 (e.g., directly thereon in the Z direction). In an embodiment, the second planarization film 180 may be formed as an organic film including an acrylic resin, an epoxy resin, a phenolic resin, a polyamide resin, or a polyimide resin. However, embodiments of the present inventive concepts are not limited thereto.

Light-emitting elements LEL and a bank 190 may be disposed on the second planarization film 180 (e.g., directly thereon in the Z direction). The light-emitting elements LEL include a pixel electrodes 171, light-emitting layers 172, and a common electrode 173.

The pixel electrodes 171 may be disposed on the second planarization film 180 (e.g., directly thereon in the Z direction). The pixel electrodes 171 may be connected to the second anode connection electrodes ANDE2 through third connecting contact holes ANCT3, which penetrate the second planarization film 180.

In an embodiment that includes a top emission structure that emits light in a direction from the light-emitting layers 172 to the common electrode 173, the pixel electrodes 171 may be formed of a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, or a stack of an APC alloy and ITO (e.g., (TO/APC/ITO). However, embodiments of the present inventive concepts are not limited thereto.

The bank 190 may be formed to divide the pixel electrodes 171 on the second planarization film 180 to define first, second, third, and fourth emission units EA11, EA12, EA13, and EA14. The bank 190 may be disposed to cover the edges of each of the pixel electrodes 171 and to expose a central portion of the pixel electrodes 171. In an embodiment, the bank 190 may be formed as an organic film including an acrylic resin, an epoxy resin, a phenolic resin, a polyamide resin, or a polyimide resin. However, embodiments of the present inventive concepts are not limited thereto.

Each of the first, second, third, and fourth emission units EA11, EA12, EA13, and EA14 may refer to a region in which one of the pixel electrodes 171, one of the light-emitting layers 172, and the common electrode 173 are sequentially stacked (e.g., in the Z direction) so that holes from the corresponding pixel electrode 171 and electrons from the common electrode 173 combine together in the corresponding light-emitting layer 172 and thus emit light.

The light-emitting layers 172 may be disposed on the pixel electrodes 171 and the bank 190 (e.g., directly thereon). In an embodiment, the light-emitting layers 172 may include an organic material and may emit light of a predetermined color. In one example, the light-emitting layers 172 may include hole transport layers, organic material layers, and electron transport layers.

The common electrode 173 may be disposed on the light-emitting layers 172 (e.g., directly thereon in the Z direction). The common electrode 173 may be disposed to cover the light-emitting layers 172. In an embodiment, the common electrode 173 may be a layer formed in common for all the first, second, third, and fourth emission units EA11, EA12, EA13, and EA14. In an embodiment, a capping layer may be formed on the common electrode 173 (e.g., directly thereon in the Z direction).

In an embodiment including the top emission structure, the common electrode 173 may be formed of a transparent conductive oxide (TCO) capable of transmitting light therethrough, such as ITO or indium zinc oxide (IZO), or a semitransparent conductive material such as magnesium (Mg), silver (Ag), or an alloy thereof. However, embodiments of the present inventive concepts are not limited thereto. In an embodiment where the common electrode 173 is formed of a semitransparent metallic material, the emission efficiency of the light-emitting elements LEL can be increased due to microcavities.

The encapsulation layer TFEL may be disposed on the common electrode 173 (e.g., directly thereon in the Z direction). The encapsulation layer TFEL may include at least one inorganic film to prevent the infiltration of oxygen or moisture into the light-emitting element layer EML. Also, the encapsulation layer TFEL may include at least one organic film to protect the light-emitting element layer EML from a foreign material such as dust. In one example, the encapsulation layer TFEL may include a first encapsulation inorganic film TFE1, an encapsulation organic film TFE2, and a second encapsulation inorganic film TFE3.

The first encapsulation inorganic film TFE1 may be disposed on the common electrode 173 (e.g., directly thereon in the Z direction), the encapsulation organic film TFE2 may be disposed on the first encapsulation inorganic film TFE1 (e.g., directly thereon in the Z direction), and the second encapsulation inorganic film TFE3 may be disposed on the encapsulation organic film TFE2 (e.g., directly thereon in the Z direction). In an embodiment, the first and second encapsulation inorganic films TFE1 and TFE3 may be formed as multilayers in which one or more inorganic films such as a silicon nitride layer, a silicon oxynitride layer, a silicon oxide layer, a titanium oxide layer, and/or an aluminum oxide layer are alternately stacked. However, embodiments of the present inventive concepts are not limited thereto. The encapsulation organic film TFE2 may be formed as an organic film including an acrylic resin, an epoxy resin, a phenolic resin, a polyamide resin, or a polyimide resin. However, embodiments of the present inventive concepts are not limited thereto. In some embodiments, the numbers of the encapsulation organic film and the encapsulation inorganic film may vary.

The touch sensing layer TSL may be disposed on the encapsulation layer TFEL (e.g., directly thereon in the Z direction). The touch sensing layer TSL may include a first touch insulating film TINS1, first connection electrodes BE1, a second touch insulating film TINS2, driving electrodes TE, sensing electrodes RE, and a third touch insulating film TINS3.

In an embodiment, the first touch insulating film TINS1 may be formed as an inorganic film such as, for example, a silicon nitride layer, a silicon oxynitride layer, a silicon oxide layer, a titanium oxide layer, or an aluminum oxide layer. However, embodiments of the present inventive concepts are not limited thereto.

The first connection electrodes BE1 may be disposed on the first touch insulating film TINS1 (e.g., directly thereon in the Z direction). In an embodiment, the first connection electrodes BE1 may be formed as single layers or multilayers including Mo, Al, Cr, Au, Ti, Ni, Nd, Cu, or an alloy thereof. However, embodiments of the present inventive concepts are not limited thereto.

The second touch insulating film TINS2 may be disposed on the first connection electrodes BE1 (e.g., directly thereon in the Z direction). In an embodiment, the second touch insulating film TINS2 may be formed as an inorganic film such as, for example, a silicon nitride layer, a silicon oxynitride layer, a silicon oxide layer, a titanium oxide layer, or an aluminum oxide layer. Alternatively, the second touch insulating film TINS2 may be formed as an organic film including an acrylic resin, an epoxy resin, a phenolic resin, a polyamide resin, or a polyimide resin. However, embodiments of the present inventive concepts are not limited thereto.

The driving electrodes TE and the sensing electrodes RE may be disposed on the second touch insulating film TINS2 (e.g., directly thereon in the Z direction). Not only the driving electrodes TE and the sensing electrodes RE, but also, the dummy patterns DE, the first touch driving lines TL1, the second touch driving lines TL2, and the touch sensing lines RL of FIG. 4, may be disposed on the second touch insulating film TINS2 (e.g., directly thereon in the Z direction). The driving electrodes TE and the sensing electrodes RE may be formed as single layers or multilayers including Mo, Al, Cr, Au, Ti, Ni, Nd, Cu, or an alloy thereof.

The driving electrodes TE and the sensing electrodes RE may overlap with the first connection electrodes BE1 in the Z direction. The driving electrodes TE may be connected to the first connection electrodes BE1 through first touch contact holes TCNT1, which penetrate the first touch insulating film TINS1.

The third touch insulating film TINS3 may be formed on the driving electrodes TE and the sensing electrodes RE (e.g., directly thereon). The third touch insulating film TINS3 may planarize height differences formed by the driving electrodes TE, the sensing electrodes RE, and the first connection electrodes BE1. In an embodiment, the third touch insulating film TINS3 may be formed as an organic film including an acrylic resin, an epoxy resin, a phenolic resin, a polyamide resin, or a polyimide resin. However, embodiments of the present inventive concepts are not limited thereto.

The polarizing film POI, may be disposed on the touch sensing layer TSL to prevent the degradation of visibility by the reflection of external light. In an embodiment, the polarizing film POE, may include a linear polarizing plate and a phase delay film such as a $\lambda/4$ plate.

Figure 8:
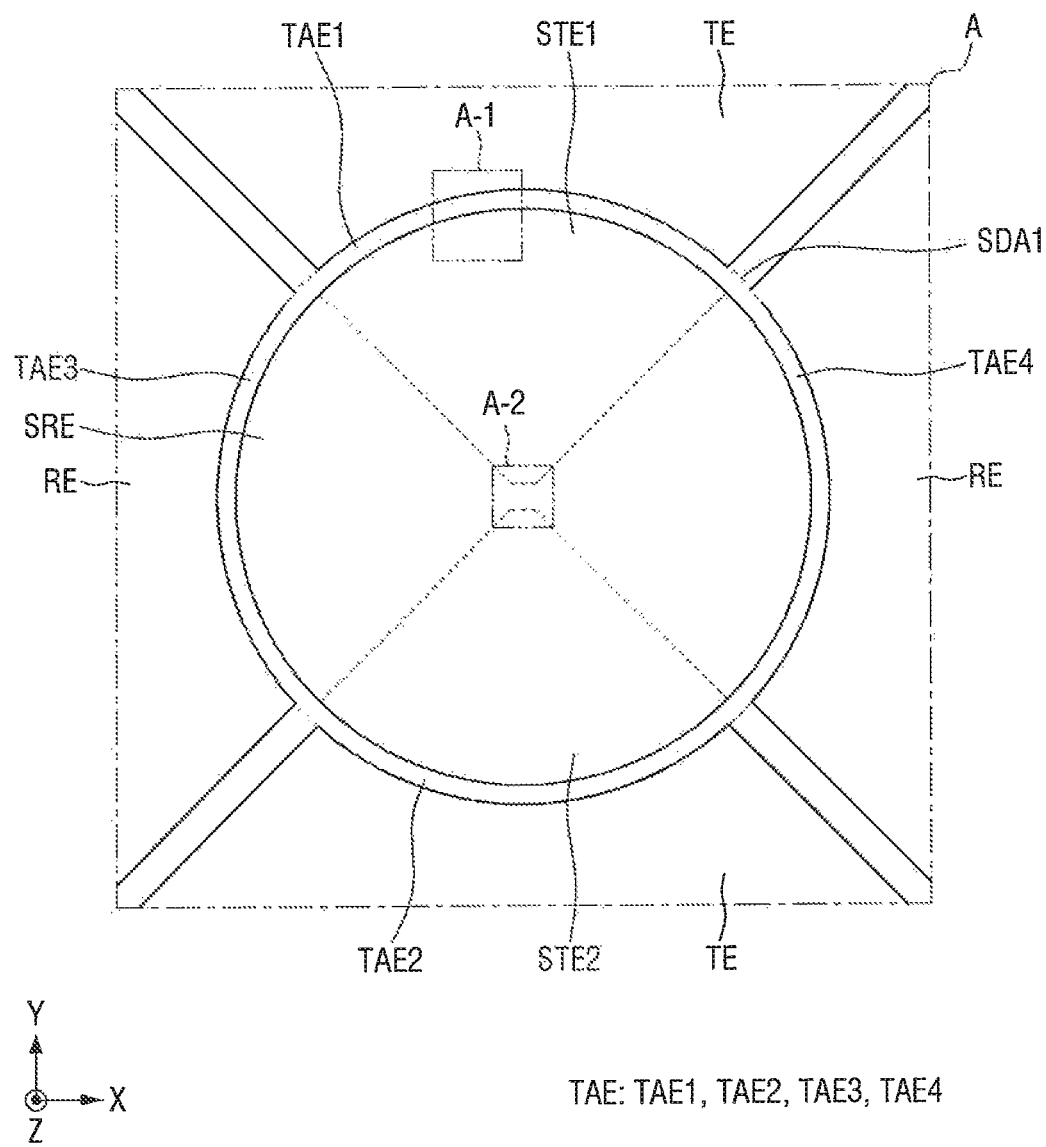
FIG. 8 is a layout view of an area A of FIG. 5 according to an embodiment of the present inventive concepts.

FIG. 8 is a layout view of an area A of FIG. 5.

FIG. 8 illustrates the first sub-display area SDA1, driving electrodes TE and sensing electrodes RE adjacent to the first sub-display area SDA1, and auxiliary electrodes TAR Referring to FIG. 8, the first sub-display area SDA1 may include a plurality of sub-touch electrodes. In one example, the first sub-display area SDA1 may include a first sub-driving electrode STE1, a second sub-driving electrode STE2, sub-sensing electrodes SRE, and auxiliary electrodes TAE.

The first sub-driving electrode STE1 may be disposed in an upper portion of the first sub-display area SDA1. The width of the first sub-driving electrode STE1 may decrease from the edge to the center of the first sub-display area SDA1. In one example, the first sub-driving electrode STE1 may have a fanlike shape in a plan view (e.g., in a plane defined in the X and Y directions).

The second sub-driving electrode STE2 may be disposed in a lower portion of the first sub-display area SDA1 (e.g., in the Y direction). The width of the second sub-driving electrode STE2 (e.g., length in the X direction) may decrease from the edge to the center of the first sub-display area SDA1. In one example, the second sub-driving electrode STE2 may have a fanlike shape in a plan view (e.g., in a plane defined in the X and Y directions).

In an embodiment, the first and second sub-driving electrodes STE1 and STE2 may be symmetrical with each other in the Y direction with respect to the center of the first sub-display area SDA1. The first and second sub-driving electrodes STE1 and STE2 may be disposed to be spaced apart from each other (e.g., in the Y direction).

The sub-sensing electrodes SRE may be disposed on left and right portions of the first sub-display area SDA1 (e.g., in the X direction). The width of the sub-sensing electrodes SRE (e.g., length in the Y direction) may decrease from the edge towards the center of the first sub-display area SDA1. The sub-sensing electrodes SRE may be disposed between the first and second sub-driving electrodes STE1 and STE2.

The adjacent first and second sub-driving electrodes STE1 and STE2 may be connected via a plurality of second connection electrodes BE2 (of FIGS. 11A and 11B) that overlap with the sub-sensing electrodes SRE (e.g., in the Z direction). That is, due to the second connection electrodes BE2, the first and second sub-driving electrodes STE1 and STE2 may be electrically isolated from the sub-sensing electrodes SRE at the intersections between the first and second sub-driving electrodes STE1 and STE2 and the sub-sensing electrodes SRE. Accordingly, mutual capacitances may be formed between the first and second sub-driving electrodes STE1 and STE2 and the sub-sensing electrodes SRE.

The first sub-display area SDA1 may include a plurality of auxiliary electrodes TAE. For example, as shown in the embodiment of FIG. 8, the auxiliary electrodes TAE may include first, second, third, and fourth auxiliary electrodes TAE1, TAE2, TAE3, and TAE4. However, embodiments of the present inventive concepts are not limited thereto and the numbers of the auxiliary electrodes TAE may vary.

The first, second, third, and fourth auxiliary electrodes TAE1, TAE2, TAE3, and TAE4 may be disposed along the edge of the first sub-display area SDA1. The auxiliary electrodes TAE, such as the first, second, third, and fourth auxiliary electrodes TAE1, TAE2, TAE3, and TAE4, may be disposed between the first pixels PX1 (FIG. 9) of the main display area MDA and the second pixels PX2 (FIG. 9) of the sub-display areas, such as the first sub-display area SDA1. The first auxiliary electrode TAE1 may be disposed on an upper portion of the edge of the first sub-display area SDA1 (e.g., in the Y direction), and the second auxiliary electrode TAE2 may be disposed on a lower portion of the edge of the first sub-display area SDA1 (e.g., in the Y direction). The third auxiliary electrode TAE3 may be disposed on a left portion of the edge of the first sub-display area SDA1 (e.g., in the X direction), and the fourth auxiliary electrode TAE4 may be disposed on a right portion of the edge of the first sub-display area SDA1 (e.g., in the X direction).

The first, second, third, and fourth auxiliary electrodes TAE1, TAE2, TAE3, and TAE4 may be disposed to be spaced apart from one another. That is, the first, second, third, and fourth auxiliary electrodes TAE1, TAE2, TAE3, and TAE4 may be electrically isolated from one another.

As shown in the embodiment of FIG. 8, the first auxiliary electrode TAE1 may be disposed between the first sub-driving electrode STE1 and the driving electrode TE on the upper outer side of the first sub-display area SDA1. The first auxiliary electrode TAE1 may be connected to the first sub-driving electrode STE1 and the driving electrode TE on the upper outer side of the first sub-display area SDA1. As shown in the embodiment of FIG. 8, the second auxiliary electrode TAE2 may be disposed between the second sub-driving electrode STE2 and the driving electrode TE on the lower outer side of the first sub-display area SDA1. The second auxiliary electrode TAE2 may be connected to the second sub-driving electrode STE2 and the driving electrode TE on the lower outer side of the first sub-display area SDA1. As the first and second sub-driving electrodes STE1 and STE2 are connected by multiple second connection electrodes BE2, the driving electrodes TE and the first and second sub-driving electrodes STE1 and STE2 may be electrically connected to one another.

The third auxiliary electrode TAE3 may be between the sensing electrode RE outside the left side of the first sub-display area SDA1 and the sub-sensing electrode SRE (e.g., in the X direction). That is, the third auxiliary electrode TAE3 may be connected to the sensing electrode RE outside the left side of the first sub-display area SDA1 and the sub-sensing electrode SRE. The fourth auxiliary electrode TAE4 may be between the sensing electrode RE outside the right side of the first sub-display area SDA1 and the sub-sensing electrode SRE (e.g., in the X direction). The fourth auxiliary electrode TAE4 may be connected to the sensing electrode RE outside the right side of the first sub-display area SDA1 and the sub-sensing electrode SRE. Accordingly, the sensing electrodes RE and the third and fourth sub-driving electrodes STE3 and STE4 may be electrically connected to one another.

The first sub-display area SDA1 may include a plurality of light-transmitting areas TA (FIGS. 9 and 11A) to provide light to an optical device such as the proximity sensor 740. Accordingly, the ratio of the area occupied by the first and second sub-driving electrodes STE1 and STE2 per unit area may be less than the ratio of the area occupied by the driving electrodes TE per unit area. Also, the ratio of the area occupied by the sub-sensing electrodes SRE per unit area may be less than the ratio of the area occupied by the sensing electrodes RE per unit area. As a result, mutual capacitances formed between the first and second sub-driving electrodes STE1 and STE2 and the sub-sensing electrodes SRE, in the first sub-display area SDA1, may be smaller than mutual capacitances formed between the driving electrodes TE and the sensing electrodes RE, in the main display area MDA, and thus, touch sensitivity may be relatively low in the first sub-display area SDA1.

As illustrated in the embodiment of FIG. 8, as the first and second auxiliary electrodes TAE1 and TAE2, which are connected to the first and second sub-driving electrodes STE1 and STE2, respectively, and the third and fourth auxiliary electrodes TAE3 and TAE4, which are connected to the sub-sensing electrodes SRE, are provided along the edge of the first sub-display area SDA1, the mutual capacitances formed between the first and second sub-driving electrodes STE1 and STE2 and the sub-sensing electrodes SRE, in the first sub-display area SDA1, can be strengthened. As a result, the touch sensitivity in the first sub-display area SDA can be increased.

The second, third, and fourth sub-display areas SDA2, SDA3, and SDA4 of FIGS. 2 and 3 may be substantially the same as the first sub-display area SDA1 of FIG. 8, and thus, detailed descriptions thereof will be omitted for convenience of explanation.

Figure 9:
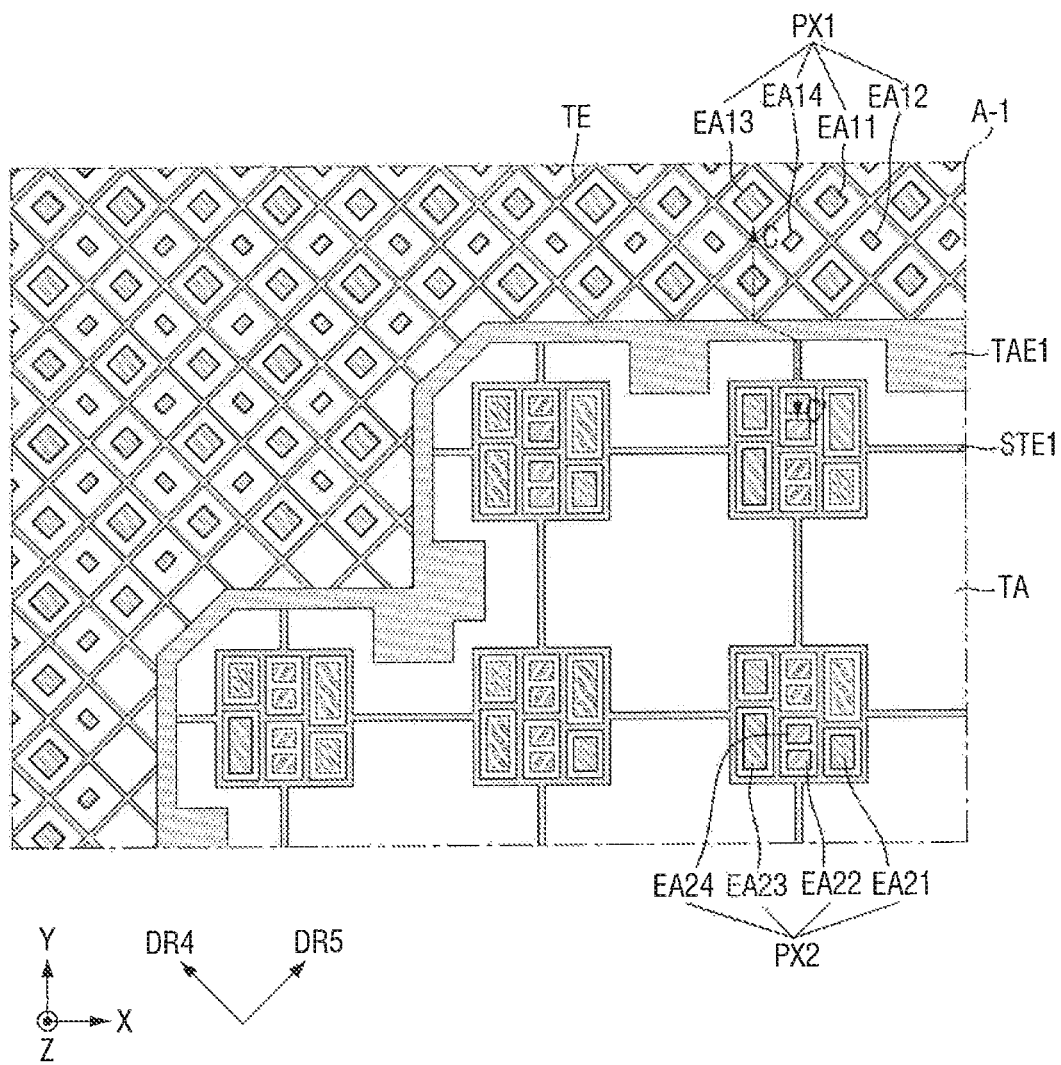
FIG. 9 is a layout view of an area A-1 of FIG. 8 according to an embodiment of the present inventive concepts.
Figure 10A:
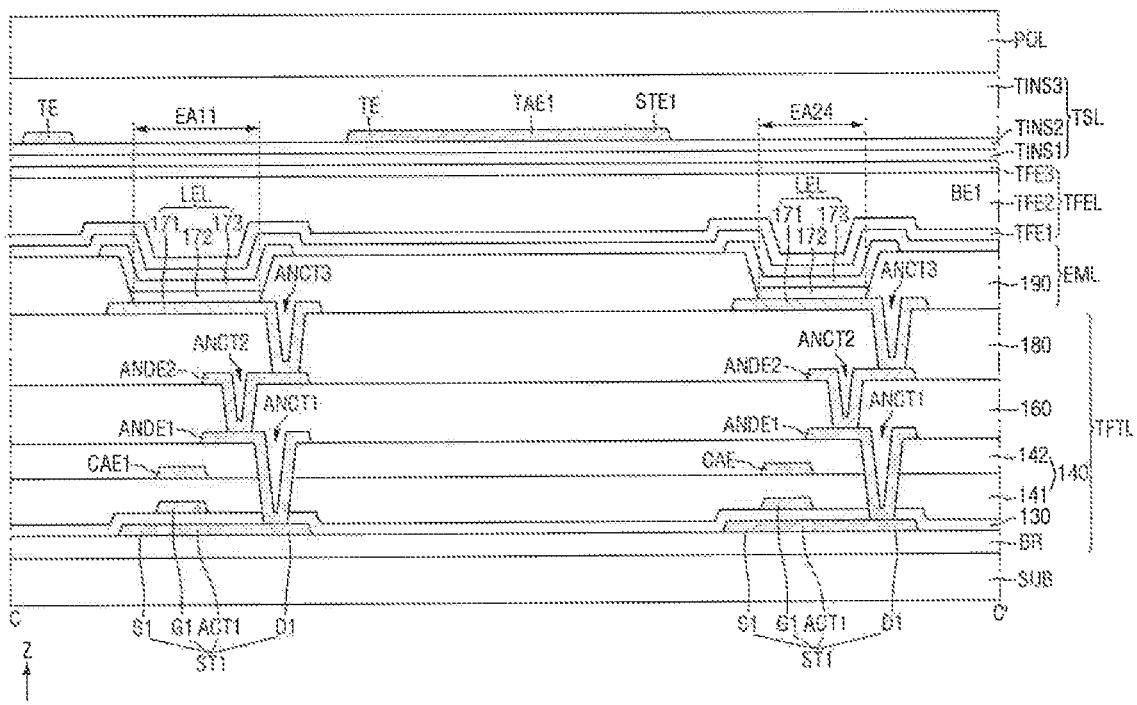
FIG. 10A is a cross-sectional view taken along line C-C' of FIG. 9 according to an embodiment of the present inventive concepts.

FIG. 9 is a layout view of an area A-1 of FIG. 8. FIG. 10A is a cross-sectional view taken along line C-C' of FIG. 9.

Referring to FIGS. 9 and 10A, the first sub-display area SDA1 may include second pixels PX2, the first sub-driving electrode STE1, light-transmitting areas TA, and the first auxiliary electrode TAE1.

Each of the second pixels PX2 may include a first emission unit EA21, which emits light of the first color, a second emission unit EA22, which emits light of the second color, a third emission unit EA23, which emits light of the third color, and a fourth emission unit EA24, which emits light of the second color. FIG. 9 illustrates that the second and fourth emission units EA21 and EA24 emit light of the same color. However, embodiments of the present inventive concepts are not limited thereto. Alternatively, the second and fourth emission units EA22 and EA24 may emit light of different colors.

The first and second emission units EA21 and EA22 may be adjacent to each other in the X direction, the first and fourth emission units EA21 and EA24 may be adjacent to each other in the X direction, the second and third emission units EA22 and EA23 may be adjacent to each other in the X direction, and the third and fourth emission units EA23 and EA24 may be adjacent to each other in the X direction. The second and fourth emission units EA22 and EA24 may be adjacent to each other in the Y direction and may be disposed between the first emission unit EA21 and the third emission unit EA23 in the X direction.

The third emission unit EA23 may have a largest size, and the second and fourth emission units EA22 and EA24 may have a smallest size. The second and fourth emission units EA22 and EA24 may have substantially the same size. However, embodiments of the present inventive concepts are not limited thereto and the sizes of the first to fourth emission units EA21 to EA24 may vary.

In an embodiment, the first emission unit EA22 of each of the second pixels PX2 may have a larger size (e.g., area in a plane defined in the X and Y directions) than a first emission unit EA11 of each of first pixels PX1. The second emission unit EA22 of each of the second pixels PX2 may have a larger size (e.g., area in a plane defined in the X and Y directions) than a second emission unit EA12 of each of the first pixels PX1. The third emission unit EA23 of each of the second pixels PX2 may have a larger size (e.g., area in a plane defined in the X and Y directions) than a third emission unit EA13 of each of the first pixels PX1. The fourth emission unit EA24 of each of the second pixels PX2 may have a larger size (e.g., area in a plane defined in the X and Y directions) than a fourth emission unit EA14 of each of the first pixels PX1.

The resolution of the main display area MDA may be higher than the resolution of the first sub-display area SDA1. That is, the number of first pixels PX1 per unit area of the main display area MDA may be greater than the number of second pixels PX2 per unit area of the first sub-display area SDA1. The number of emission units (EA11, EA12, EA13, and EA14) per unit area of the main display area MDA may be less than the number of emission units (EA21, EA22, EA23, and EA24) per unit area of the first sub-display area SDA1.

As shown in the embodiment of FIG. 9, a pair of second pixels PX2 may be disposed adjacent to each other in the Y direction. A first emission unit EA21 of a first second pixel of the pair of second pixels PX2 may be adjacent to a third emission unit EA23 of the second second pixel of the pair of second pixels PX2 in the Y direction. A fourth emission unit EA24 of a first second pixel of the pair of second pixels PX2 may be adjacent to a fourth emission unit EA24 of the second second pixel of the pair of second pixels PX2 in the Y direction.

The first sub-driving electrode STE1 may be disposed to surround at least one of the first, second, third, and fourth emission units EA21, EA22, EA23, and EA24 of each of the second pixels PX2. For example, in one embodiment, the first sub-driving electrode STE1 may be disposed to surround the first and third emission units EA21 and EA23 of each of the second pixels PX2. Also, the first sub-driving electrode STE1 may be disposed to surround the second and fourth emission units EA22 and EA24 of each of the second pixels PX2.

In an embodiment, the first sub-driving electrode STE1 may be disposed between the first and second emission units EA21 and EA22 of each of the second pixels PX2, between the first and fourth emission units EA21 and EA24 of each of the second pixels PX2, between the second and third emission units EA22 and EA23 of each of the second pixels PX2, and between the third and fourth emission units EA23 and EA24 of each of the second pixels PX2. As shown in the embodiment of FIG. 9, the first sub-driving electrode STE1 may not be disposed between the second and fourth emission units EA22 and EA24 of each of the second pixels PX2.

The first sub-driving electrode STE1 may be disposed between the first emission unit EA21 of a first second pixel of a pair of second pixels PX2 and the third emission unit EA23 of the second second pixel of the pair of second pixels PX2. Also, the first sub-driving electrode STE1 may be disposed between the third emission unit EA23 of a first second pixel of the pair of second pixels PX2 and the first emission unit EA21 of the second second pixel of the pair of second pixels PX2. Also, the first sub-driving electrode STE1 may be disposed between the fourth emission units EA24 of the pair of second pixels PX2.

The first sub-driving electrode STE1 may be disposed to surround the edges of each pair of second pixels PX2. A portion of the first sub-driving electrode STE1 that surround two pairs of second pixels PX2 that are adjacent to each other in the X direction may be connected to each other. A portion of the first sub-driving electrode STE1 that surround two pairs of second pixels PX2 that are adjacent to each other in the Y direction may be connected to each other.

The light-transmitting areas TA may be defined by the first sub-driving electrode STE1. The light-transmitting areas TA may include a material capable of transmitting light therethrough. In an embodiment, each of the light-transmitting areas TA may include at least a portion of the substrate SUB, the barrier film BR, the gate insulating film 130, the first interlayer insulating film 141, the second interlayer insulating film 142, the first planarization film 160, the second planarization film 180, the bank 190, the first encapsulation inorganic film TFE1 the encapsulation organic film TFE2, the second encapsulation inorganic film TFE3, the first touch insulating film TINS1, the second touch insulating film TINS2, and the third touch insulating film TINS3. As a result, light incident upon the light-transmitting areas TA may pass through the light-transmitting areas TA.

The first auxiliary electrode TAE1 may be disposed between the first sub-driving electrode STE1 and the driving electrodes TE. The first auxiliary electrode TAE1 may be connected to the first sub-driving electrode TAE1 and the driving electrodes TE.

In an embodiment, the maximum width of the first auxiliary electrode TAE1 may be greater than the maximum widths of the first sub-driving electrode STE1 and the driving electrodes TE. Similarly, the maximum width of the second auxiliary electrode TAE2 may be greater than the maximum widths of the second sub-driving electrode TAE2 and the driving electrodes TE. Similarly, the maximum width of the third and fourth auxiliary electrodes TAE3 and TAE4 may be greater than the maximum widths of the sub-sensing electrodes SRE and the sensing electrodes RE. Due to the addition of the first, second, third, and fourth auxiliary electrodes TAE1, TAE2, TAE3, and TAE4, the mutual capacitances formed between the first and second sub-driving electrodes STE1 and STE2 and the sub-sensing electrodes SRE, in the first sub-display area SDA1, can be strengthened.

As shown in the embodiment of FIG. 10A, the first sub-driving electrode STE1 and the first auxiliary electrode TAE1 may be disposed on the second touch insulating film TINS2 (e.g., directly thereon in the Z direction). The second sub-driving electrode STE2, the sub-sensing electrodes SRE, and the second, third, and fourth auxiliary electrodes TAE2, TAE3, and TAE3 may also be disposed on the second touch insulating film TINS2 (e.g., directly thereon in the Z direction). That is, the first and second sub-driving electrodes STE1 and STE2, the sub-sensing electrodes SRE, the first, second, third, and fourth auxiliary electrodes TAE1, TAE2, TAE3, and TAE4 may be formed in the same layer as, and include the same material as, the driving electrodes TE and the sensing electrodes RE.

A thin-film transistor ST1, a capacitor electrode CAE, a first anode connection electrode ANDE1, a second anode connection electrode ANDE2, and a third anode connection electrode ANDE3 of a second pixel PX2 of FIG. 10A may be substantially the same as their respective counterparts of FIG. 7, and thus, detailed descriptions thereof will be omitted for convenience of explanation. Also, first, second, third, and fourth emission units EA21, EA22, EA23, and EA24 of the second pixel PX2 of FIG. 10A may be substantially the same as their respective counterparts of FIG. 7, and thus, detailed descriptions thereof will be omitted for convenience of explanation.

As illustrated in the embodiments of FIGS. 9 and 10A, as the first auxiliary electrode TAE1 is disposed in extra space in the first sub-display area SDA1 to be connected to the first sub-driving electrode STE1, the mutual capacitances formed between the first and second sub-driving electrodes STE1 and STE2 and the sub-sensing electrodes SRE, in the first sub-display area SDA1, can be strengthened. Accordingly, the touch sensitivity in the first sub-display area SDA1 can be increased.

Figure 10B:
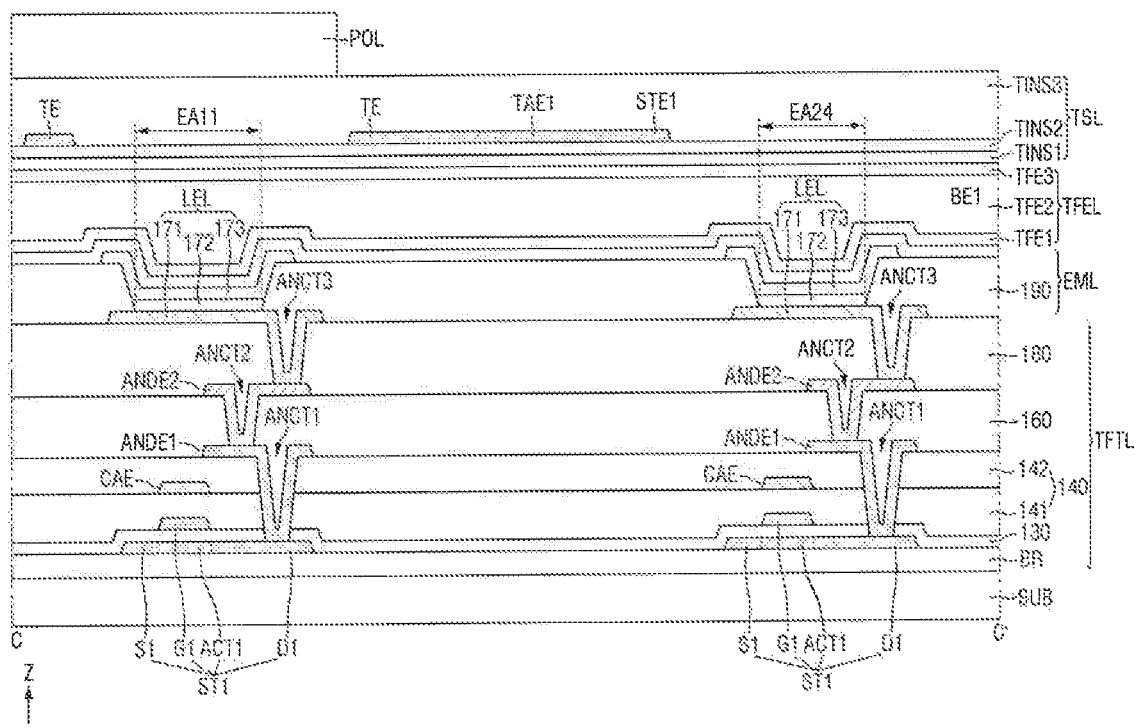
FIG. 10B is a cross-sectional view taken along line C-C' of FIG. 9 according to an embodiment of the present inventive concepts.

FIG. 10B is a cross-sectional view taken along line C-C' of FIG. 9.

The embodiment of FIG. 10B differs from the embodiment of FIG. 10A in that the polarizing film POL is not disposed in the first sub-display area SDA1. The embodiment of FIG. 10B will hereinafter be described, focusing mainly on the differences with the embodiment of FIG. 10A.

Referring to FIG. 10B, the polarizing film POL may not be disposed in the first sub-display area SDA1 to provide more light to an optical device disposed in the first sub-display area SDA1, such as the proximity sensor 740. As a result, the polarizing film POL may not overlap (e.g., in the Z direction) with first, second, third, and fourth emission units EA21, EA22, EA23, and EA24 of a second pixel PX2 in the first sub-display area SDA1. Also, the polarizing film POL may not overlap (e.g., in the Z direction), with the second sub-driving electrode STE2 and the sub-sensing electrodes SRE. Also, the polarizing film POL which may include a polarizing plate, may not overlap (e.g., in the Z direction) with the first, second, third, and fourth auxiliary electrodes TAE1, TAE2, TAE3, and TAE4.

Figure 11A:
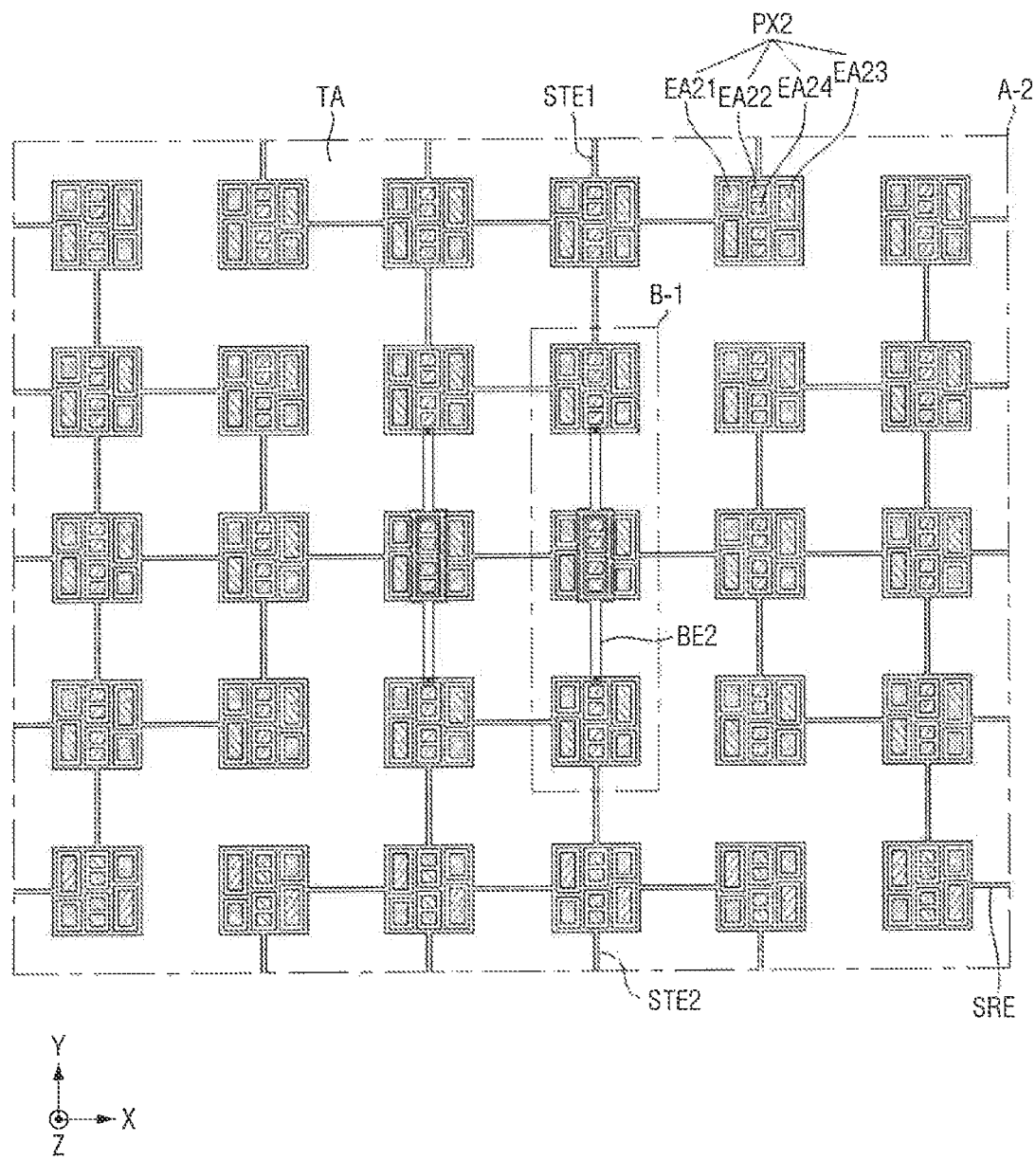
FIG. 11A is a layout view of an area A-2 of FIG. 8 according to an embodiment of the present inventive concepts.
Figure 11B:
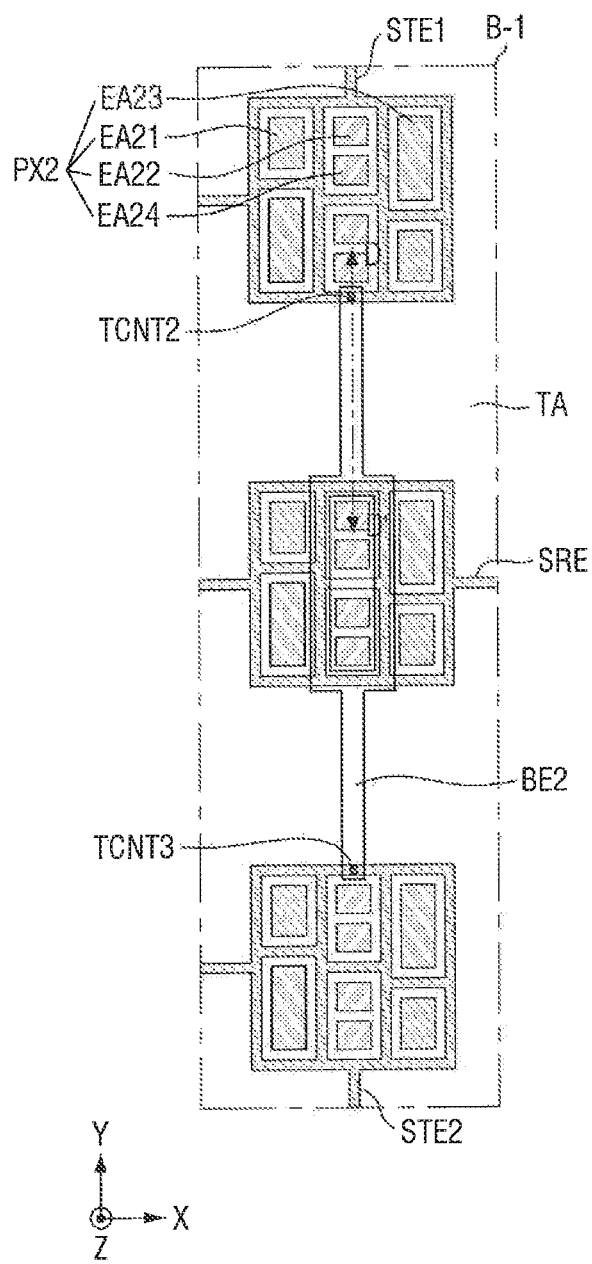
FIG. 11B is a layout view of an area B-1 of FIG. 11A according to an embodiment of the present inventive concepts.
Figure 12:
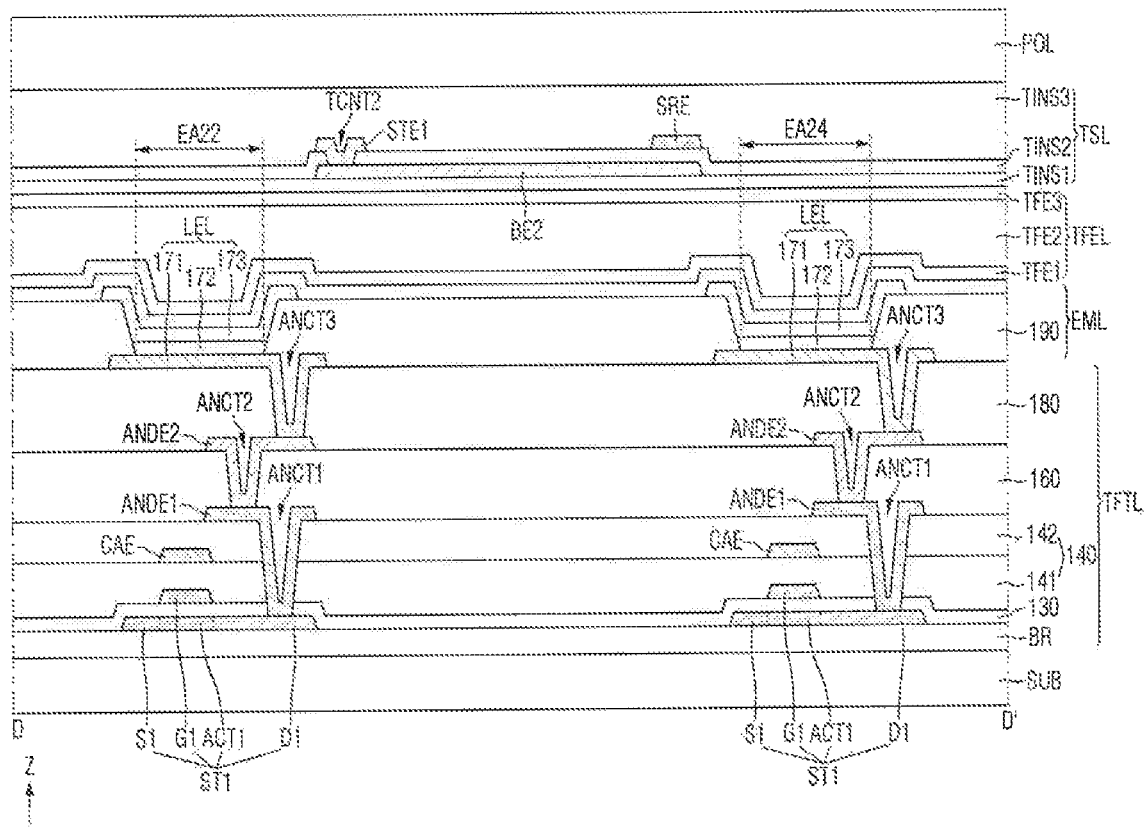
FIG. 12 is a cross-sectional view taken along line D-D' of FIG. 11B according to an embodiment of the present inventive concepts.

FIG. 11A is a layout view of an area A-2 of FIG. 8. FIG. 11B is a layout view of an area B-1 of FIG. 11A. FIG. 12 is a cross-sectional view taken along line D-D' of FIG. 11B.

Referring to the embodiments of FIGS. 11A, 11B, and 12, the first and second sub-driving electrodes STE1 and STE2 may be connected to each other by a plurality of second connection electrodes BE2. Since the first and second sub-driving electrodes STE1 and STE2 are connected to each other by a plurality of second connection electrodes BE2, the first and second sub-driving electrodes STE1 and STE2 can stably remain connected even if one of the second connection electrodes BE2 is disconnected. FIG. 11A illustrates that the first and second sub-driving electrodes STE1 and STE2 are connected to each other by two second connection electrodes BE2. However, embodiments of the present inventive concepts are not limited thereto and the number of second connection electrodes BE2 connected the first and second sub-driving electrodes STE1 and STE2 may vary.

The first sub-driving electrode STE1 may be connected to first sides of the second connection electrodes BE2 through second touch contact holes TCNT2. The second sub-driving electrode STE2 may be connected to second sides of the second connection electrodes BE2 through third touch contact holes TCNT3. The second connection electrodes BE2 may overlap with the sub-sensing electrodes SRE (e.g., in the Z direction).

The first and second sub-driving electrodes STE1 and STE2 and the sub-sensing electrodes SRE may be disposed on the second touch insulating film TINS2 (e.g., directly thereon in the Z direction). That is, the first and second sub-driving electrodes STE1 and STE2 and the sub-sensing electrodes SRE may be disposed in the same layer as, and include the same material as, the driving electrodes TE and the sensing electrodes RE.

The second connection electrodes BE2 may be disposed on the first touch insulating film TINS1 (e.g., directly thereon in the Z direction). That is, the second connection electrodes BE2 may be formed in the same layer as, and include the same material as, the first connection electrodes BE1.

The second touch contact holes TCNT2 may be holes that penetrate the second touch insulating film TINS2 to expose the second connection electrodes BE2. The first sub-driving electrode STE1 may be connected to the second connection electrodes BE2 through the second touch contact holes TCNT2.

The third touch contact holes TCNT3 may be holes that penetrate the second touch insulating film TINS2 to expose the second connection electrodes BE2. The second sub-driving electrode STE2 may be connected to the second connection electrodes BE2 through the third touch contact holes TCNT3.

Due to the presence of the second connection electrodes BE2, the first and second sub-driving electrodes STE1 and STE2 may be electrically isolated from the sub-sensing electrodes SRE. Thus, mutual capacitances may be formed between the first and second sub-driving electrodes STE1 and STE2 and the sub-sensing electrodes SRE.

The number of second pixels PX2 surrounded by the first sub-driving electrode STE1 may decrease from the edge towards the center of the first sub-display area SDA1. Also, the number of second pixels PX2 surrounded by the second sub-driving electrode STE2 may decrease from the edge towards the center of the first sub-display area SDA1. Also, the number of second pixels PX2 surrounded by the sub-sensing electrodes SRE may decrease from the edge towards the center of the first sub-display area SDA1.

Figure 13A:
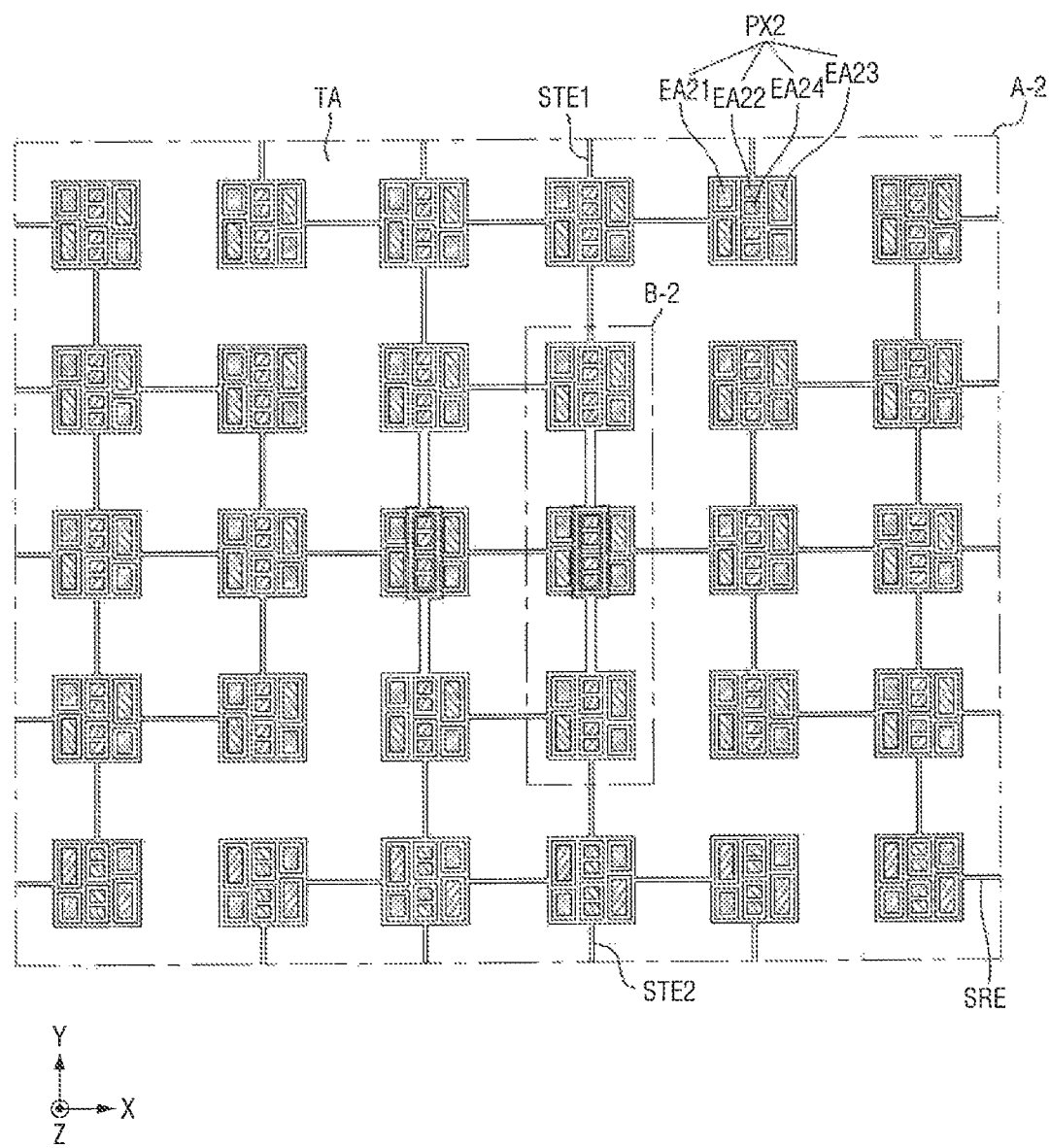
FIG. 13A is a layout view of the area A-2 of FIG. 8 according to an embodiment of the present inventive concepts.
Figure 13B:
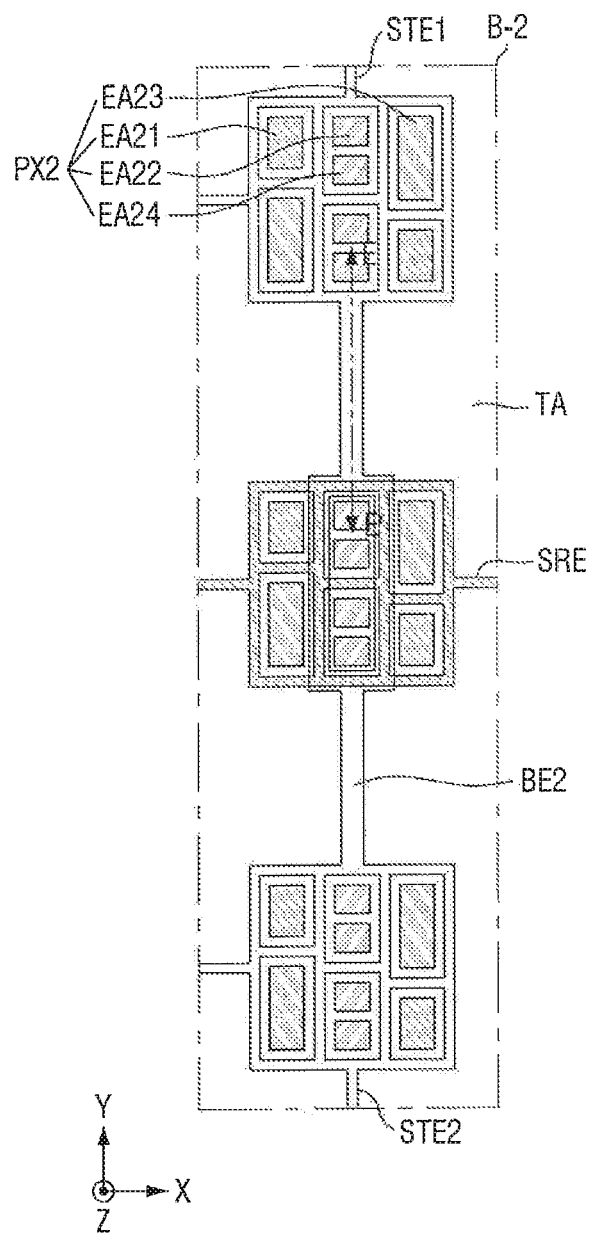
FIG. 13B is a layout view of an area B-2 of FIG. 13A according to an embodiment of the present inventive concepts.
Figure 14:
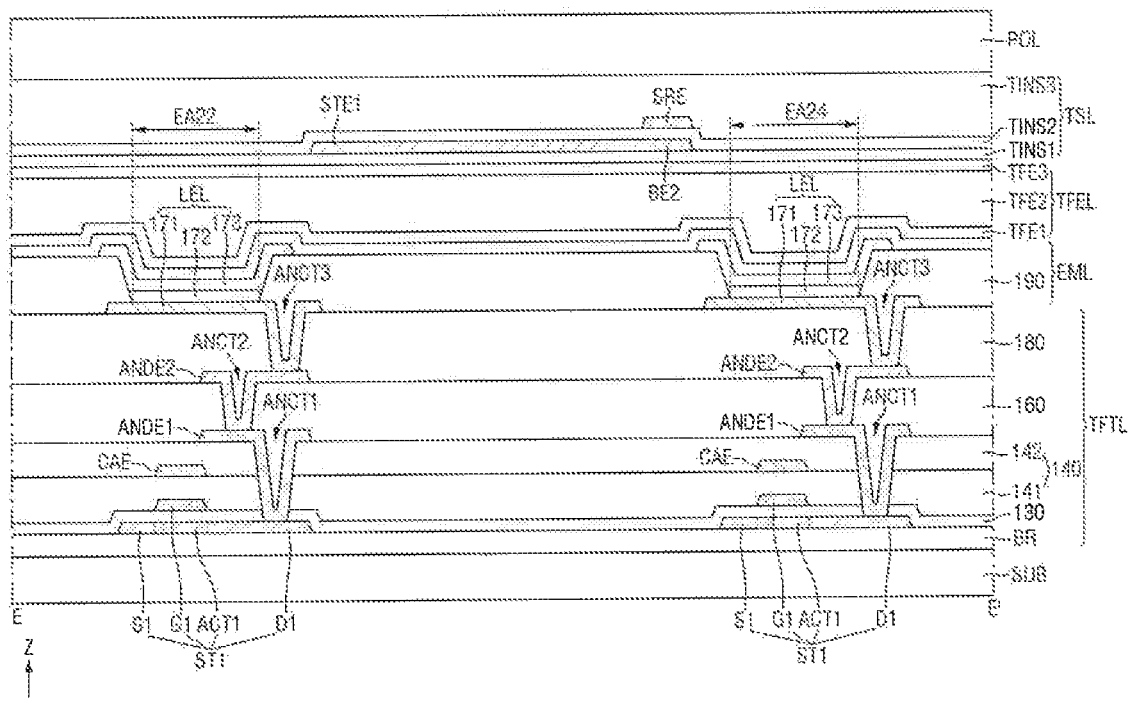
FIG. 14 is a cross-sectional view taken along line E-E' of FIG. 13B according to an embodiment of the present inventive concepts.

FIG. 13A is a layout view of the area A-2 of FIG. 8. FIG. 13B is a layout view of an area B-2 of FIG. 13A. FIG. 14 is a cross-sectional view taken along line E-E' of FIG. 13B.

The embodiments of FIGS. 13A, 13B, and 14 differ from the embodiments of FIGS. 11A, 11B, and 12 in that the first and second sub-driving electrodes STE1 and STE2 and the second connection electrodes BE2 are disposed in the same layer. The embodiments of FIGS. 13A, 13B, and 14 will hereinafter be described, focusing mainly on the differences with the embodiment of FIGS. 11A, 11B, and 12 for convenience of explanation.

Referring to the embodiments of FIGS. 13A, 13B, and 14, the first and second sub-driving electrodes STE1 and STE2 and the second connection electrodes BE2 may be integrally formed. The first and second sub-driving electrodes STE1 and STE2 and the second connection electrodes BE2 may be disposed on the first touch insulating film TINS1 (e.g., directly thereon in the Z direction), and the sub-sensing electrodes SRE may be disposed on the second touch insulating film TINS2 (e.g., directly thereon in the Z direction). That is, the first and second sub-driving electrodes STE1 and STE2 and the second connection electrodes BE2 may be disposed in the same layer as, and include the same material as, the first connection electrodes BE1. Also, the sub-sensing electrodes SRE may be disposed in the same layer as, and include the same material as, the driving electrodes TE and the sensing electrodes RE.

The second connection electrodes BE2 may overlap with the sub-sensing electrodes SRE (e.g., in the Z direction). The first and second sub-driving electrodes STE1 and STE2 and the connection electrodes BE2 may be disposed in a different layer from the sub-sensing electrodes SRE. As a result, the first and second sub-driving electrodes STE1 and STE2 may be electrically isolated from the sub-sensing electrodes SRE. Thus, mutual capacitances may be formed between the first and second sub-driving electrodes STE1 and STE2 and the sub-sensing electrodes SRE.

Figure 15:
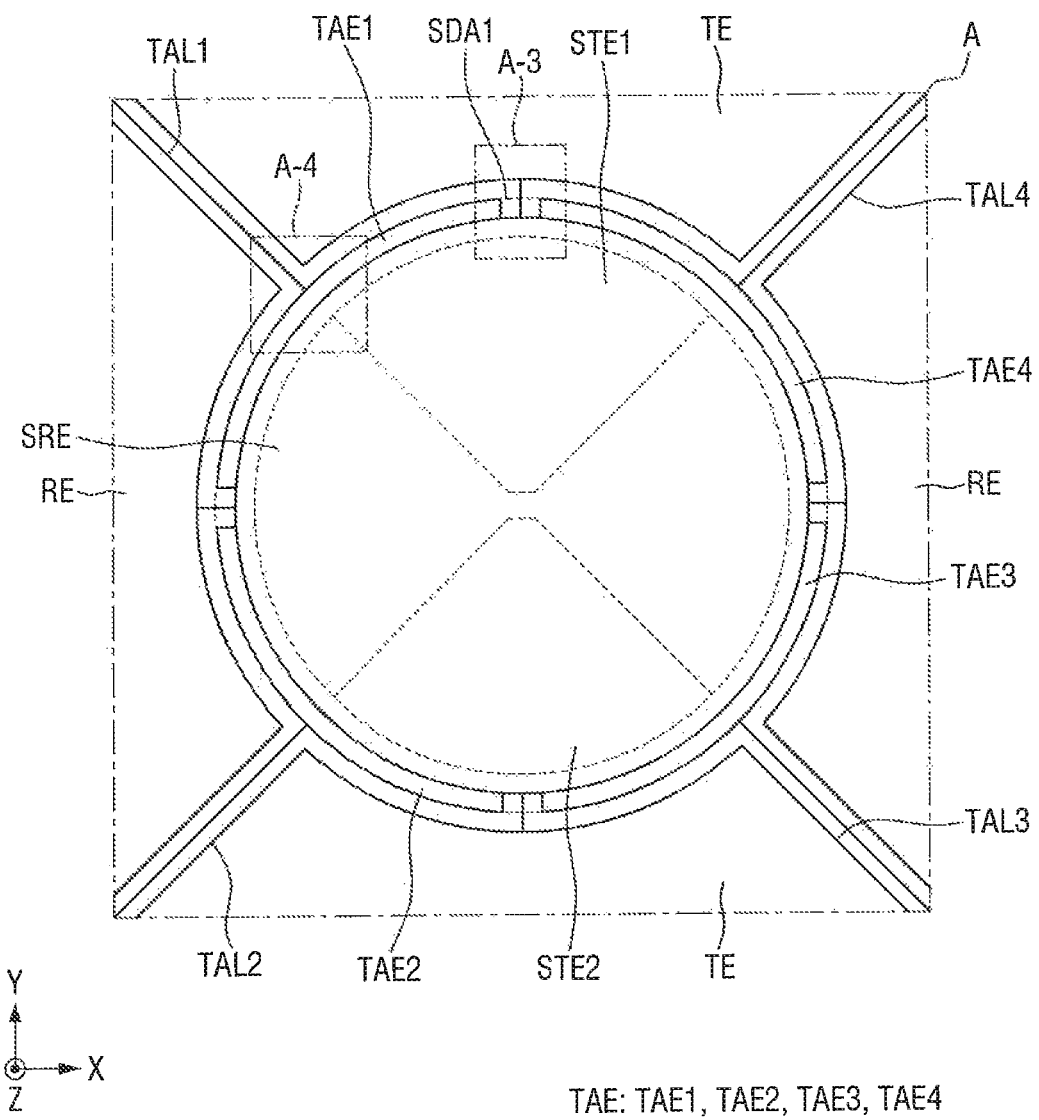
FIG. 15 is a layout view of the area A of FIG. 5 according to an embodiment of the present inventive concepts.

FIG. 15 is a layout view of the area A of FIG. 5.

The embodiment of FIG. 15 differs from the embodiment of FIG. 8 in that the auxiliary electrodes TAE are spaced apart from the driving electrodes TE, the sensing electrodes RE, the first and second sub-driving electrodes STE1 and STE2, and the sub-sensing electrodes SRE. The embodiment of FIG. 15 will hereinafter be described, focusing mainly on the differences with the embodiment of FIG. 8 for convenience of explanation.

Referring to the embodiment of FIG. 15, the first auxiliary electrode TAE1 may be disposed in an upper left portion of the first sub-display area SDA1, and the second auxiliary electrode TAE2 may be disposed in a lower left portion of the first sub-display area SDA1. The third auxiliary electrode TAE3 may be disposed in a lower right portion of the first sub-display area SDA1, and the fourth auxiliary electrode TAE4 may be disposed in an upper right portion of the first sub-display area SDA1.

The first sub-driving electrode STE1 and the sub-sensing electrodes SRE may be disposed on the inside of the first auxiliary electrode TAE1. The driving electrodes TE and the sensing electrodes RE may be disposed on the outside of the first auxiliary electrode TAE1. The first auxiliary electrode TAE1 may be spaced apart from the driving electrodes TE, the sensing electrodes RE, the first sub-driving electrode STE1, and the sub-sensing electrodes SRE. That is, the first auxiliary electrode TAE1 may not be connected to (e.g., may not contact) the driving electrodes TE, the sensing electrodes RE, the first sub-driving electrode STE1, and the sub-sensing electrodes SRE.

Likewise, the second sub-driving electrode STE2 and the sub-sensing electrodes SRE may be disposed on the inside of the second auxiliary electrode TAE2. The driving electrodes TE and the sensing electrodes RE may be disposed on the outside of the second auxiliary electrode TAE2. The second auxiliary electrode TAE2 may be spaced apart from the driving electrodes TE, the sensing electrodes RE, the second sub-driving electrode STE2, and the sub-sensing electrodes SRE. That is, the second auxiliary electrode TAE2 may not be connected to (e.g., may not contact) the driving electrodes TE, the sensing electrodes RE, the second sub-driving electrode STE2, and the sub-sensing electrodes SRE.

The second sub-driving electrode STE2 and the sub-sensing electrodes SRE may be disposed on the inside of the third auxiliary electrode TAE3. The driving electrodes TE and the sensing electrodes RE may be disposed on the outside of the third auxiliary electrode TAE3. The third auxiliary electrode TAE3 may be spaced apart from the driving electrodes TE, the sensing electrodes RE, the second sub-driving electrode STE2, and the sub-sensing electrodes SRE. That is, the third auxiliary electrode TAE3 may not be connected to (e.g., may not contact) the driving electrodes TE, the sensing electrodes RE, the second sub-driving electrode STE2, and the sub-sensing electrodes SRE.

The first sub-driving electrode STE1 and the sub-sensing electrodes SRE may be disposed on the inside of the fourth auxiliary electrode TAE4. The driving electrodes TE and the sensing electrodes RE may be disposed on the outside of the fourth auxiliary electrode TAE4. The fourth auxiliary electrode TAE4 may be spaced apart from the driving electrodes TE, the sensing electrodes RE, the first sub-driving electrode STE1, and the sub-sensing electrodes SRE. That is, the fourth auxiliary electrode TAE4 may not be connected to (e.g., may not contact) the driving electrodes TE, the sensing electrodes RE, the first sub-driving electrode STE1, and the sub-sensing electrodes SRE.

Figure 16:
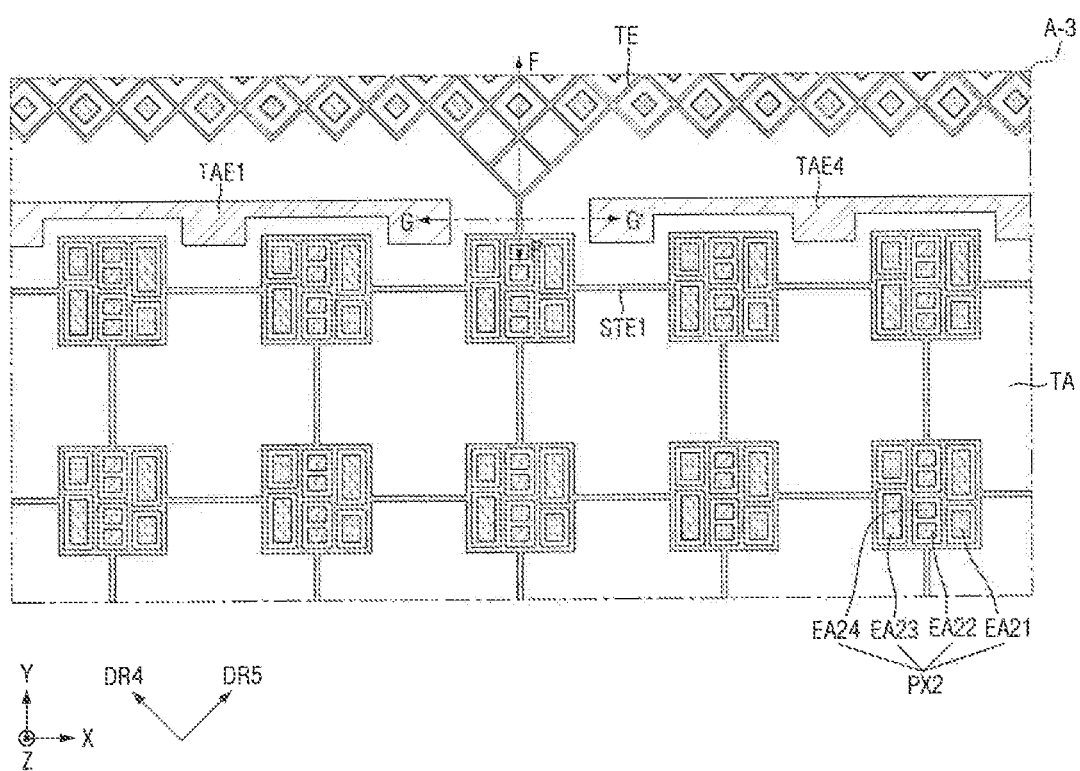
FIG. 16 is a layout view of an area A-3 of FIG. 15 according to an embodiment of the present inventive concepts.

As shown in the embodiment of FIG. 16, a driving electrode TE disposed on the upper side of the first sub-display area SDA1 may be directly connected to the first sub-driving electrode STE1 through a gap formed between the first and fourth auxiliary electrodes TAE1 and TAE4. A driving electrode TE disposed on the lower side of the first sub-display area SDA1 may be directly connected to the second sub-driving electrode STE2 through a gap formed between the second and third auxiliary electrodes TAE2 and TAE3. A sensing electrode RE disposed on the left side of the first sub-display area SDA1 may be directly connected to the sub-sensing electrodes SRE through a gap formed between the first and second auxiliary electrodes TAE1 and TAE2. A sensing electrode RE disposed on the right side of the first sub-display area SDA1 may be directly connected to the sub-sensing electrodes SRE through a gap formed between the third and fourth auxiliary electrodes TAE3 and TAE4. Thus, mutual capacitances may be formed between the first and second sub-driving electrodes STE1 and STE2 and the sub-sensing electrodes RE, in the first sub-display area SDA1.

The first auxiliary electrode TAE1 may be connected to a first auxiliary line TAL1 between the driving electrode TE disposed on the upper side of the first sub-display area SDA1 (e.g., in the Y direction) and the sensing electrode RE disposed on the left side of the first sub-display area SDA1 (e.g., in the X direction). Accordingly, the first auxiliary electrode TAE1 may be driven in a self-capacitance manner that applies a touch driving signal via the first auxiliary line TAL1 and detects a charge variation in the self-capacitance formed by the first auxiliary electrode TAE1.

The second auxiliary electrode TAE2 may be connected to a second auxiliary line TAL2 between the driving electrode TE disposed on the lower side of the first sub-display area SDA1 (e.g., in the Y direction) and the sensing electrode RE disposed on the left side of the first sub-display area SDA1 (e.g., in the X direction). Accordingly, the second auxiliary electrode TAE2 may be driven in a self-capacitance manner that applies a touch driving signal via the second auxiliary line TAL2 and detects a charge variation in the self-capacitance formed by the second auxiliary electrode TAE2.

The third auxiliary electrode TAE3 may be connected to a third auxiliary line TAL3 between the driving electrode TE disposed on the lower side of the first sub-display area SDA1 (e.g., in the Y direction) and the sensing electrode RE disposed on the right side of the first sub-display area SDA1 (e.g., in the X direction). Accordingly, the third auxiliary electrode TAE3 may be driven in a self-capacitance manner that applies a touch driving signal via the third auxiliary line TAL3 and detects a charge variation in the self-capacitance formed by the third auxiliary electrode TAE3.

The fourth auxiliary electrode TAE4 may be connected to a fourth auxiliary line TAL4 between the driving electrode TE disposed on the upper side of the first sub-display area SDA1 (e.g., in the Y direction) and the sensing electrode RE disposed on the right side of the first sub-display area SDA1 (e.g., in the X direction). Accordingly, the fourth auxiliary electrode TAE4 may be driven in a self-capacitance manner that applies a touch driving signal via the fourth auxiliary line TAL4 and detects a charge variation in the self-capacitance formed by the fourth auxiliary electrode TAE4.

As illustrated in the embodiment of FIG. 15, the first, second, third, and fourth auxiliary electrodes TAE1, TAE2, TAE3, and TAE4 may serve as separate touch electrodes from the driving electrodes TE, the sensing electrodes RE, the first and second sub-driving electrodes STE1 and STE2, and the sub-sensing electrodes SRE. Thus, touch input can be detected in the first sub-display area SDA1 not only through the mutual capacitances formed between the first and second sub-driving electrodes STE1 and STE2 and the sub-sensing electrodes SRE, in the first sub-display area SDA1, but also through the self-capacitances formed between the first, second, third, and fourth auxiliary electrodes TAE1, TAE2, TAE3, and TAE4. Accordingly, the touch sensitivity in the first sub-display area SDA1 can be increased.

The second, third, and fourth sub-display areas SDA2, SDA3, and SDA4 of FIGS. 2 and 3 may be substantially the same as the first sub-display area SDA1 of FIG. 15, and thus, detailed descriptions thereof will be omitted for convenience of explanation.

Figure 17:
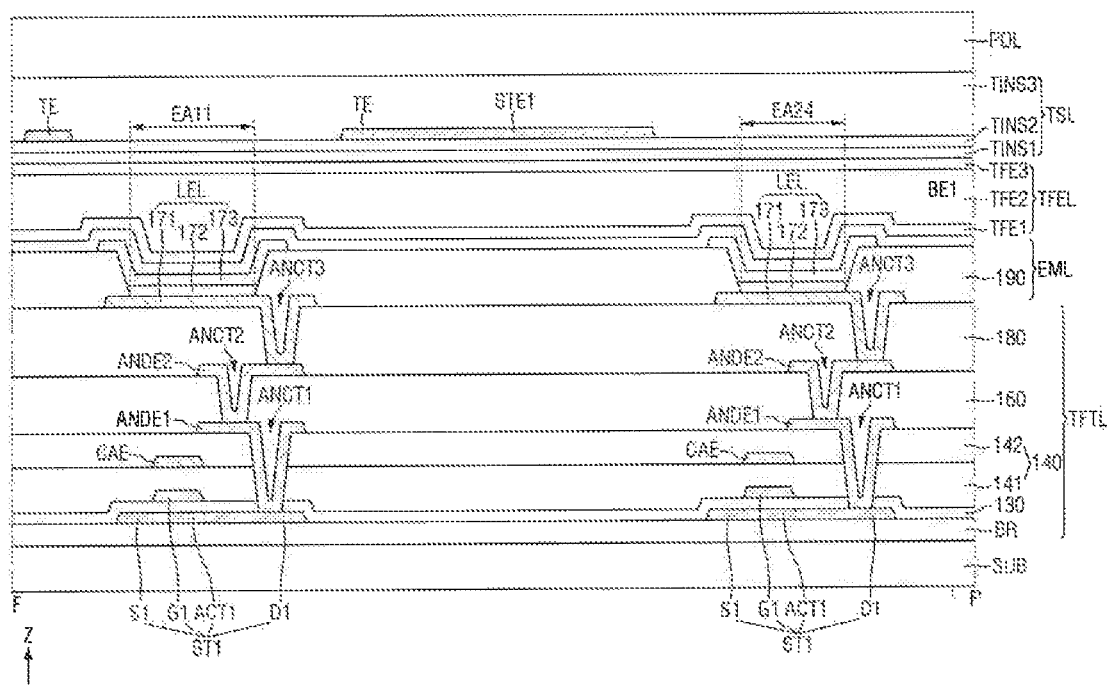
FIG. 17 is a cross-sectional view taken along line F-F' of FIG. 16 according to an embodiment of the present inventive concepts.
Figure 18:
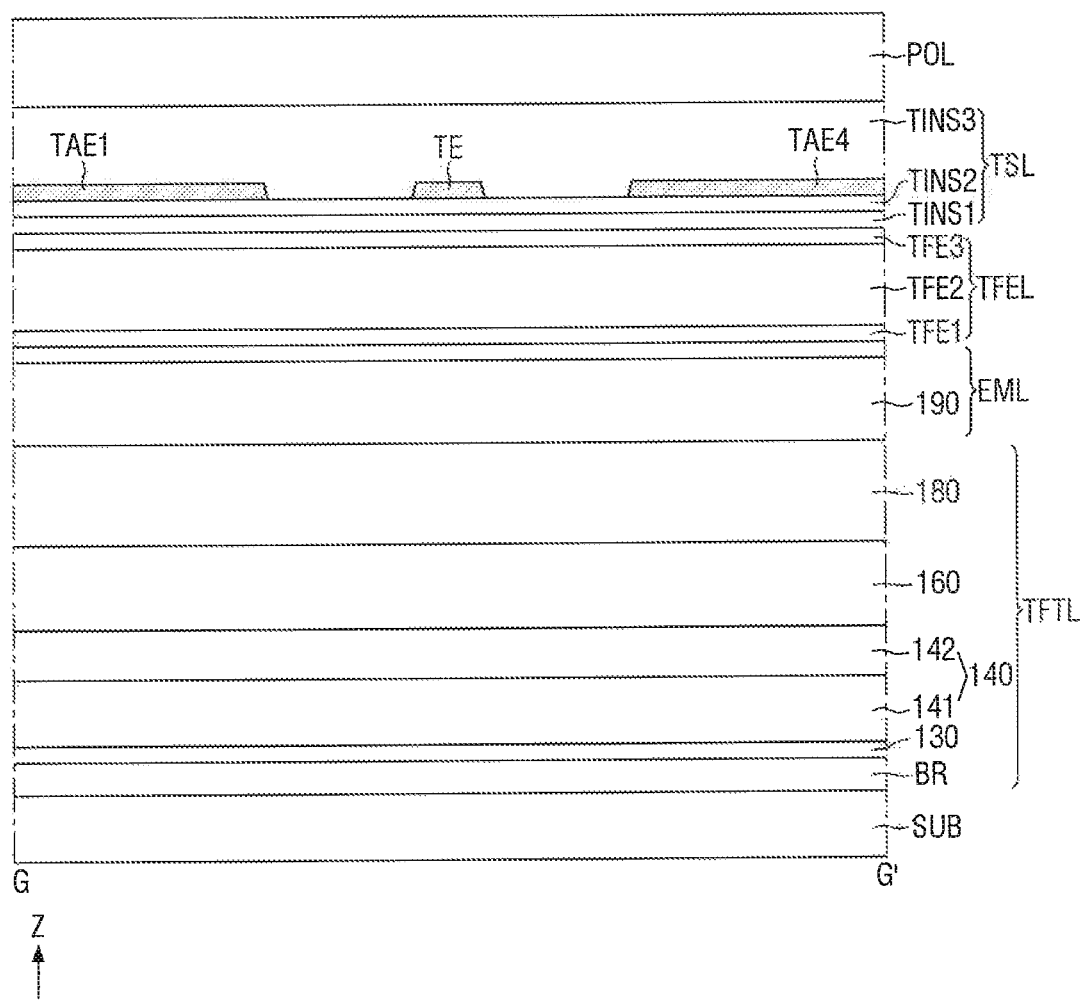
FIG. 18 is a cross-sectional view taken along line G-G' of FIG. 16 according to an embodiment of the present inventive concepts.
Figure 19:
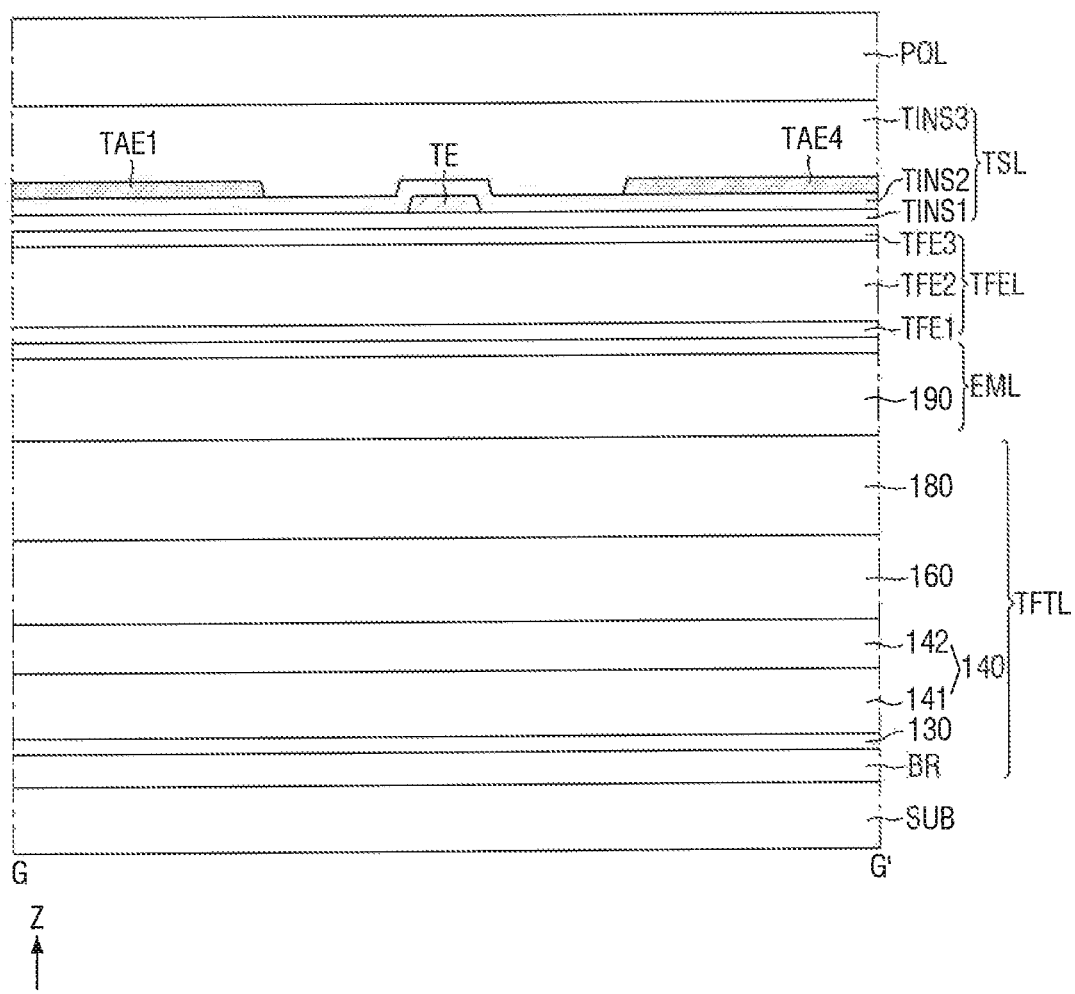
FIG. 19 is a cross-sectional view taken along line G-G' of FIG. 16 according to an embodiment of the present inventive concepts.

FIG. 16 is a layout view of an area A-3 of FIG. 15. FIG. 17 is a cross-sectional view taken along line F-F' of FIG. 16. FIG. 18 is a cross-sectional view taken along line G-G' of FIG. 16. FIG. 19 is a cross-sectional view taken along line G-G' of FIG. 16.

Referring to the embodiments of FIGS. 16 through 19, the first and fourth auxiliary electrodes TAE1 and TAE4 may be disposed between the first sub-driving electrodes STE1 and the driving electrodes TE. The first and fourth auxiliary electrodes TAE1 and TAE4 may not be connected to the first sub-driving electrodes STE1 and the driving electrodes TE. The first and fourth auxiliary electrodes TAE1 and TAE4 may be spaced apart from each other.

As the first and fourth auxiliary electrodes TAE1 and TAE4 are spaced apart from each other, a gap may be formed between the first and fourth auxiliary electrodes TAE1 and TAE4. Thus, the driving electrodes TE may be disposed between the first and fourth auxiliary electrodes TAE1 and TAE4. Accordingly, the driving electrodes TE may extend between the first and fourth auxiliary electrodes TAE1 and TAE4 (e.g., in the Y direction) to be directly connected to the first sub-driving electrode STE1.

As illustrated in the embodiment of FIG. 17, the first sub-driving electrode STE1 may be disposed on the second touch insulating film TINS2 (e.g., directly thereon in the Z direction). Also, the second sub-driving electrode STE2 and the sub-sensing electrodes SRE may be disposed on the second touch insulating film TINS2 (e.g., directly thereon in the Z direction). That is, the first and second sub-driving electrodes STE1 and STE2 and the sub-sensing electrodes SRE may be disposed in the same layer as, and include the same material as, the driving electrodes TE and the sensing electrodes RE.

As illustrated in the embodiment of FIG. 18, the first and fourth auxiliary electrodes TAE1 and TAE4 may be disposed on the second touch insulating film TINS2 (e.g., directly thereon in the Z direction). Also, the second and third auxiliary electrodes TAE2 and TAE3 may be disposed on the second touch insulating film TINS2 (e.g., directly thereon in the Z direction). That is, the first, second, third, and fourth auxiliary electrodes TAE1, TAE2, TAE3, and TAE4 may be disposed in the same layer as, and include the same material as, the driving electrodes TE and the sensing electrodes RE.

However, embodiments of the present inventive concepts are not limited thereto. For example, as illustrated in the embodiment of FIG. 19, the first and fourth auxiliary electrodes TAE1 and TAE4 may be disposed on the second touch insulating film TINS2 (e.g., directly thereon in the Z direction). Also, the second and third auxiliary electrodes TAE2 and TAE3 may be disposed on the second touch insulating film TINS2 (e.g., directly thereon in the Z direction). The driving electrodes TE may be disposed on the first touch insulating film TINS1 (e.g., directly thereon in the Z direction). The sensing electrodes RE may also be disposed on the first touch insulating film TINS1 (e.g., directly thereon in the Z direction). That is, the first, second, third, and fourth auxiliary electrodes TAE1, TAE2, TAE3, and TAE4 may be disposed in the same layer as, and include the same material as, the first connection electrodes BE1 and the second connection electrodes BE2.

Figure 20:
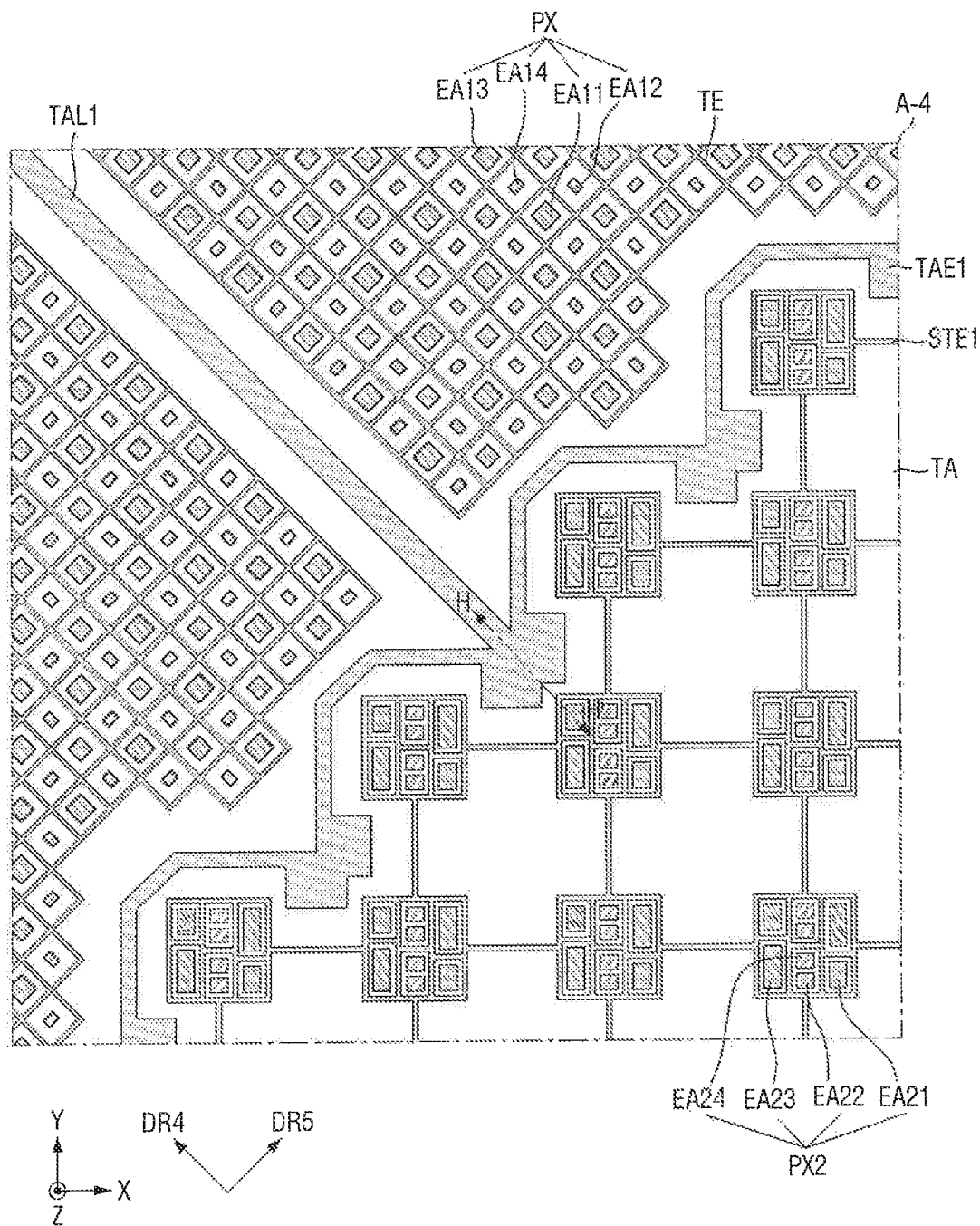
FIG. 20 is a layout view of an area A-4 of FIG. 15 according to an embodiment of the present inventive concepts.
Figure 21:
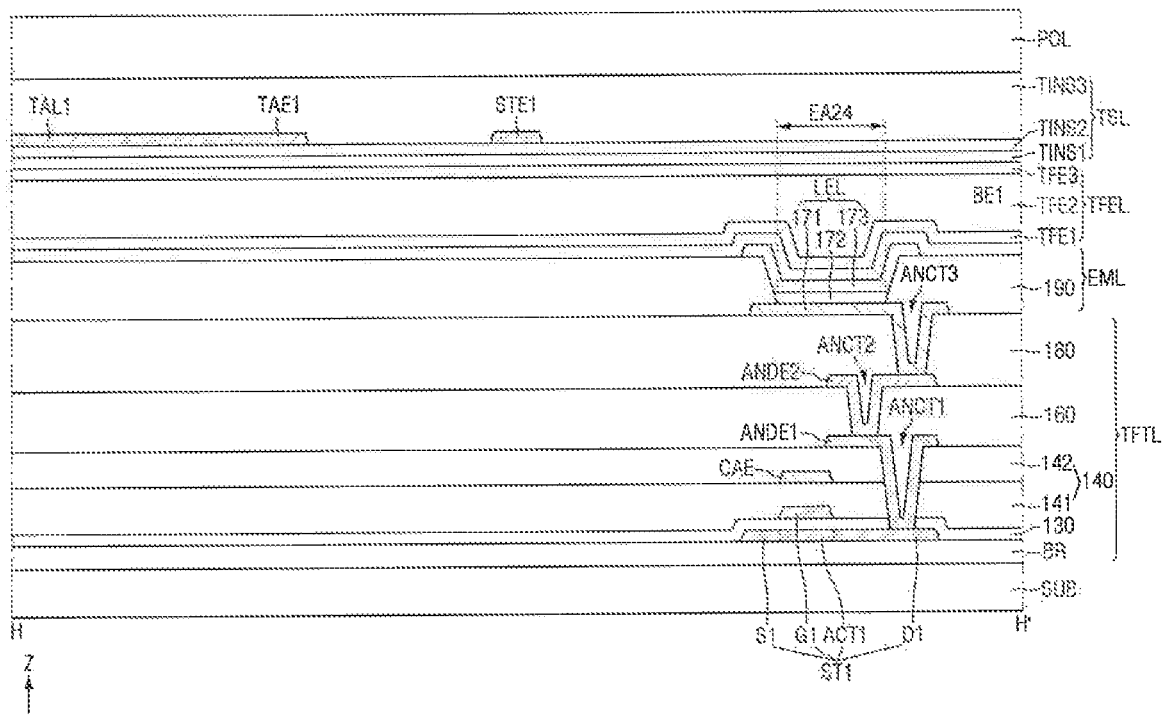
FIG. 21 is a cross-sectional view taken along line H-H' of FIG. 17 according to an embodiment of the present inventive concepts.
Figure 22:
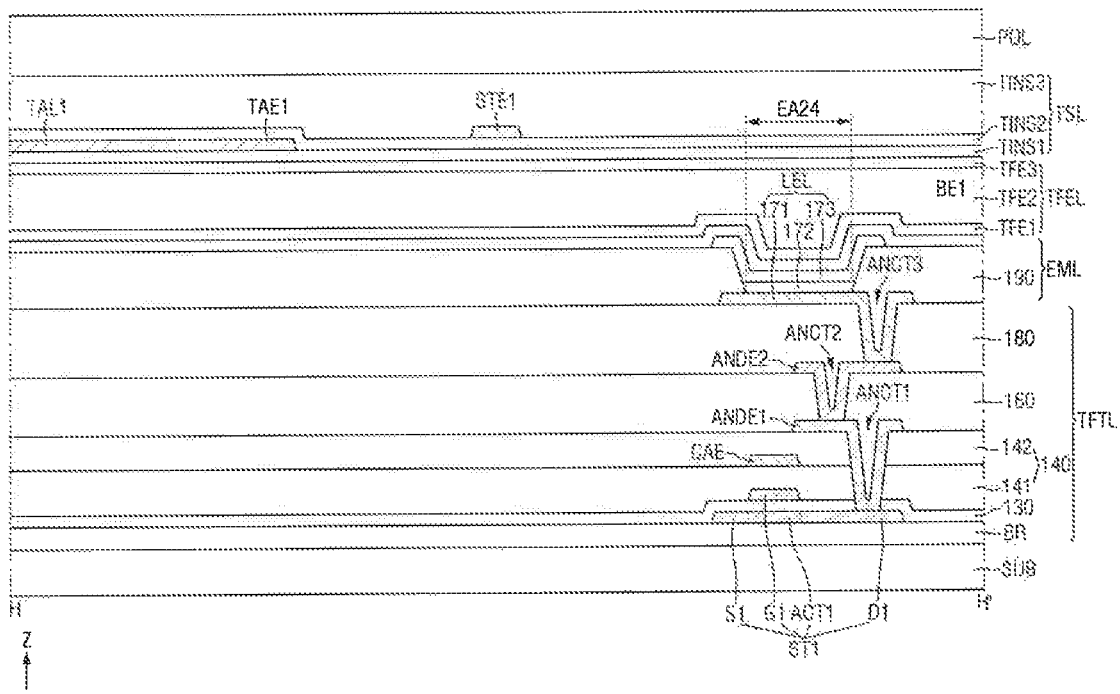
FIG. 22 is a cross-sectional view taken along line H-H' of FIG. 17 according to an embodiment of the present inventive concepts.

FIG. 20 is a layout view of an area A-4 of FIG. 15. FIG. 21 is a cross-sectional view taken along line H-H' of FIG. 17. FIG. 22 is a cross-sectional view taken along line H-H' of FIG. 17.

Referring to the embodiments of FIGS. 20 through 22, the first auxiliary line TAL1, which is connected to the first auxiliary electrode TAE1, may be disposed between the driving electrodes TE and the sensing electrodes RE. The first auxiliary line TAL1 may be spaced apart from the driving electrodes TE and the sensing electrodes RE. The first auxiliary line TAL1 may be electrically isolated from the driving electrodes TE and the sensing electrodes RE.

As illustrated in the embodiment of FIG. 21, the first auxiliary electrode TAE1 and the first auxiliary line TAL1 may be disposed on the second touch insulating film TINS2 (e.g., directly thereon in the Z direction). Also, the second auxiliary electrode TAE2, the second auxiliary line TAL2, the third auxiliary electrode TAE3, the third auxiliary line TAL3, the fourth auxiliary electrode TAE4, and the fourth auxiliary line TAL4 may be disposed on the second touch insulating film TINS2 (e.g., directly thereon in the Z direction). That is, the first auxiliary electrode TAE1, the first auxiliary line TAL1, the second auxiliary electrode TAE2, the second auxiliary line TAL2, the third auxiliary electrode TAE3, the third auxiliary line TAL3, the fourth auxiliary electrode TAE4, and the fourth auxiliary line TAL4 may be disposed in the same layer as, and include the same material as, the driving electrodes TE and the sensing electrodes RE.

However, embodiments of the present inventive concepts are not limited thereto. For example, as illustrated in FIG. 22, the first and fourth auxiliary electrodes TAE1 and TAE4 may be disposed on the first touch insulating film TINS1 (e.g., directly thereon in the Z direction). Also, the second and third auxiliary electrodes TAE2 and TAD may be disposed on the first touch insulating film TINS1 (e.g., directly thereon in the Z direction). That is, the first, second, third, and fourth auxiliary electrodes TAE1, TAE2, TAE3, and TAE4 may be disposed in the same layer as, and include the same material as, the first connection electrodes BE1 and the second connection electrodes BE2.

Figure 23:
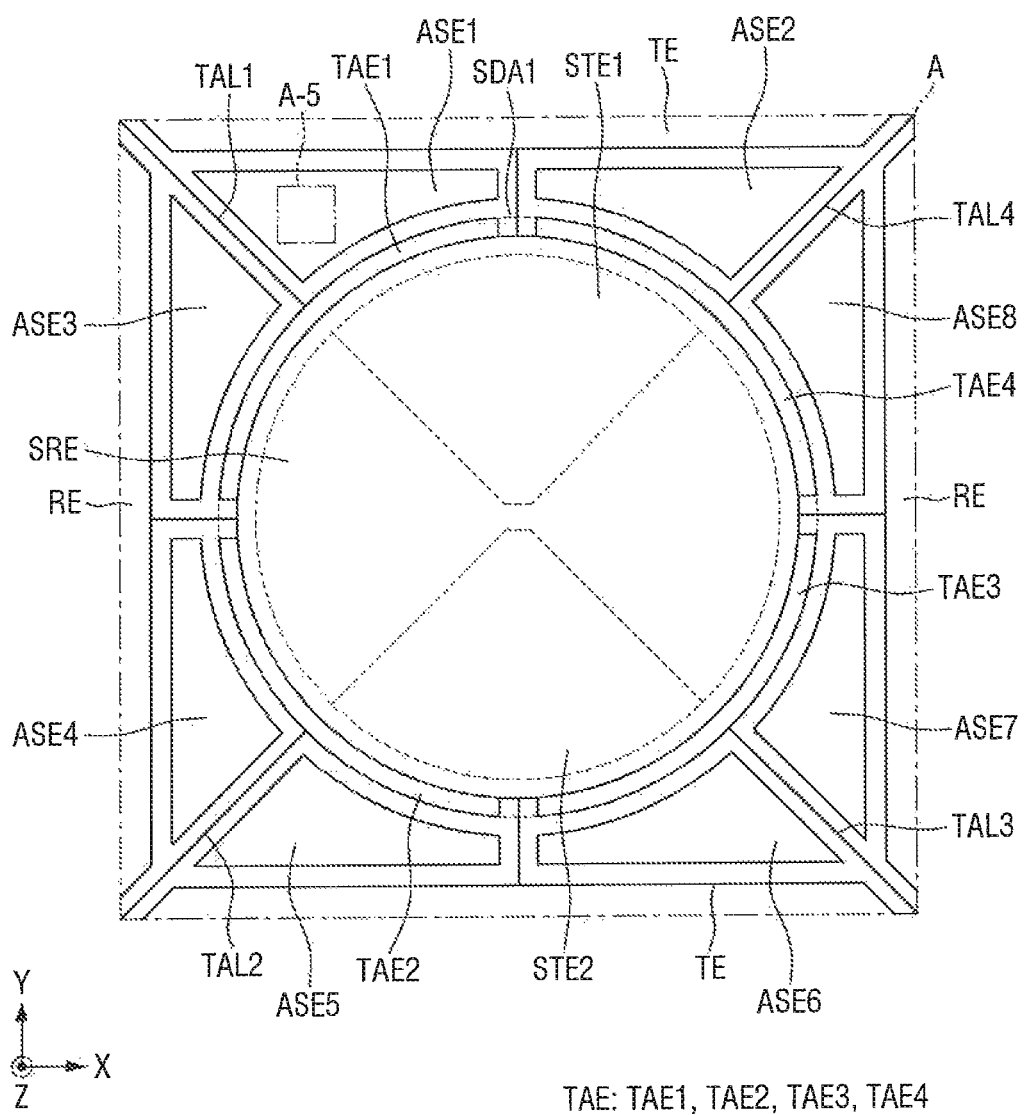
FIG. 23 is a layout view of the area A of FIG. 5 according to an embodiment of the present inventive concepts.

FIG. 23 is a layout view of the area A of FIG. 5.

The embodiment of FIG. 23 differs from the embodiment of FIG. 15 in that auxiliary touch electrodes ASE are disposed on the outside of the first sub-display area SDA1. The embodiment of FIG. 23 will hereinafter be described, focusing mainly on the differences with the embodiment of FIG. 15 for convenience of explanation.

Referring to the embodiment of FIG. 23, the auxiliary touch electrodes ASE may include first, second, third, fourth, fifth, sixth, seventh, and eighth auxiliary touch electrodes ASE1, ASE2, ASE3, ASE4, ASE5, ASE6, ASE7, and ASE8.

The first auxiliary touch electrode ASE1 may be disposed between the first auxiliary electrode TAE1 and the driving electrode TE disposed on the upper side of the first sub-display area SDA1 (e.g., in the Y direction). The first auxiliary touch electrode ASE1 may be spaced apart from (e.g., is not connected to) the first auxiliary electrode TAE1 and the driving electrode TE disposed on the upper side of the first sub-display area SDA1. The first auxiliary touch electrode ASE1 may be electrically isolated from the first auxiliary electrode TAE1 and the driving electrode TE disposed on the upper side of the first sub-display area SDA1.

The second auxiliary touch electrode ASE2 may be disposed between the fourth auxiliary electrode TAE4 and the driving electrode TE disposed on the upper side of the first sub-display area SDA1 (e.g., in the Y direction). The second auxiliary touch electrode ASE2 may be spaced apart from (e.g., is not connected to) the fourth auxiliary electrode TAE4 and the driving electrode IF disposed on the upper side of the first sub-display area SDA1. The second auxiliary touch electrode ASE2 may be electrically isolated from the fourth auxiliary electrode TAE4 and the driving electrode TE disposed on the upper side of the first sub-display area SDA1.

The third auxiliary touch electrode ASE3 may be disposed between the first auxiliary electrode TAE1 and the sensing electrode RE disposed on the left side of the first sub-display area SDA1 (e.g., in the X direction). The third auxiliary touch electrode ASE3 may be spaced apart from (e.g., is not connected to) the first auxiliary electrode TAE1 and the sensing electrode RE disposed on the left side of the first sub-display area SDA1. The third auxiliary touch electrode ASE3 may be electrically isolated from the first auxiliary electrode TAE1 and the sensing electrode RE disposed on the left side of the first sub-display area SDA1.

The fourth auxiliary touch electrode ASE4 may be disposed between the second auxiliary electrode TAE2 and the sensing electrode RE disposed on the left side of the first sub-display area SDA1 (e.g., in the X direction). The fourth auxiliary touch electrode ASE4 may be spaced apart from (e.g., is not connected to) the second auxiliary electrode TAE2 and the sensing electrode RE disposed on the left side of the first sub-display area SDA1. The fourth auxiliary touch electrode ASE4 may be electrically isolated from the second auxiliary electrode TAE2 and the sensing electrode RE disposed on the left side of the first sub-display area SDA1.

The fifth auxiliary touch electrode ASE5 may be disposed between the second auxiliary electrode TAE2 and the driving electrode TE disposed on the lower side of the first sub-display area SDA1 (e.g., in the Y direction). The fifth auxiliary touch electrode ASE5 may be spaced apart from (e.g., is not connected to) the second auxiliary electrode TAE2 and the driving electrode TE disposed on the lower side of the first sub-display area SDA1. The fifth auxiliary touch electrode ASE5 may be electrically isolated from the second auxiliary electrode TAE2 and the driving electrode TE disposed on the lower side of the first sub-display area SDA1.

The sixth auxiliary touch electrode ASE6 may be disposed between the third auxiliary electrode TAE3 and the driving electrode TE disposed on the lower side of the first sub-display area Saki (e.g., in the Y direction). The sixth auxiliary touch electrode ASE6 may be spaced apart from (e.g., is not connected to) the third auxiliary electrode TAE3 and the driving electrode TE disposed on the lower side of the first sub-display area SDA1. The sixth auxiliary touch electrode ASE6 may be electrically isolated from the third auxiliary electrode TAE3 and the driving electrode TE disposed on the lower side of the first sub-display area SDA1.

The seventh auxiliary touch electrode ASE7 may be disposed between the third auxiliary electrode TAE3 and the sensing electrode RE disposed on the right side of the first sub-display area SDA1 (e.g., in the X direction). The seventh auxiliary touch electrode ASE7 may be spaced apart from (e.g., is not connected to) the third auxiliary electrode TAE3 and the sensing electrode RE disposed on the right side of the first sub-display area SDA1. The seventh auxiliary touch electrode ASE7 may be electrically isolated from the third auxiliary electrode TAE3 and the sensing electrode RE disposed on the right side of the first sub-display area SDA1.

The eighth auxiliary touch electrode ASE8 may be disposed between the fourth auxiliary electrode TAE4 and the sensing electrode RE disposed on the right side of the first sub-display area SDA1 (e.g., in the X direction). The eighth auxiliary touch electrode ASE8 may be spaced apart from (e.g., is not connected to) the fourth auxiliary electrode TAE4 and the sensing electrode RE disposed on the right side of the first sub-display area SDA1. The eighth auxiliary touch electrode ASE8 may be electrically isolated from the fourth auxiliary electrode TAE4 and the sensing electrode RE disposed on the right side of the first sub-display area SDA1.

As illustrated in the embodiment of FIG. 23, the first, second, third, fourth, fifth, sixth, seventh, and eighth auxiliary touch electrodes AES1, AES2, AES3, AES4, AES5, AES6, AES7, and AES8 can detect touch input through capacitances formed by auxiliary driving electrodes ATE and auxiliary sensing electrodes ARE that will be described later with reference to the embodiments of FIGS. 24 through 27. Accordingly, the touch sensitivity in the first sub-display area SDA1 can be increased.

The second, third, and fourth sub-display areas SDA2, SDA3, and SDA4 of FIGS. 2 and 3 may be substantially the same as the first sub-display area SDA1 of FIG. 23, and thus, detailed descriptions thereof will be omitted for convenience of description.

Figure 24:
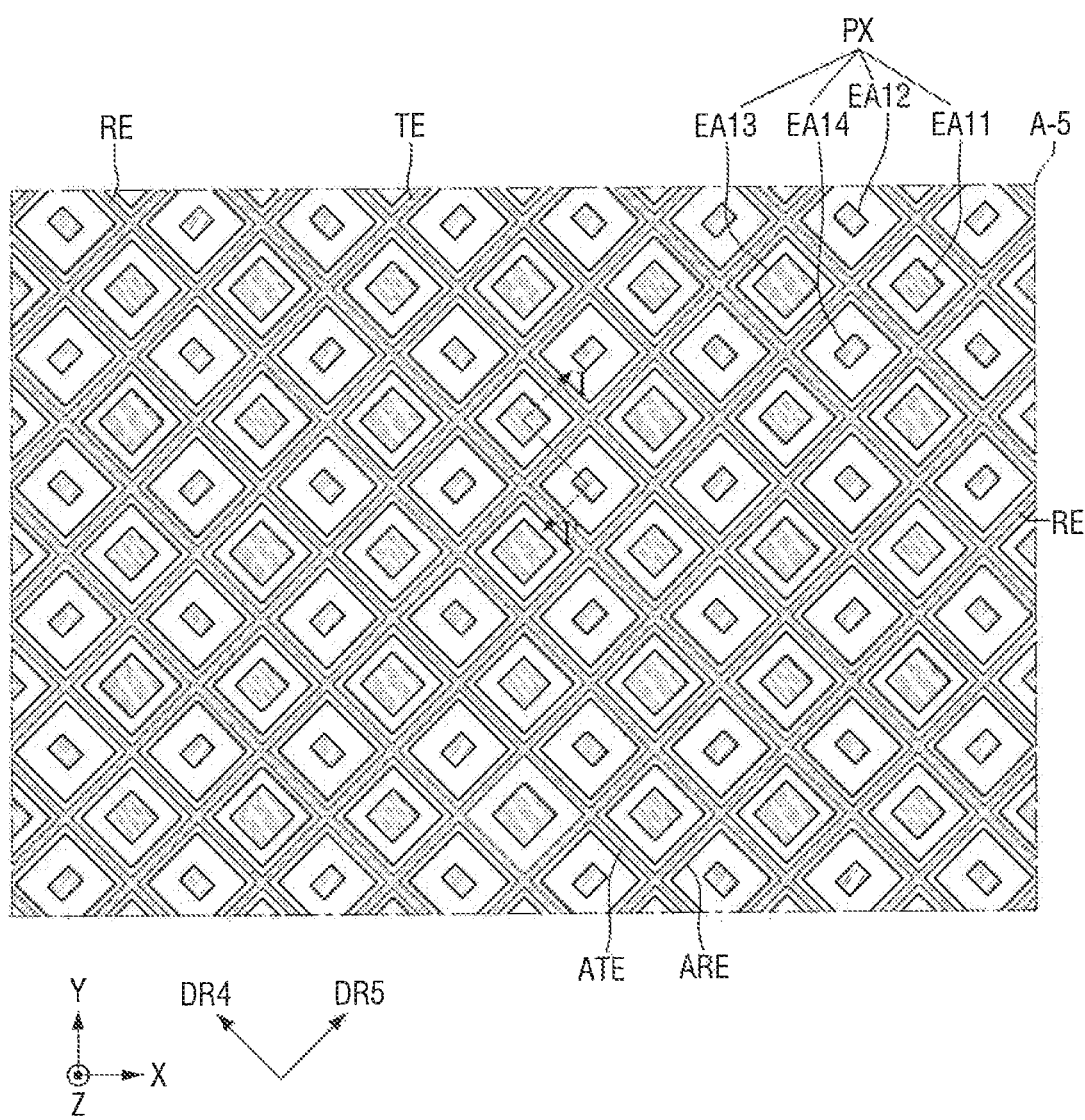
FIG. 24 is a layout view of an area A-5 of FIG. 23 according to an embodiment of the present inventive concepts.
Figure 25:
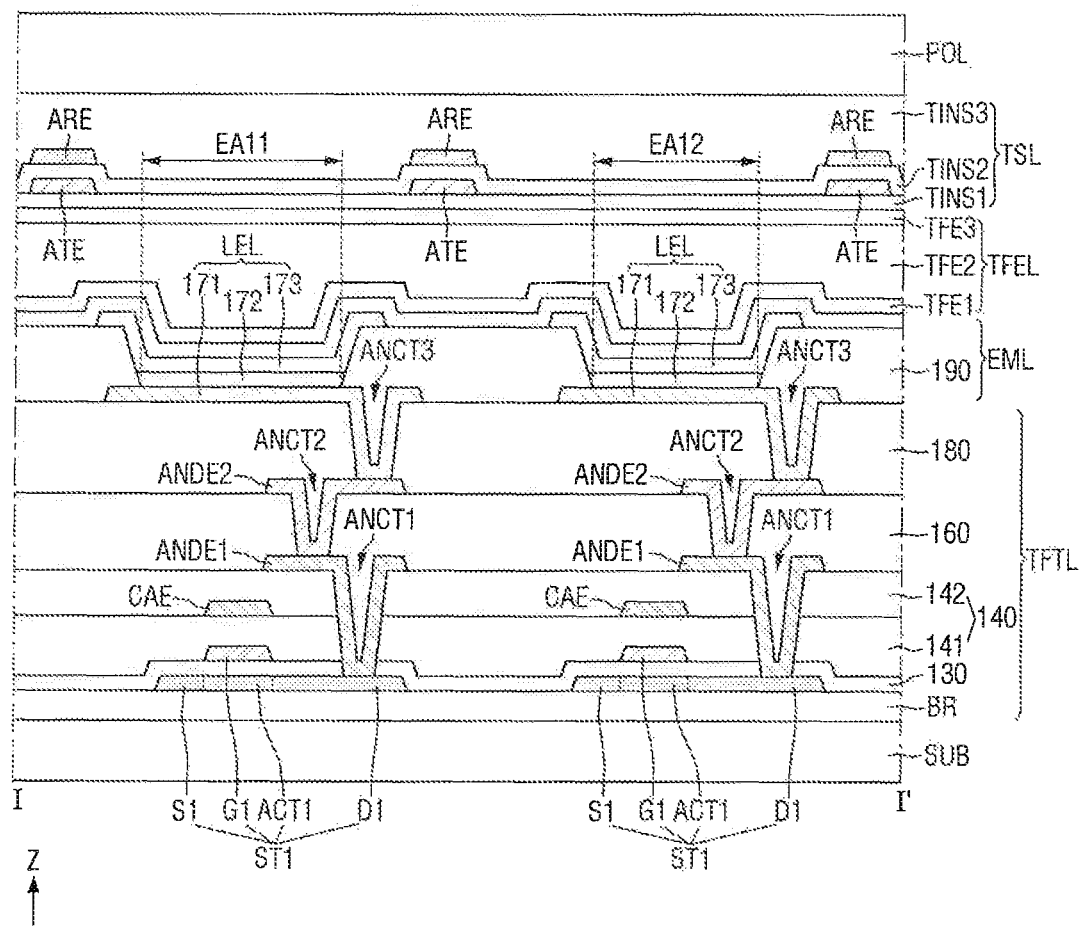
FIG. 25 is a cross-sectional view taken along line I-I' of FIG. 24 according to an embodiment of the present inventive concepts.

FIG. 24 is a layout view of an area A-5 of FIG. 23. FIG. 25 is a cross-sectional view taken along line I-I' of FIG. 24.

Referring to the embodiments of FIGS. 24 and 25, the first auxiliary touch electrode ASE1 may include auxiliary driving electrodes ATE and auxiliary sensing electrodes ARE. The auxiliary driving electrodes ATE may completely overlap with the auxiliary sensing electrodes ARE (e.g., in the Z direction). As a result, mutual capacitances may be formed between the auxiliary driving electrodes ATE and the auxiliary sensing electrodes ARE.

In an embodiment, the auxiliary driving electrodes ATE and the auxiliary sensing electrodes ARE may have a mesh or fishnet structure in a plan view (e.g., in a plane defined in the X and Y directions). Thus, the auxiliary driving electrodes ATE and the auxiliary sensing electrodes ARE may not overlap with the emission units (EA1, EA2, EA3, and EA4) of each of the first pixels PX1. Accordingly, the brightness of light emitted from the emission units (EA11, EA12, EA13, and EA14) can be prevented from decreasing due to being blocked by the auxiliary driving electrodes ATE and the auxiliary sensing electrodes ARE.

As illustrated in the embodiment of FIG. 25, the auxiliary driving electrodes ATE may be disposed on the first touch insulating film TINS1 (e.g., directly thereon in the Z direction). That is, the auxiliary driving electrodes ATE may be disposed in the same layer as, and include the same material as, the first connection electrodes BE1 and the second connection electrodes BE2.

The auxiliary sensing electrodes ARE may be disposed on the second touch insulating film 2 (e.g., directly thereon in the Z direction). That is, the auxiliary sensing electrodes ARE may be disposed in the same layer as, and include the same material as, the driving electrodes TE and the sensing electrodes RE.

Figure 26:
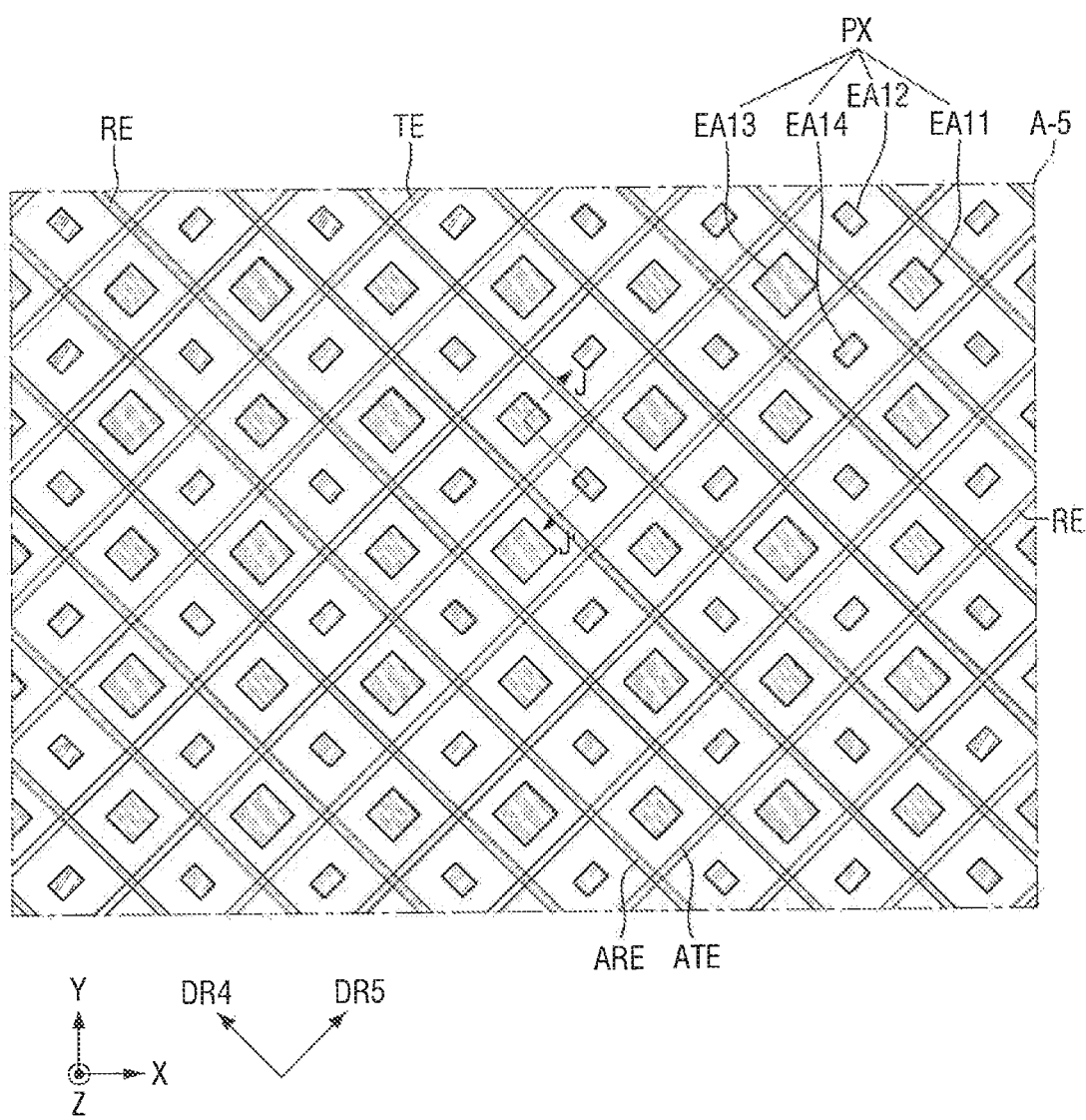
FIG. 26 is a layout view of the area A-5 of FIG. 20 according to an embodiment of the present inventive concepts.
Figure 27:
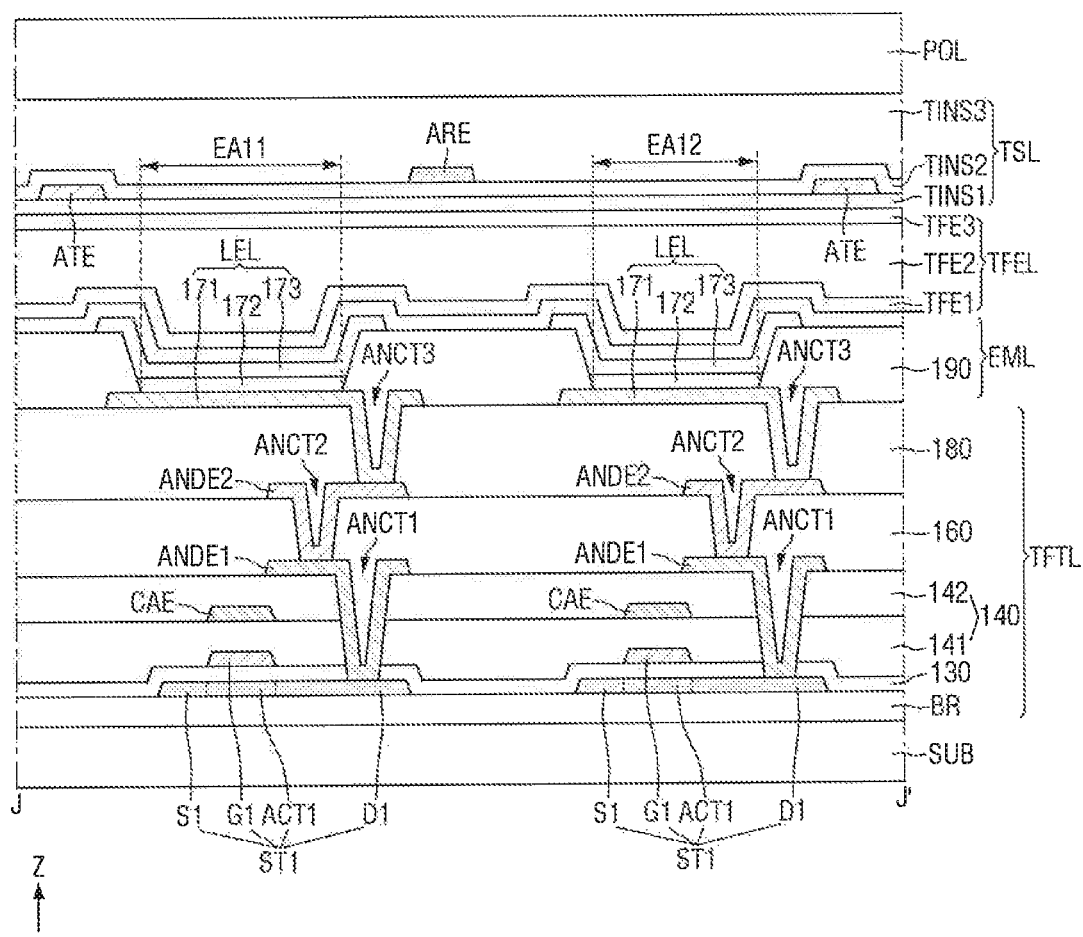
FIG. 27 is a cross-sectional view taken along line J-J' of FIG. 26 according to an embodiment of the present inventive concepts.

FIG. 26 is a layout view of the area A-5 of FIG. 20. FIG. 27 is a cross-sectional view taken along line J-J' of FIG. 26.

Referring to the embodiments of FIGS. 26 and 27, the first auxiliary touch electrode ASE1 may include auxiliary driving electrodes ATE and auxiliary sensing electrodes ARE. The auxiliary driving electrodes ATE may extend in the fifth direction DR5. The auxiliary sensing electrodes ARE may extend in the fourth direction DR4 and may be arranged in the fifth direction DR5. As a result, the auxiliary driving electrodes ATE may intersect the auxiliary sensing electrodes ARE. Thus, mutual capacitances may be formed at the intersections between the auxiliary driving electrodes ATE and the auxiliary sensing electrodes ARE.

As illustrated in FIG. 26, in an embodiment in which the auxiliary driving electrodes ATE intersect the auxiliary sensing electrodes ARE, touch sensitivity can be increased so that a proximity touch such as a hover can be detected. If the auxiliary driving electrodes ATE and the auxiliary sensing electrodes ARE are formed to be wider than the driving electrodes TE and the sensing electrodes RE, touch sensitivity can be further increased. Also, if the auxiliary driving electrodes ATE and the auxiliary sensing electrodes ARE are formed to be thicker (e.g., length in the Z direction) than the driving electrodes TE and the sensing electrodes RE, touch sensitivity can be further increased. Also, if the thickness of an insulating film between the auxiliary driving electrodes ATE and the auxiliary sensing electrodes ARE is reduced, touch sensitivity can be further increased.

In an embodiment, the auxiliary driving electrodes ATE and the auxiliary sensing electrodes ARE may have a mesh or fishnet structure in a plan view (e.g., in a plane defined in the X and Y directions). Thus, the auxiliary driving electrodes ATE and the auxiliary sensing electrodes ARE may not overlap with the emission units (EA1, EA2, EA3, and EA4) of each of the first pixels PX1 (e.g., in the Z direction). Accordingly, the brightness of light emitted from the emission units (EA11, EA12, EA13, and EA14) can be prevented from decreasing due to being blocked by the auxiliary driving electrodes ATE and the auxiliary sensing electrodes ARE.

As illustrated in the embodiment of FIG. 27, the auxiliary driving electrodes ATE may be disposed on the first touch insulating film TINS1 (e.g., directly thereon in the Z direction). That is, the auxiliary driving electrodes ATE may be disposed in the same layer as, and include the same material as, the first connection electrodes BE1 and the second connection electrodes BE2.

The auxiliary sensing electrodes ARE may be disposed on the second touch insulating film TINS2 (e.g., directly thereon in the Z direction). That is, the auxiliary sensing electrodes ARE may be disposed in the same layer as, and include the same material as, the driving electrodes TE and the sensing electrodes RE.

Figure 28:
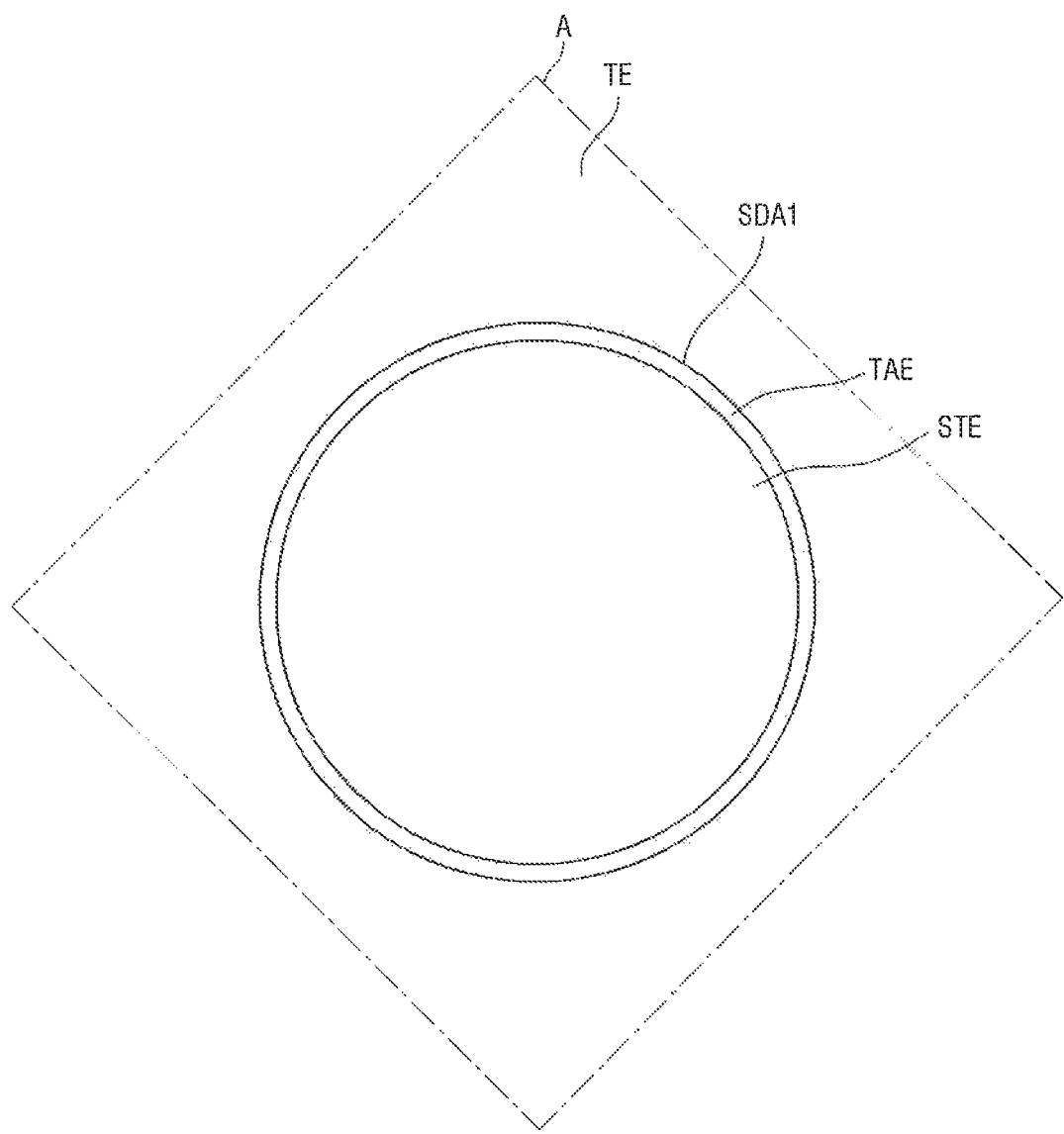
FIG. 28 is a layout view of the area A of FIG. 5 according to an embodiment of the present inventive concepts.

FIG. 28 is a layout view of the area A of FIG. 5.

Referring to FIG. 28, the first sub-display area SDA1 may be surrounded (e.g., in the X and Y directions) by one driving electrode TE. In this embodiment, the first sub-display area SDA1 may include one auxiliary electrode TAE and one sub-driving electrode STE. As shown in the embodiment of FIG. 28, the auxiliary electrode TAE may be disposed along the edge of the first sub-display area SDA1. The auxiliary electrode TAE may be disposed to surround the sub-driving electrode STE. The driving electrode TE, the auxiliary electrode TAE, and the sub-driving electrode STE may be electrically connected.

FIG. 28 illustrates that the first sub-display area SDA1 is surrounded by one driving electrode TE. However, embodiments of the present inventive concepts are not limited thereto. For example, in an embodiment the first sub-display area SDA1 may be surrounded by one sensing electrode RE. In this embodiment, the sensing electrode RE, the auxiliary electrode TAE, and the sub-driving electrode STE may be electrically connected.

Figure 29:
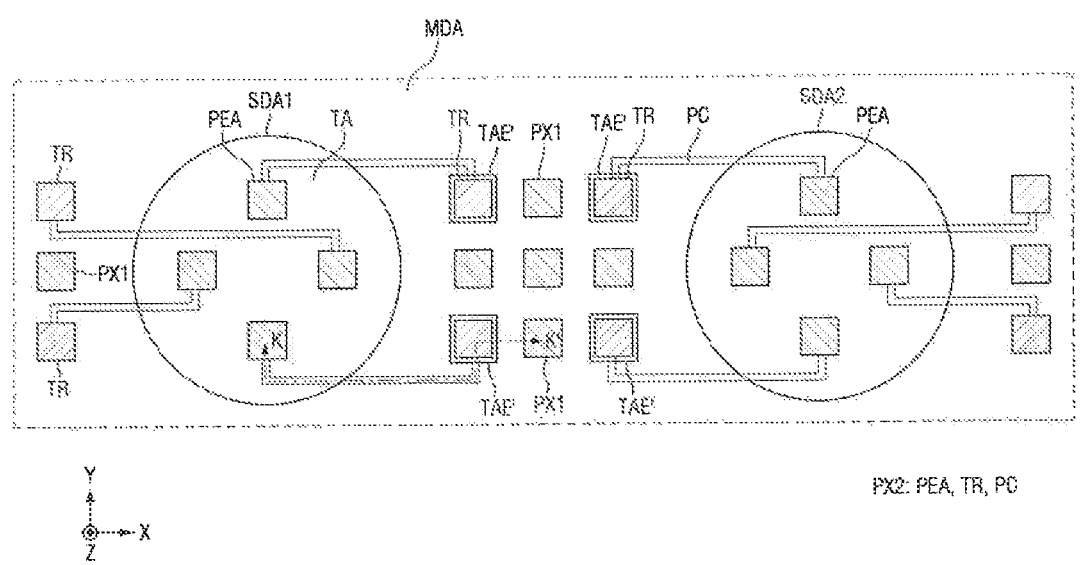
FIG. 29 is a layout view illustrating first and second sub-display areas of FIG. 3 according to an embodiment of the present inventive concepts.
Figure 30:
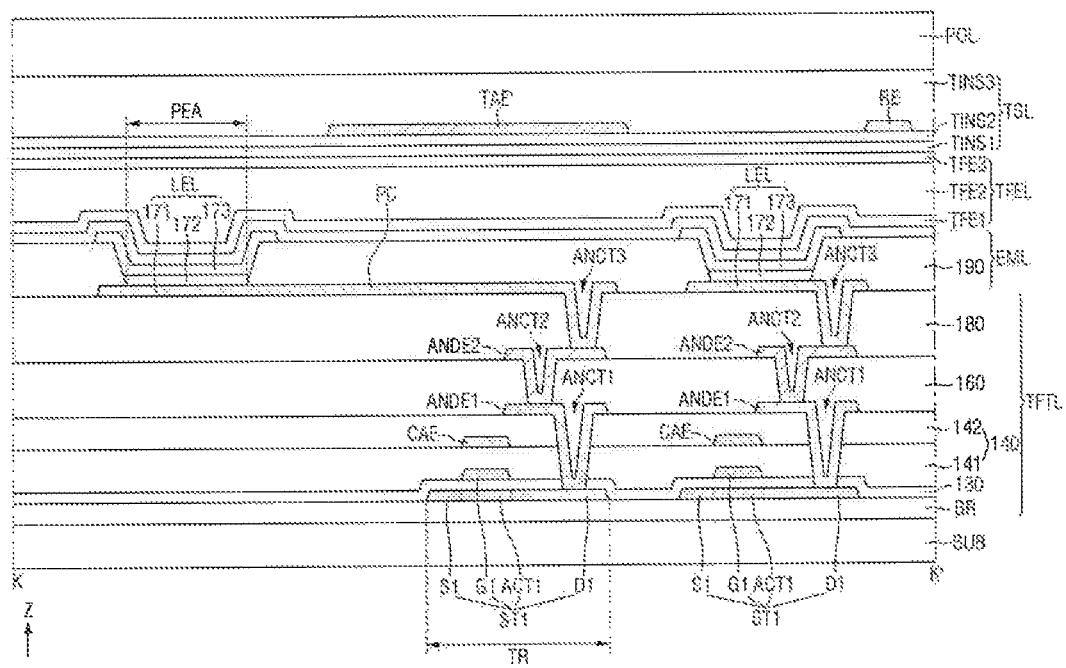
FIG. 30 is a cross-sectional view taken along line K-K' of FIG. 29 according to an embodiment of the present inventive concepts.

FIG. 29 is a layout view illustrating first and second sub-display areas of FIG. 3. FIG. 30 is a cross-sectional view taken along line K-K' of FIG. 29.

Referring to the embodiments of FIGS. 29 and 30, the first pixels PX1 may be disposed in the main display area MDA. As illustrated in the embodiment of FIG. 6, each of the first pixels PX1 may include first, second, third, and fourth emission units EA11, EA12, EA13, and EA14. The first pixels PX1 have already been described above with reference to FIG. 6, and thus, a detailed description thereof will be omitted for convenience of explanation.

Each of the second pixels PX2 may include a pixel emission unit PEA, a pixel driving unit TR, and a pixel connecting unit PC.

Pixel emission units PEA may be disposed in the first and second sub-display areas SDA1 and SDA2. The pixel emission units PEA may include first emission units EA21, second emission units EA22, third emission units EA23, and fourth emission units EA24, as illustrated in the embodiment of FIG. 9. The first emission units EA21, the second emission units EA22, the third emission units EA23, and the fourth emission units EA24 are substantially the same as their respective counterparts of FIG. 9, and thus, detailed descriptions thereof will be omitted for convenience of explanation.

The pixel emission units PEA may include a material capable of transmitting light therethrough. In one example, referring to the embodiment of FIG. 30, each of the pixel emission units PEA may include a pixel electrode 171, a light-emitting layer 172, and a common electrode 173. In an embodiment, the pixel electrode 171 and the common electrode 173 of each of the pixel emission units PEA may be formed of a TCO capable of transmitting light therethrough, such as ITO or IZO. However, embodiments of the present inventive concepts are not limited thereto. As shown in the embodiment of FIG. 30, each of the pixel emission units PEA may include at least a portion of the substrate SUB, the barrier film BR, the gate insulating film 130, the first interlayer insulating film 141, the second interlayer insulating film 142, the first planarization film 160, the second planarization film 180, the pixel electrode 171, the light-emitting layer 172, the common electrode 173, the first encapsulation inorganic film TFE1, the encapsulation organic film TFE2, the second encapsulation inorganic film TFE3, the first touch insulating film TINS1, the second touch insulating film TINS2, and the third touch insulating film TINS3. Thus, light incident upon the pixel emission units PEA may pass through the pixel emission units PEA. As the light-transmitting areas TA and the pixel emission units PEA can transmit light therethrough in each of the first and second sub-display areas SDA1 and SDA2, the amount of light incident upon optical devices such as the proximity sensor 740 and the illumination sensor 750 can be increased.

Pixel driving units TR may be disposed in the main display area MDA. Each of the pixel driving units TR may include a plurality of thin-film transistors ST1.

Pixel connecting units PC may connect the pixel driving units TR and the pixel emission units PEA. The pixel connecting units PC may extend from the pixel electrodes 171, as illustrated in the embodiment of FIG. 30. That is, the pixel connecting units PC may be disposed in the same layer as, and include the same material as, the pixel electrodes 171. The pixel connecting units PC may be disposed on the second planarization film 180. The pixel connecting units PC may be connected to the second anode connection electrodes ANDE2 through the third connecting contact holes ANCT3.

Auxiliary electrodes TAE' may overlap with the pixel driving units TR (e.g., in the Z direction). In an embodiment, the auxiliary electrodes TAE' may be driven in a self-capacitance manner that detects charge variations in self-capacitances formed by the auxiliary electrodes TAE'. As the pixel driving units TR are areas that do not emit light, the auxiliary electrodes TAE' may be formed to overlap with the entire pixel driving units TR. As touch input can be detected through self-capacitances formed by the auxiliary electrodes TAE', which are disposed around the first and second sub-display areas SDA1 and SDA2, the touch sensitivity around the first and second sub-display areas SDA1 and SDA2 can be increased.

Figure 31:
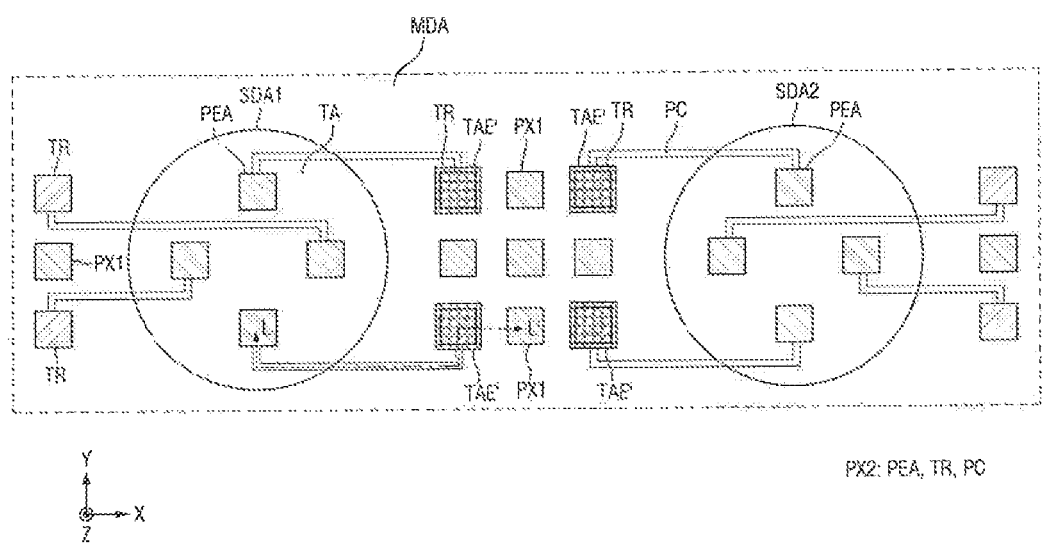
FIG. 31 is a layout view illustrating the first and second sub-display areas of FIG. 3 according to an embodiment of the present inventive concepts.
Figure 32:
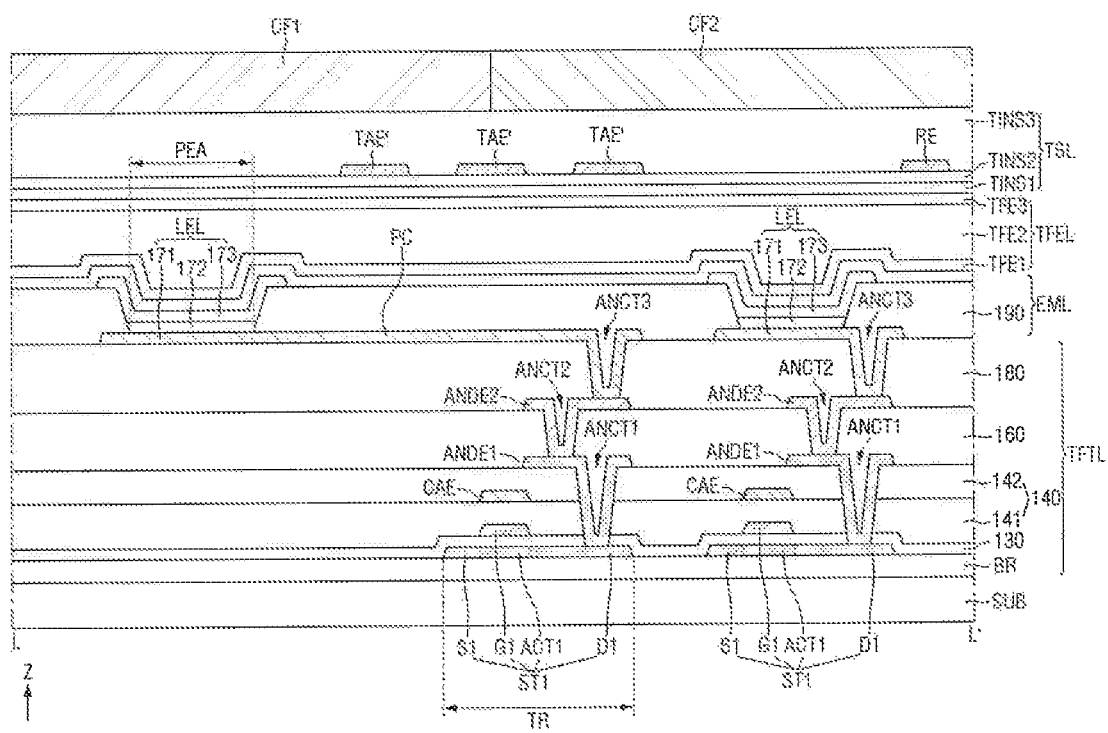
FIG. 32 is a cross-sectional view taken along line L-L' of FIG. 31 according to an embodiment of the present inventive concepts.

FIG. 31 is a layout view illustrating the first and second sub-display areas of FIG. 3. FIG. 32 is a cross-sectional view taken along line L-L' of FIG. 31.

The embodiment of FIGS. 31 and 32 differs from the embodiment of FIGS. 29 and 30 in that the auxiliary electrodes TAE' are formed in a mesh shape to prevent color filters (CF1 and CF2), which are provided instead of the polarizing film POL, from becoming visible due to the reflection of external light. Thus, a description of other features of the embodiment of FIGS. 31 and 32 will be omitted for convenience of explanation.

In a display device according to embodiments of the present inventive concepts, as auxiliary electrodes, which are connected to sub-driving electrodes and sub-sensing electrodes, are disposed in extra space on the edge of a sub-display area, mutual capacitances formed between the sub-driving electrodes and the sub-sensing electrodes can be strengthened. Thus, the touch sensitivity in the sub-display area can be increased.

In a display device according to embodiments of the present inventive concepts, the auxiliary electrodes can serve as separate touch electrodes from driving electrodes, sensing electrodes, the sub-driving electrodes, and the sub-sensing electrodes. Thus, touch input can be detected not only through the mutual capacitances formed between the sub-driving electrodes and the sub-sensing electrodes, but also through self-capacitances formed by the auxiliary electrodes. Accordingly, the touch sensitivity in the sub-display area can be increased.

In a display device according to embodiments of the present inventive concepts, auxiliary touch electrodes can be disposed around the sub-display area and can detect touch input through the capacitances formed between the sub-driving electrodes and the sub-sensing electrodes. Thus, the touch sensitivity around the sub-display area can be increased.

However, the effects of embodiments of the present inventive concepts are not restricted to those set forth herein.

While the present inventive concepts have been particularly shown and described to with reference to embodiments thereof, it will be understood by those of ordinary skill in the art that various changes in form and detail may be made therein without departing from the spirit and scope of the present inventive concepts as defined by the following claims. The embodiments of the present inventive concepts described herein should be considered in a descriptive sense only and not for purposes of limitation.

What is claimed is:

1. A display device comprising:
  a first display area including first pixels, driving electrodes, and sensing electrodes;
  a second display area including second pixels, sub-driving electrodes, and sub-sensing electrodes; and
  auxiliary electrodes between the first and second display areas, wherein a maximum width of the auxiliary electrodes is greater than maximum widths of the driving electrodes, sub-driving electrodes, sensing electrodes and sub-sensing electrodes,
  wherein a number of first pixels per unit area of the first display area is greater than a number of second pixels per unit area of the second display area.

2. The display device of claim 1, wherein the auxiliary electrodes include a first auxiliary electrode that is between a first driving electrode of the driving electrodes and a first sub-driving electrode of the sub-driving electrodes, and a second auxiliary electrode that is between a first sensing electrode of the sensing electrodes and a first sub-sensing electrode of the sub-sensing electrodes.

3. The display device of claim 2, wherein the auxiliary electrodes further include:
  a third auxiliary electrode that is spaced apart from the first and second auxiliary electrodes and is between a second driving electrode of the driving electrodes and a second sub-driving electrode of the sub-driving electrodes; and
  a fourth auxiliary electrode that is spaced apart from the first, second, and third auxiliary electrodes and is between a second sensing electrode of the sensing electrodes and a second sub-sensing electrode of the sub-sensing electrodes.

4. The display device of claim 3, further comprising:
  connection electrodes between the sub-driving electrodes, the connection electrodes electrically connect adjacent sub-driving electrodes of the sub-driving electrodes,
  wherein the connection electrodes overlap the sub-sensing electrodes.

5. The display device of claim 4, wherein the sub-driving electrodes and the connection electrodes are disposed in a same layer.

6. The display device of claim 4, wherein the connection electrodes are disposed in a different layer from the sub-driving electrodes.

7. The display device of claim 2, further comprising:
  auxiliary touch electrodes between the first auxiliary electrode and the driving electrodes.

8. The display device of claim 7, wherein:
  the auxiliary touch electrodes include auxiliary driving electrodes and auxiliary sensing electrodes; and the auxiliary driving electrodes and the auxiliary sensing electrodes are spaced apart from and not connected to the first auxiliary electrode and the driving electrodes.

9. The display device of claim 8, wherein the auxiliary driving electrodes completely overlap with the auxiliary sensing electrodes.

10. The display device of claim 7, wherein:
the auxiliary touch electrodes include auxiliary driving electrodes and auxiliary sensing electrodes;
the auxiliary driving electrodes extend in a first direction; and
the auxiliary sensing electrodes extend in a second direction to intersect the auxiliary driving electrodes.

11. The display device of claim 2, wherein:
the first auxiliary electrode is spaced apart from and not connected to the driving electrodes and the sub-driving electrodes, and
the second auxiliary electrode is spaced apart from and not connected to the sensing electrodes and the sub-sensing electrodes.

12. The display device of claim 11, wherein the first and second auxiliary electrodes are disposed in a different layer from the driving electrodes, the sub-driving electrodes, the sensing electrodes, and the sub-sensing electrodes.

13. The display device of claim 11, wherein the first and second auxiliary electrodes are disposed in a same layer as the driving electrodes, the sub-driving electrodes, the sensing electrodes, and the sub-sensing electrodes.

14. The display device of claim 2, wherein:
the driving electrodes, the first auxiliary electrode, and the sub-driving electrodes are electrically connected to each other; and
the sensing electrodes, the second auxiliary electrode, and the sub-sensing electrodes are electrically connected to each other.

15. The display device of claim 2, wherein a maximum width of the second auxiliary electrode is greater than maximum widths of the sensing electrodes and the sub-sensing electrodes.

16. The display device of claim 1, further comprising:
an optical device overlapping the second display area.

17. The display device of claim 1, further comprising:
a polarizing film overlapping the first display area; and
the polarizing film does not overlap the auxiliary electrodes.

18. A display device comprising:
a first display area including first pixels, driving electrodes, and sensing electrodes;
a second display area including second pixels, sub-driving electrodes, and sub-sensing electrodes;
a polarizing plate overlapping the driving electrodes and sensing electrodes; and
auxiliary electrodes between the first and second display areas,
wherein the sub-driving electrodes, the sub-sensing electrodes, and the auxiliary electrodes do not overlap the polarizing plate,
wherein a maximum width of the auxiliary electrodes is greater than maximum widths of the driving electrodes, sub-driving electrodes, sensing electrodes and sub-sensing electrodes.

19. The display device of claim 18, further comprising:
an optical device overlapping with the second display area.

20. The display device of claim 18, wherein a number of first pixels per unit area of the first display area is greater than a number of second pixels per unit area of the second display area.

21. A display device comprising:
a first display area including first pixels, driving electrodes, and sensing electrodes;
a second display area including second pixels, sub-driving electrodes, and sub-sensing electrodes; and
auxiliary electrodes between the first and second display areas, the auxiliary electrodes include a first auxiliary electrode that is between a first driving electrode of the driving electrodes and a first sub-driving electrode of the sub-driving electrodes, and a second auxiliary electrode that is between a first sensing electrode of the sensing electrodes and a first sub-sensing electrode of the sub-sensing electrodes,
wherein a number of first pixels per unit area of the first display area is greater than a number of second pixels per unit area of the second display area, and
wherein the auxiliary electrodes include at least one of the following:
a maximum width of the first auxiliary electrode is greater than maximum widths of the driving electrodes and the sub-driving electrodes; and
a maximum width of the second auxiliary electrode is greater than maximum widths of the sensing electrodes and the sub-sensing electrodes.

* * * * *